United States Patent [19]

Yoshizawa et al.

[11] Patent Number: 5,606,263

[45] Date of Patent: Feb. 25, 1997

[54] PROBE METHOD FOR MEASURING PART TO BE MEASURED BY USE THEREOF AND ELECTRICAL CIRCUIT MEMBER

[75] Inventors: Tetsuo Yoshizawa, Yokohama; Masaaki Imaizumi, Tokyo; Hideyuki Nishida, Kawasaki; Hiroshi Kondo, Ohsaka; Takashi Sakaki, Tokyo; Yasuteru Ichida, Machida; Masaki Konishi, Ebina, all of Japan

[73] Assignee: Canon Kabushiki Kaisha, Tokyo, Japan

[21] Appl. No.: 620,393

[22] Filed: Mar. 22, 1996

Related U.S. Application Data

[63] Continuation of Ser. No. 178,605, Jan. 7, 1994, abandoned, which is a continuation of Ser. No. 960,286, Oct. 13, 1992, abandoned, which is a continuation of Ser. No. 835,090, Feb. 18, 1992, abandoned, which is a continuation of Ser. No. 652,373, Feb. 7, 1991, abandoned, which is a continuation of Ser. No. 353,800, May 18, 1989, abandoned.

[30] Foreign Application Priority Data

| May 31, 1988 | [JP] | Japan | 63-133399 |
| May 31, 1988 | [JP] | Japan | 63-133400 |
| May 31, 1988 | [JP] | Japan | 63-133402 |
| May 31, 1988 | [JP] | Japan | 63-133403 |
| May 18, 1988 | [JP] | Japan | 63-119242 |
| May 18, 1988 | [JP] | Japan | 63-119243 |

[51] Int. Cl.$^6$ ............................................. G01R 1/073
[52] U.S. Cl. ............................................. 324/761; 324/757
[58] Field of Search .......................... 324/73.1, 754, 324/757, 758, 760, 761, 763

[56] References Cited

U.S. PATENT DOCUMENTS

| 3,786,559 | 1/1974 | Smith | 228/193 |
| 3,996,516 | 12/1976 | Luther | 324/761 |
| 4,038,599 | 7/1977 | Bove et al. | 324/158 P |
| 4,242,719 | 12/1980 | Conley | 361/400 |
| 4,402,561 | 9/1983 | Grabbe et al. | 439/66 |
| 4,404,059 | 9/1983 | Livshits et al. | 174/253 |
| 4,465,972 | 8/1984 | Sokolich | 324/158 P |
| 4,504,783 | 3/1985 | Zasio et al. | 324/754 |
| 4,565,640 | 1/1986 | Hasegawa | 324/158 P |
| 4,585,991 | 4/1986 | Reid et al. | 324/757 |
| 4,643,499 | 2/1987 | Mitchell | 439/66 |
| 4,649,339 | 3/1987 | Grangroth et al. | 324/158 P |
| 4,757,256 | 7/1988 | Whann et al. | 324/158 P |
| 4,766,371 | 8/1988 | Moriya | 324/763 |
| 4,820,976 | 4/1989 | Brown | 324/760 |
| 4,833,402 | 5/1989 | Boegh-Peterson | 324/754 |
| 4,862,075 | 8/1989 | Choi et al. | 324/763 |
| 4,891,585 | 1/1990 | Janko et al. | 324/158 P |
| 4,922,192 | 5/1990 | Gross et al. | 324/158 P |
| 4,992,850 | 2/1991 | Corbett et al. | 361/412 |
| 5,014,161 | 5/1991 | Lee et al. | 361/709 |

FOREIGN PATENT DOCUMENTS

| 256368 | 2/1988 | European Pat. Off. . |
| 2189657 | 10/1987 | United Kingdom . |

*Primary Examiner*—Ernest F. Karlsen
*Attorney, Agent, or Firm*—Fitzpatrick, Cella, Harper & Scinto

[57] ABSTRACT

An electrical circuit member comprises an electrical connecting member, said electrical connecting member having a holding member comprising an electrically insulating material and a plurality of electroconductive members embedded at predetermined intervals within said holding member, each of said plurality of electroconductive members being insulated with said electrically insulating material and also having the ends of said electroconductive member exposed on both surfaces of said holding member; and an electrical circuit part, said electrical circuit part having connecting portions to be connected to said electroconductive member or said wiring pattern exposed on both surfaces of said holding member, and being connected to at least one surface of said holding member.

10 Claims, 27 Drawing Sheets

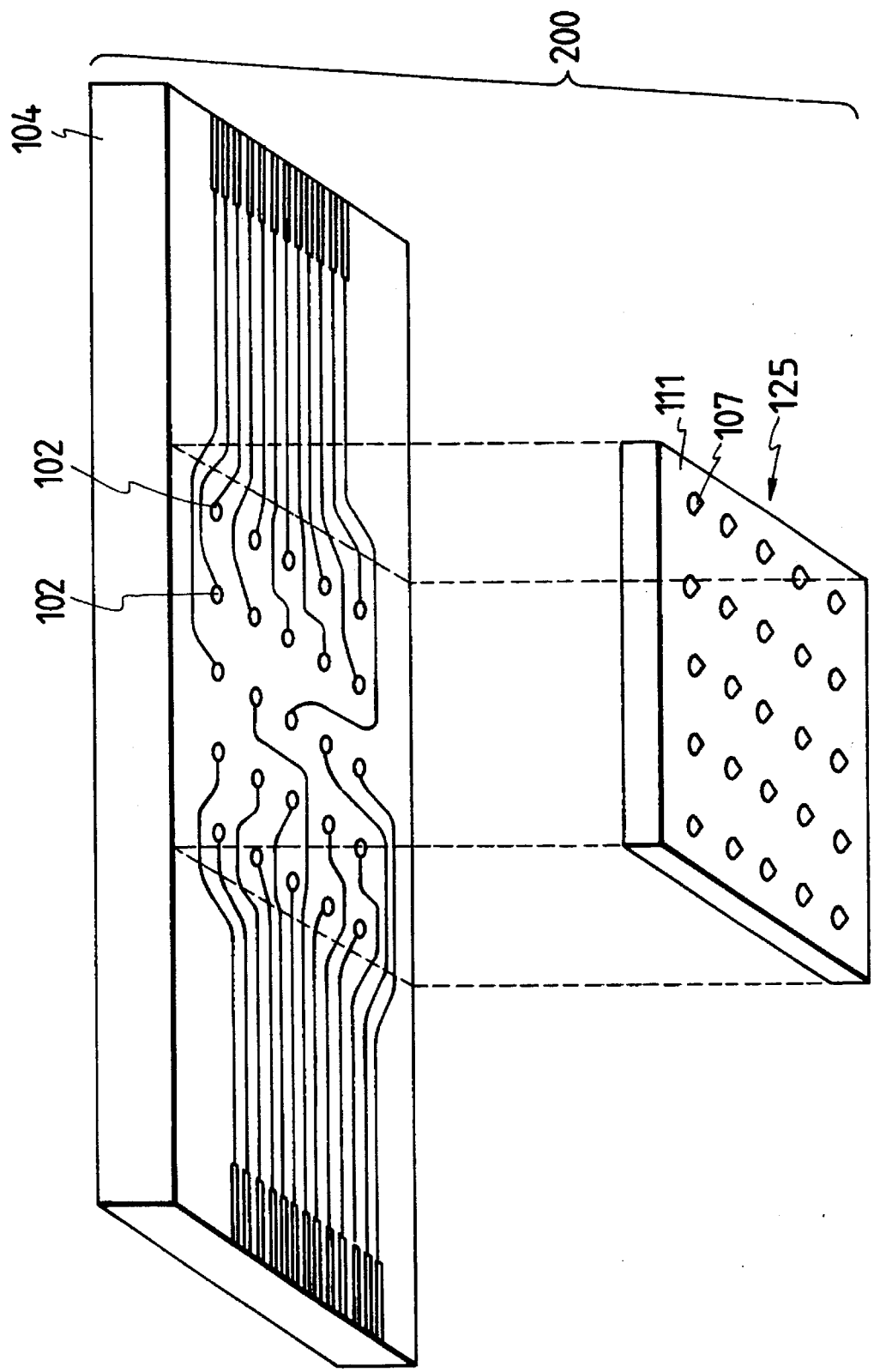

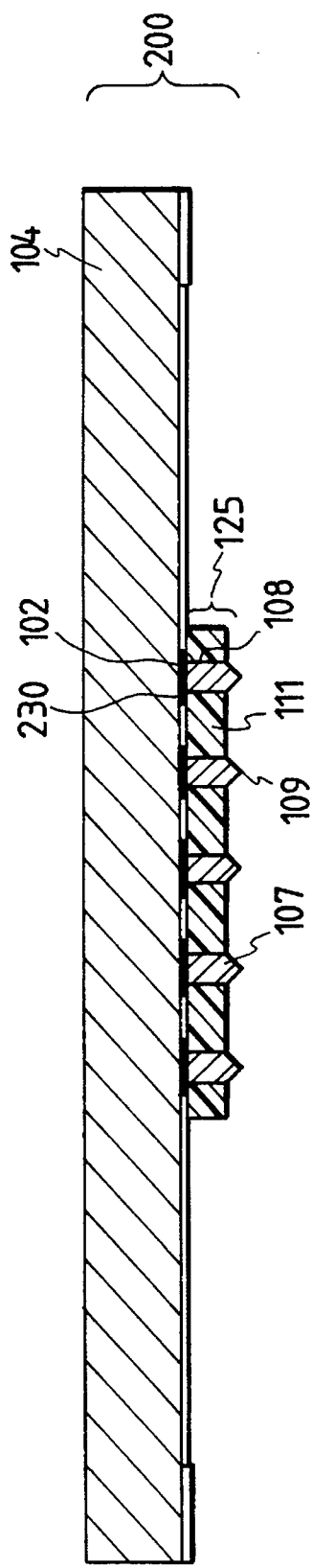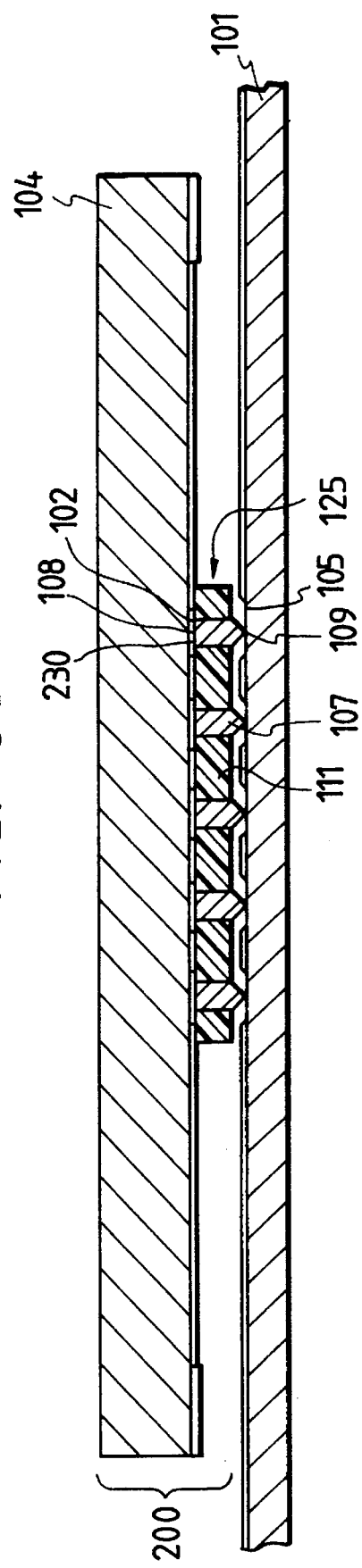

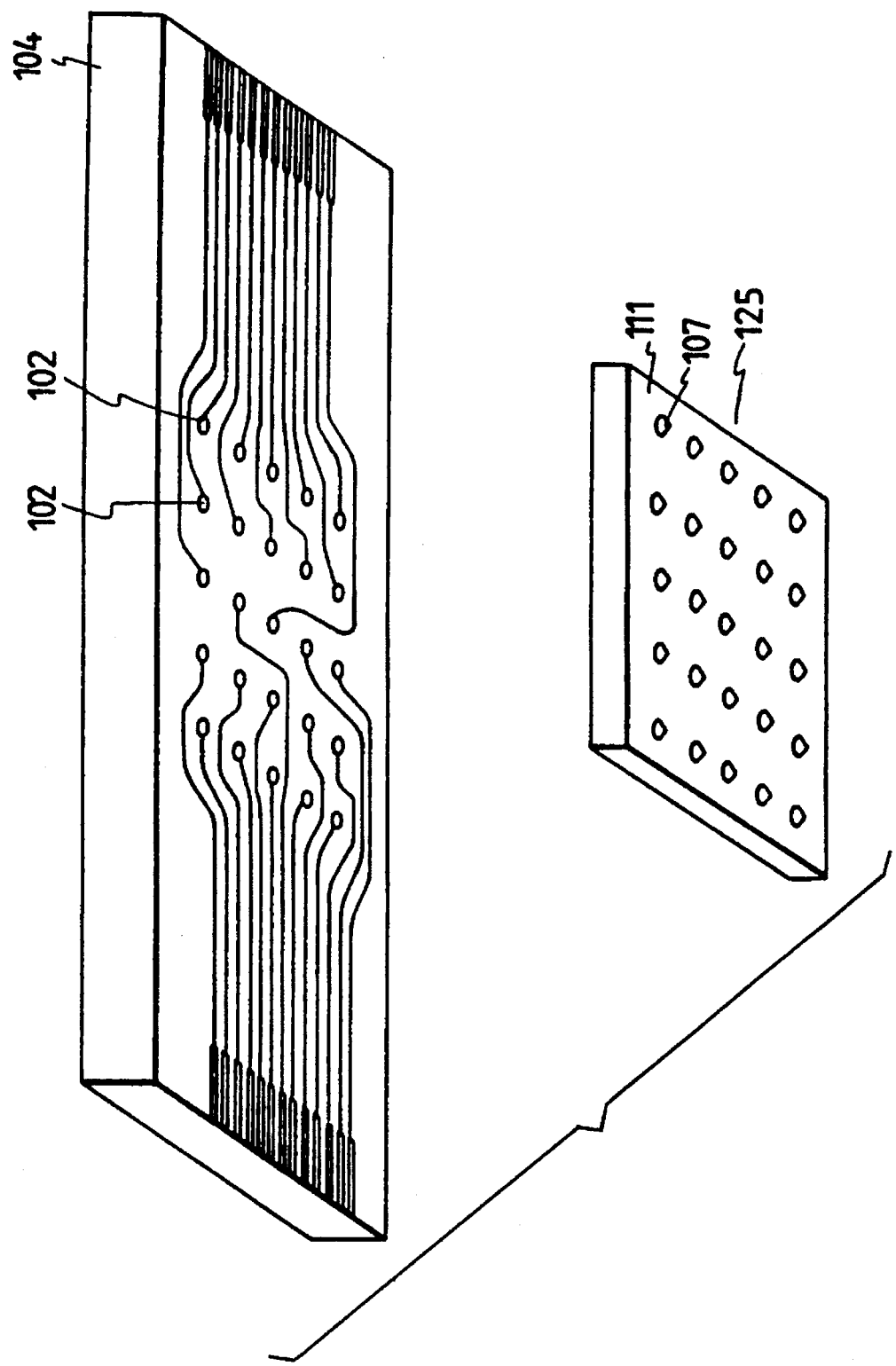

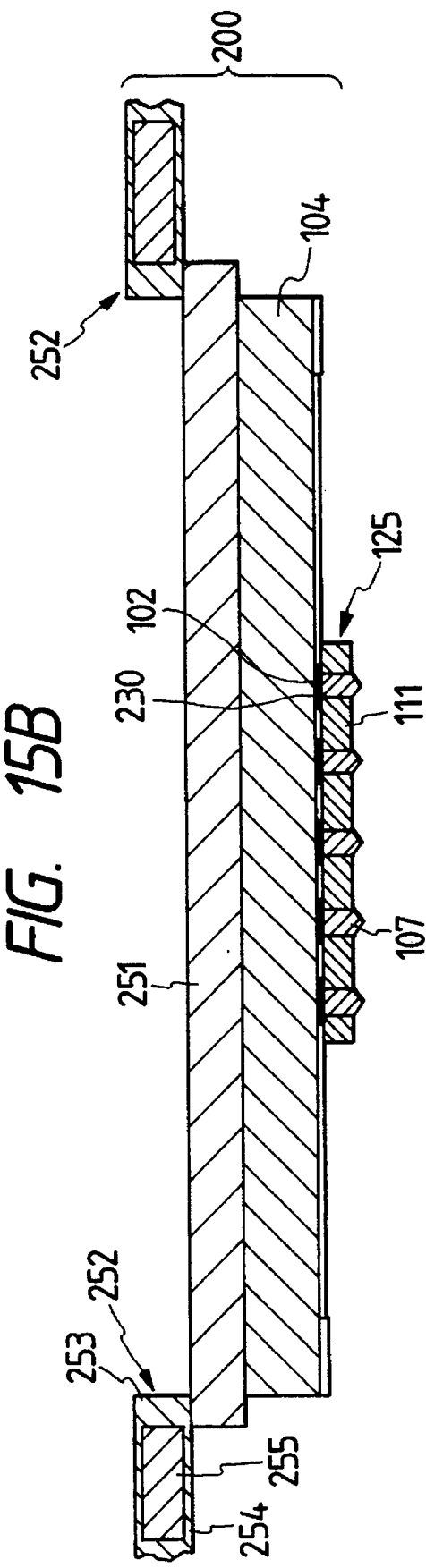
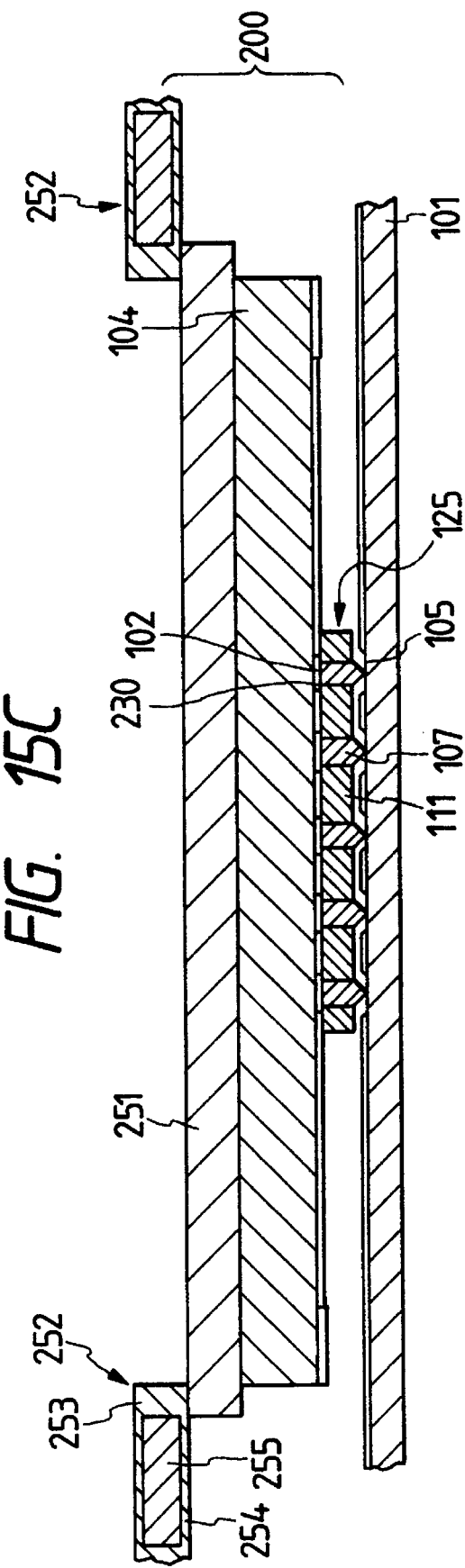

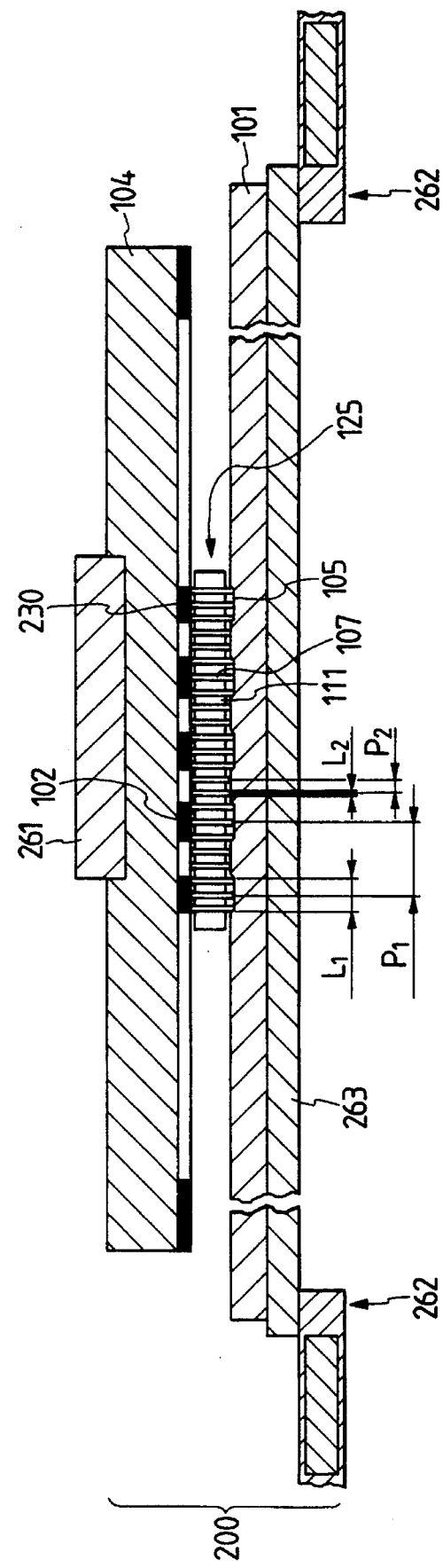

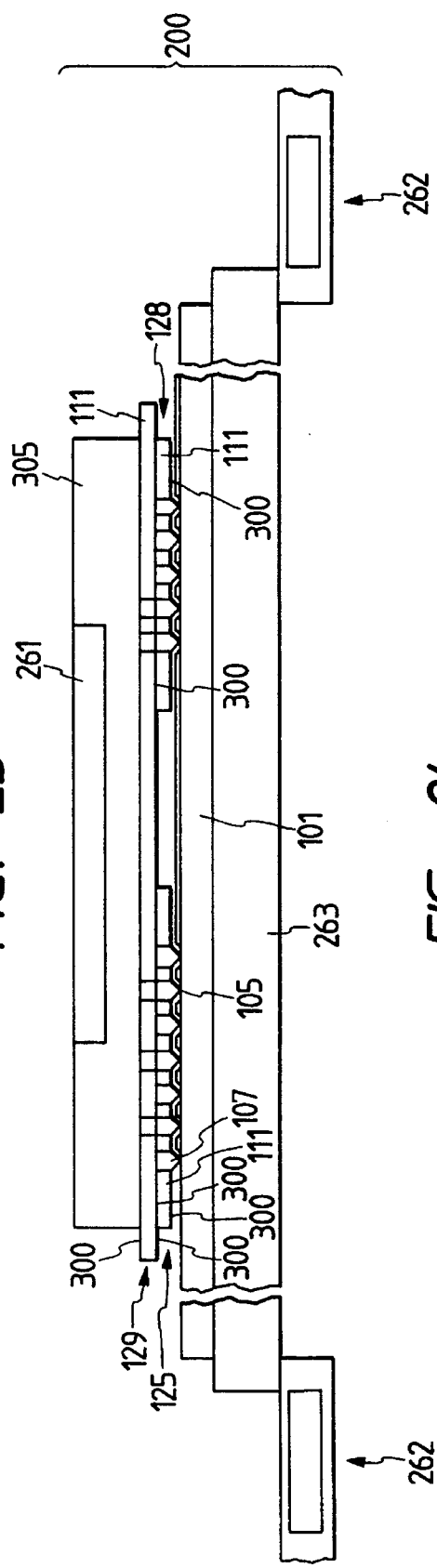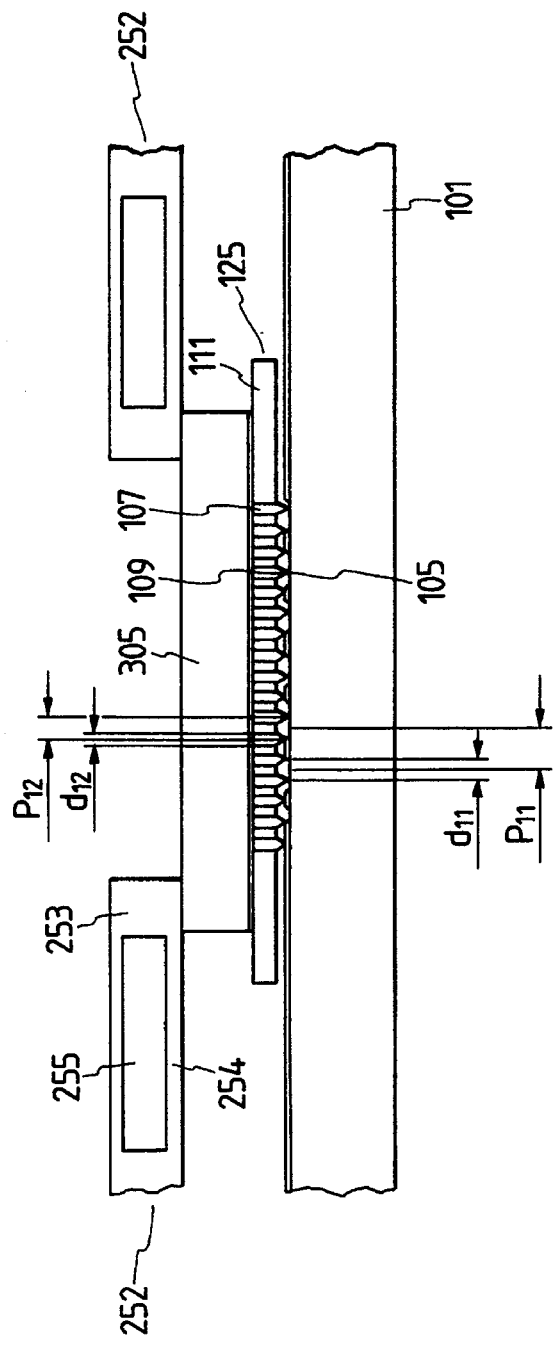

PROBE METHOD FOR MEASURING PART TO BE MEASURED BY USE THEREOF AND ELECTRICAL CIRCUIT MEMBER

This application is a continuation of application Ser. No. 08/178,605 filed Jan. 7, 1994, now abandoned, which is a continuation of application Ser. No. 07/960,286 filed Oct. 13, 1992, abandoned, which is a continuation of application Ser. No. 07/835,090 filed Feb. 18, 1992, abandoned, which is a continuation of application Ser. No. 07/652,373 filed Feb. 7, 1991, abandoned, which is a continuation of application Ser. No. 07/353,800 filed May 18, 1989, abandoned.

BACKGROUND OF THE INVENTION

1. Field of the Invention

This invention relates to a probe card and a method for measuring a part to be measured by use thereof.

Also, the present invention relates to an electrical circuit member.

2. Related Background Art

In the prior art, as the techniques concerning probe card which measures electrically a part to be measured, for example, an electrical circuit part, those as described below have been known.

(1) Probe card system

FIG. 1 and FIG. 2 illustrate the probe card and the method for measuring an electrical circuit part by use of the probe card of the prior art, and in the following description is made by referring to FIG. 1 and FIG. 2.

The probe card 809 takes a constitution having the needle 803 fixed and supported on the circuit substrate 805 with the brazing material 808 and the fixing member 806 (in FIG. 2, there is no fixing member) so that the tip end 804 of the needle 803 which is an electroconductive material may be arranged at a desired position.

In FIG. 1, the fixing member 806 is only mechanically fixed on the circuit substrate 805, but the brazing material 808 fixes mechanically the needle 803 with the connecting portion 807 of the circuit substrate 805 and also at the same time connects it electrically. Also, in FIG. 2, the brazing material 808 connects the needle 803 with the connecting portion 807 of the circuit substrate mechanically and electrically.

By pushing the tip end 804 of the needle 803 of the thus prepared probe card 809 against the connecting portion 802 of the semiconductor element 801 which is a product to be measured with the force of the spring of the needle to be contacted therewith, measurement is carried out. The tip end 804 of the needle 803 is worked sharp so as to pierce electrically insulating substance even when such electrically insulating substance as oxide film may exist on the surface of the connecting portion 802 of the semiconductor element for making the contact resistance between the tip end and the connecting portion 802 of the semiconductor element 801 smaller.

(2) Contact spring probe system

FIG. 3 shows the probe card by use of contact spring probe and the method for measuring an electrical circuit part by use of the probe card, and in the following description is made by referring to FIG. 3.

The probe card 809 takes a construction having the contact spring probe 811 fixed and supported onto the plate 815 which is an electrically insulating material so that the tip end 812 of the contact spring probe which is an electroconductive material may be positioned at a desired position.

By pushing the tip end 812 of the contact spring probe 811 of the thus prepared probe card 809 against the connecting portion 814 of the circuit substrate 813 which is a product to be measured with the spring force of the contact spring probe 811 to be contacted therewith, measurement is carried out.

Whereas, the probe cards of the prior art as mentioned above had the following problems.

(1) Probe card system (a) The minimum adjacent pitch of the connecting portions 802 of the semiconductor element (the minimum distance between the centers of the adjacent connecting portions) is an amount which is determined depending on the diameter of the probing portion 810 of the needle 803 and the manner of mounting such as mounting angle, direction, etc., and if the adjacent pitch of the connecting portions 802 of the semiconductor element 801 is less than that amount, the adjacent probing portions 810 will readily contact each other during measurement, whereby measurement can be conducted with difficulty. Accordingly, in the case when the semiconductor element 801 is a semiconductor element of multiple pins with narrow pitch of the connecting portions 802, the semiconductor element 801 has suffered from restrictions in design.

(b) If the connecting portions 802 of the semiconductor element 801 are designed to come inside of the outer peripheral portion of the semiconductor element, arrangement of the probing portion 810 of the needle 803 will become complicated, whereby the manner of mounting the needle 803 onto the connecting portion 807 of the circuit substrate 805 becomes complicated to make the adjacent probing portion 810 more readily contactable, thus making measurment difficult.

Accordingly, the connecting portions 802 of the semiconductor element 801 is required to be arranged at the peripheral on the semiconductor element 801. Particularly, when the semiconductor element 801 is a semiconductor element, the semiconductor element 801 cannot but suffer from restrictions in circuit design.

Further, it has been difficult to measure a plurality of semiconductor elements 801 having connecting portions 802 at the peripheral portion of the semiconductor element 801 at the same time.

(c) Since the needle 803 is only fixed with the brazing material 808 only at the connecting portions 807 of the circuit substrate 805, it is very unstable and requires a complicated tool for arranging the tip ends 804 of a plurality of needles 803, and also a long time is required therefor, leading to increased cost.

(d) The same probe card 809 cannot be used for semiconductor elements with different arrangements of the connecting portions 802 of the semiconductor element 801, and therefore the probe card had no general purpose availability.

(e) Since the force of the tip end 804 of the needle applied on the connecting portions 802 of the semiconductor element 801 is primarily the spring force by shape deformation if the material of the plural number of needles 803 are individually of the same kind, and therefore if the shapes of the needled 803 are different, the force applied on the connecting portions of the semiconductor element will be different, whereby variance in contact resistance value between the connecting portions 802 of the semiconductor element 801 and the tip end 804 of the needle 803 is liable to occur. Further, if the forces are different, there will readily ensue the problem of giving damages to the connecting portions 802 of the semiconductor element, etc. Also, when the deformation of the needle 803 becomes excessive, there also occured problems such that the shape of the needle 803 will not be returned to the original shape, or that the connecting portion with the connecting portion of the needle 803 is liable to be damaged, etc.

(f) A spatial region for drawing around the needle 803 up to the connecting portion 807 of the circuit substrate 805 is required, whereby enlargement of the probe card is brought about, or when the length of the needle 803 is elongated by drawing around the needle 803, the problems in electrical measurment such as increase in electrical resistance value or floating capacity, etc. are liable to occur.

(g) As the number of contact between the tip end 804 of the needle 803 with the connecting portions 802 of the semiconductor element 801 is increased by repeated uses of the probe card 809, the tip end 804 of the needle 803 will be abraded. When the tip end 804 of the needle 803 is abraded to become no longer useful, it is necessary to take a countermeasure to exchange the probe card 809 or to exchange the needle 803, etc., whereby reproduction under the original state cannot be done.

(2) Contact spring probe system (a) The minimum adjacent pitch of the connecting portions 814 of the circuit substrate 813 (the minimum distance between the centers of the adjacent connecting portions), in the case of FIG. 10 wherein the contact spring probe 811 is arranged substantially perpendicular to the circuit substrate 811, is 1.5 to 2-fold of either the diameter of the contact spring probe 811 or the diameter of the tip end 812 which is larger, and measurement can be done with difficulty if the adjacent pitch of the connecting portions 814 of the circuit substrate 813 is lower than that value. Accordingly, the substrate circuit 813 having multi-point circuit substrate with narrow adjacent pitch of the connecting portions 814 has suffered from restrictions in design.

(b) Also, since the value of either the diameter of the contact spring probe 811 or the diameter of the tip end 812 which is larger is about 0.5 mm at the minimum, it has been difficult to perform probing of the semiconductor element with an adjacent pitch of about 0.1 to 0.3 mm.

(c) The same probe card 809 cannot be used for circuit substrates 13 with different arrangements of the connecting portions 814 of the circuit substrate 813, and therefore the probe card 809 of the prior art had no general purpose availability.

(d) As the number of contact between the tip end 812 of the contact spring probe with the connecting portions 814 of the circuit substrate 813 is increased by repeated uses of the probe card 809, the tip end 812 of the contact spring probe 811 will be abraded. When the tip end 812 of the contact spring probe 811 is abraded to become no longer useful, it is necessary to take a countermeasure to exchange the probe card 809 or to exchange the contact spring probe 811, etc., whereby reproduction under the original state cannot be done.

On the other hand, as the techniques to connect electrically mutually the electrical circuit parts constituting the electrical circuit member, there may be included, for example, (1) the wire bonding method;
(2) the TAB (Tape Automated Bonding) method (e.g. Japanese Laid-open Patent Publication No. 59-139636);
(3) the CCB (Controlled Collapse Bonding) method (e.g. Japanese Patent Publication No. 42-2096; Japanese Laid-open Patent Publication No. 60-57944);
(4) the method shown in FIG. 4 and FIG. 5;
(5) the method shown in FIG. 6;
(6) the method shown in FIG. 7; etc.

Here, (4) the method shown in FIG. 4 and FIG. 5 is as described below.

That is, an insulating film 71 comprising a polyimide, etc. is formed on the portions except for the connecting portions 5 of a first semiconductor element 4, a metal member 70 comprising Au, etc. is provided on the connecting portions 5, and then the exposed surfaces of the metal member 70 and the insulating film 71 are flattened. On the other hand, on the portions except for the connecting portions 5' of a second semiconductor element 4', an insulating film 71' comprising a polyimide, etc. is formed, a metal member 70' comprising Au, etc. is provided on the connecting portions 5', and then the exposed surfaces 73', 72' of the metal member 70' and the insulating film 71' are flattened.

Thereafter, registration of the first semiconductor element 4 and the second semiconductor element 4' is effected as shown in FIG. 5, followed by thermal pressure contact to connect the connecting portions 5 of the first semiconductor element 4 to the connecting portions 5' of the second semiconductor element 4' through metal members 70, 70'.

(5) The method shown in FIG. 6 is one as described below.

That is, with an anisotropic electroconductive film 78 having electroconductive particles 79 dispersed in an insulating substane 77 being interposed between the first circuit substrate 75 and the second circuit substrate 75', after registration of the first circuit 75 and the second circuit substrate 75', the connecting portions 76 of the first circuit substrate are connected to the connecting portions 76' of the second circuit substrate 75' by pressurization or by pressurization and heating.

Further, (6) the method as shown in FIG. 7 is one as described below.

That is, with an elastic connector 83 comprising an insulating substance 81 arranged with a metal wire 82 comprising Fe, Cu, etc. oriented in a certain direction being interposed between the first circuit substrate 75 and the second circuit substrate 75', after registration between the first circuit substrate 75 and the second circuit substrate 75', pressurization is applied to connect the connecting portions 76 of the first substrate 75 to the connecting portions 76' of the second substrate 75'.

Whereas, the electrical connecting technique for connecting mutually the electrical circuit parts constituting the electrical circuit member of the prior art as described above has involved the following problems. That is, there have been the problems such that the electrical connecting technique incurred restrictions in circuit design of the electrical circuit part or the position for forming the connecting portions, that the pitch dimension mutually between the adjacent electroconductors (distance between the centers of the adjacent connecting portions) is large, that the circuit cannot be made thinner, that reliability is low due to corrosion or cutting of electroconductors, or characteristic deterioration due to thermal stress concentration between the bonding members and the electrical circuit parts, that it is difficult to exchange only the electrical circuit parts when they become defective, etc. Also, in the technique shown in FIG. 4 and FIG. 5, there have been the problems as described below.

(a) The exposed surface 72 of the insulating film 71, the exposed surface 73 of the metal member 70 or the exposed surface 72' of the insulating film 71', and the exposed surface 73' of the metal member 70' must be made flat, and the steps are increased for that purpose to result in increased cost.

(b) If there is unevenness on the exposed surface 72 of the insulating film 71, the exposed surface 73 of the metal member 70 or the exposed surface 72' of the insulating film 71', and the exposed surface 73' of the metal member 70', the metal member 70 will not be connected to the metal member 70', whereby reliability of electroconductivity will be lowered.

(c) If the respective exposed surfaces 73, 73' of the metal members 70, 70' have no uniform surface characteristic, lowering in electrical characteristics such as variance of electrical resistance value may be brought about depending on the place.

Further, in the technique shown in FIG. 6, there have been involved the following problems.

(a) During connection of the connecting portions 76 and 76' under pressurization after registration, since the pressure can be applied constantly with difficulty, variance occurs in the connected state, with the result that variance of the contact resistance value at the connected portion becomes larger. For this reason, reliability of connection becomes poorer. Also, when a large quantity of current is passed, such phenomenon as heat generation, etc. will occur, and therefore this technique is not suited when a large quantity of current is desired to flow.

(b) Even if a constant pressure may be applied, the variance in resistance value may become larger depending on the arrangement of the electroconductive particles 79 of the anisotropic electroconductive film 78. For this reason, reliability of connection becomes poorer. Also, it is not suitable for the case when a large quantity of current is desired to flow.

(c) When the pitch of the adjacent connecting portions (distance between the centers of the adjacent connecting portions) is made narrower, resistance value between the adjacent connecting portions becomes smaller, whereby there is a fear that conduction may be effected mutually between the adjacent connecting portions or between the connecting portion and that which is different from the connecting portion to which connection is desired to be effected, as unsuitable for high density electrical connection.

(d) Since the resistance value is varied because of variance in the protruded amount $h_1$ of the connecting portions 76, 76' of the circuit substrates 75, 75', it is necessary to grasp correctly the variance amount of $h_1$.

(e) Further, when an anisotropic electroconductive film is used for connection between the semiconductor element and the circuit substrate, or for connection between the first semiconductor element and the second semiconductor element, in addition to the above drawbacks of (a) to (d), a bump must be provided at the connecting portions of the semiconductor element to result in increased cost.

Further, (6) when the technique shown in FIG. 7 is used for connection of the semiconductor element and the circuit substrate or connection of the first semiconductor element and the second conductor element, the drawbacks (a) to (d) as shown below have been involved.

(a) Pressurization is required, whereby a pressurizing implement is required.

(b) Since the contact resistance between the metal wire 82 of the elastic connector 83 and the connection portion 76 of the circuit substrate 75 or the connecting portion 76' of the second circuit substrate will vary depending on the pressurization force and the surface state, reliability of connection is poor.

(c) Since the metal wire 82 of the elastic connector 83 is a rigid body, there is great possibility that the surfaces of the elastic connector 83, the first circuit substrate 75 and the second circuit substrate 75' may be broken if the pressurizing force is large. Also, when the pressurizing force is small, reliability of connection becomes poorer.

(d) Further, because the protruded amounts $h_2$ of the connecting portions 76, 76' of the circuit substrates 75, 75', and the protruded amount $h_3$ of the metal wire 82 of the elastic connector 83 and variances thereof have influences on change in resistance value and breaking, it is required to contrive to make variance smaller.

These electrical circuit members are required to exist at substantially the same places where the connecting portions of the electrical circuit part to be connected correspond to each other, and it is impossible to connect mutualy the electrical circuit parts having connecting portions at different portions.

SUMMARY OF THE INVENTION

The present invention has been proposed in order to solve the points to be improved possessed by the electrical circuit member and its object is to provide an electrical circuit member which enables connection of electrical circuit parts to be connected even with different positions of connecting portions by connecting the electrical circuit parts with an electrical connecting member having a wiring pattern.

In addition, another object of the present invention is to provide an electrical circuit member having such advantages that the electrical circuit part having connecting portions of narrower pitch can be connected, that the electrical circuit part suffering from defect can be exachanged and that variance in contact resistance value at the connecting portion of the electrical circuit part is little, etc.

Still another object of the present invention is to provide an electrical circuit member which can accomplish higher densification under the state where insulation between electroconductive members is maintained well by connecting the electrical circuit part with an electrical connecting member having electroconductive members embedded at predetermined intervals in an electrical insulating material.

Also, the present invention has been proposed in order to solve the points to be solved possessed by the probe card of the prior art, and its object is to provide a probe card which can accomplish higher densitification under the state where insulation between electroconductive members is maintained well, effect stable connection between the electrical circuit member and the part to be measured, has excellent electrical characteristics without requiring draw-around space of the electroconductive members and will not bring about damage of the connecting portions, by making an electrical connecting member having electroconductive members embedded at predetermined intervals in an electrical insulating material.

In addition, it is also another object of the present invention to provide a probe card having general purpose availability which can draw around freely the pattern up to a predetermined connecting portion, can correspond to a part to be measured having connecting portions of narrow pitch and can arrange the connecting portions of the probing portion at desired positions with high precision by forming a wiring pattern on the electrical connecting member.

Further, still another object of the present invention is to provide a probe card which can reduce defective electrical contact or contact resistance to enable electrical measurement of high reliability, because the connecting portion at the probing portion in contact with the connecting portion of the product to be measured is adapted to be vibrated.

Still another object of the present invention is to provide an electrical circuit member comprising:

an electrical connecting member, said electrical connecting member having a holding member comprising an electrically insulating material and a plurality of electroconductive members embedded at predetermined intervals within said holding member, each of said plurality of electroconductive members being insulated with said electrically insulating material and also having the ends of said electroconductive member exposed on both surfaces of said holding member; and an electrical circuit part, said electrical circuit part having connecting portions to be connected to said electroconductive member or said wiring pattern exposed on both surfaces of said holding member, and being connected to at least one surface of said holding member.

Still another object of the present invention is to provide a probe card comprising:

an electrical connecting member, said electrical connecting member having a holding member comprising an electrically insulating material and a plurality of electroconductive members embedded at predetermined intervals within said holding member, each of said plurality of electroconductive members being insulated with said electrically insulating material and also having one end of said electroconductive member exposed on one surface of said holding member and the other end of said electroconductive member protruded on the other surface of said holding member; and an electrical circuit part, said electrical part having connecting portions to be connected to one end of said electroconductive member.

Still another object of the present invention is to provide a method for measuring a part to be measured, which comprises measuring electrical characteristics of said part to be measured by connecting the other end of the electroconductive member of a probe card electrically to the connecting portion of the part to be measured, said probe card comprising:

an electrical connecting member, said electrical connecting member having a holding member comprising an electrically insulating material and a plurality of electroconductive members embedded at predetermined intervals within said holding membre, each of said plurality of electroconductive members being insulated with said electrically insulating material and also having one end of said electroconductive member exposed on one surface of said holding member and the other end of said electroconductive member protruded on the other surface of said holding member; and an electrical circuit part, said electrical part having connecting portions to be connected to one end of said electroconductive member.

Still another object of the present invention is to provide an electrical connecting member comprising:

a holding member comprising an electrically insulating material; and a plurality of electroconductive members embedded at predetermined intervals in said holding member, each of said plurality of electroconductive members being insulated with said electrically insulating material and also having the ends of said electroconductive members exposed on both surfaces of said holding member.

BRIEF DESCRIPTION OF THE DRAWINGS

FIGS. 8A through 8C show a first example of the present invention, FIG. 8A showing a perspective view and FIG. 8B a sectional view and FIG. 8C a sectional view.

FIGS. 15A to 15C show a fifth example of the present invention, FIG. 15A showing a perspective view, FIG. 15B a sectional view and FIG. 15C a sectional view.

FIG. 16 is a sectional view showing a sixth example of the present invention.

FIG. 23 shows a sectional view of a twelfth example of the present invention.

FIG. 24 shows a sectional view of a fourteenth example of the present invention.

DESCRIPTION OF THE PREFERRED EMBODIMENTS

Figure 1:
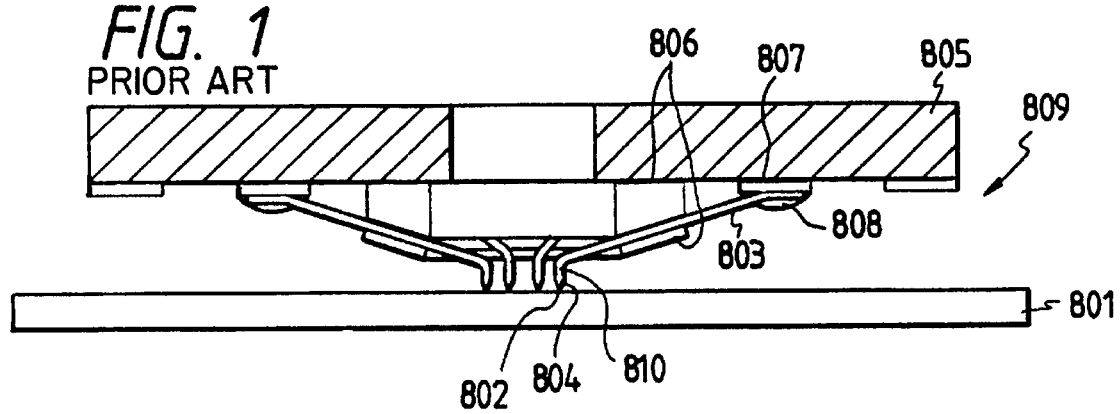
FIG. 1 through FIG. 7 are sectional views showing prior art examples.
Figure 2:
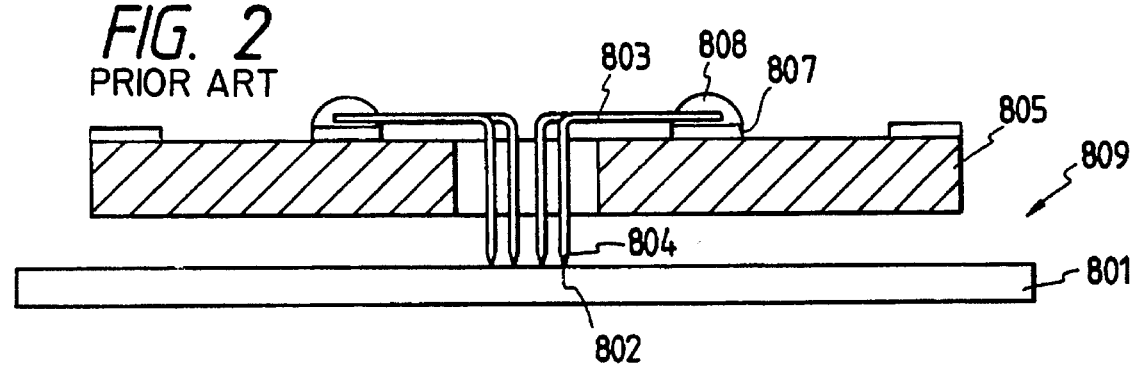

The constituting requirements of the present invention are described individually below.

(Electrical circuit part)

Examples of the electrical circuit part according to the present invention may include circuit substrates such as resin circuit substrate, ceramic substrate, metal substrate, silicon substrate, etc. (hereinafter sometimes referred to merely as circuit substrate), semiconductor elements such as transistor, IC, etc., lead frames and others.

The electrical circuit part to be connected to the electrical connecting member may exist as only one or in a plural number on one surface of the holding member.

A part having an electroconductive connecting portion as the electrical circuit part is to be used in the present invention. Although the number of the connecting portions is not limited, the number of the connecting portions may be preferably as much as possible, because the effect of the invention will become more marked.

Also, the exsisting positions of the connecting portions are not limited, but the effect of the invention will become more marked if they exist deeper into the innerside of the electrical circuit part. The electrical circuit part may be connected either on one surface and on the other surface of the electrical connecting member or on the same surface.

The connecting portion is made of an electroconductive material.

(Electrical connecting member)

The electrical connecting member according to the present invention is constituted such that it has a plurality of electroconductive members embedded in a holding member comprising an electrically insulating material, with the above electroconductive members being exposed on both surfaces of the holding member. Further, there is also a constitution having a wiring pattern formed. The above wiring pattern may exist internally of the holding member, or alternatively on one surface or both surfaces of the holding member. Preparation will become easier if it exists one one surface or both surfaces of the holding member.

Individual electroconductive members embedded and the wiring pattern may be electrically connected or not. Further, such electrical connection may be effected either internally of the holding member or one one surface or both surfaces of the holding member, but the latter constitution can make preparation easier. The material of the wiring pattern is not limited to electroconductive materials such as metal materials, but other electroconductive materials may be also employed.

The wiring pattern existing on one surface or both surfaces of the holding member may be also electrically insulated by plastering or coating an electrically insulating material at the places other than the connecting portions with the electrical circuit substrate.

The electrical circuit part may be connected at its connecting portion to the end of the electroconductive member (connecting portion of the electroconductive member) or to the wiring pattern.

The end of the connecting portion of the electroconductive member should be preferably shaped in a convex, because contact with the electrical circuit member or the part to be measured can be effected surely.

Further, the electrical connecting member may comprise either one layer or multiple layers of two or more layers.

First, in the case of one layer, the metal members are exposed on both surfaces of the holding member, and also have a wiring pattern. The individual metal members embedded may be electrically connected to the wiring pattern or not. Further, such electrical connection may be effected internally of the holding member, or alternatively connected at one surface or both surfaces of the holding member, with the latter being preferred for easy preparation.

Next, in the case of two or more layers, the electrical connecting member comprises a lamination of two or more electrical members each having a plurality of metal members embedded in a holding member comprising an electrically insulating material, with metal members being exposed on both surfaces of the holding member, at least of the electrical connecting members having a wiring pattern on at least one surface of the holding member, with one or more of the connecting portions of one or both of the metal member or wiring pattern of the electrical connecting member being connected to one or more connecting portion of one or both of the metal member or wiring pattern of another electrical connecting member being connected through metallization or alloy formation. The individual metal members embedded and the wiring pattern may be electrically connected or not.

The holding member materials of the plurality of electrical connecting members to be laminated may be either of the same kind or of different kinds. Also, the metal members may be either of the same kind or of different kinds. The surface other than the connecting portions of the plurality of electrical connecting members to be laminated should be preferably bonded by adhesion, fusion, etc. in the sense to reinforce the connecting portions.

The connecting portions mutually between the electrical connecting portions should be preferably shaped in convex for easier connection.

Further, the electrical connecting member comprises multiple layers of two or more layers, but when the sizes of the plural electrical connecting members are different, there may sometimes exist partially a part of one layer.

The metal member to which one or more part to be measured with at least one or more electrical connecting member comprising one sheet or two or more sheets of electrical connecting members is electrically connected should be preferably formed in convex shape from the holding member surface.

When the metal member or the holding member is in contact with other portions than the connecting portions of the part to be measured, for preventing of damage to the part to be measured, it is preferable to use as soft material as possible for the metal member or the holding member.

Also, it may be also possible to effect electrical insulation by way of plastering, coating, etc. of an electrically insulating material at the places other than the connecting portions with the exposed electrical circuit part with the electrical connecting members laminated.

Further, the material of the wiring pattern is not limited to metal materials but other electroconductive material may be employed.

(Material of electroconductive member of electrical connecting member)

Any material exhibiting electroconductivity can be used for the electroconductive member. Metal materials may be generally employed, but other materials exhibiting superconductivity, etc. may be also employed.

As the metal material, gold is preferred, but any metal or alloy other than alloy can be also used. For example, there may be included metals or alloys such as Ag, Be, Ca,Mg, Mo, Ni, W, Fe, Ti, In, Ta, Zn, Cu, Al, Sn, Pb-Sn, etc.

Also, the metal member and the alloy member may have the same kind of metal or different kinds of metals present in the same selectrical connecting member. Further, one of the metal member and the alloy member of the electrical connecting member may be made of the same kind of metal or alloy, or alternatively made of different kinds of metals or alloys. Further, materials other than metals, alloys, which can exhibit electroconductivity, may be also one or both of organic materials or inorganic materials included in the metal material. Also, a combination of an inorganic material and an organic material can be also employed, provided that it exhibits electroconductivity.

Further, the cross-section of the electroconductive member can be made to have circular, square or other shapes.

Also, the thickness of the electroconductive material is not particularly limited. In view of the pitch of the connecting portions of the electrical circuit part, it may be made, for example 20 $\mu m\phi$ or more or 20 82 $m\phi$ or less.

The exposed portion of the electroconductive member may be made the same surface as the holding member, or alternatively protruded from the surface of the holding member. Such protrusion may be only at one surface or at both surfaces. Further, protrusion may be shaped in bump. When protruded portions are thus shaped in bump on both surfaces, the second electroconductive member will not be dropped off from the holding member.

The interval between the electroconductive members may be made the same as mutually between the connecting portions of the electrical circuit part, or narrower than that. When made narrower, it becomes possible to effect connection between the electrical circuit part and the electrical connecting member without requiring registration between the electrical circuit part and the electrical connecting member.

The electroconductive member is not required to be arranged perpendicularly to the holding member, but it may be also slanted from one surface side of the holding member toward the other surface side of the holding member.

(Holding member constituting electrical connecting member)

As the holding member of the electrical connecting member according to the present invention, for example, a member by use of en electrical insulating material may be employed. As the organic material, for example, an insulatable resin employed. When using a resin, the kind of the resin is not limited. Any of thermosetting resins, photosensitive resins such as UV-ray curable resins, etc., thermoplastic resins may be employed. For example, there may be included polyimide resin, polyphenylenesulfide resin, polyethersulfone resin, polyetherimide resin, polysulfone resin, silicone resin, fluorine resin, polycarbonate resin, polydiphenyl ether resin, polybenzylimidazole resin, phenol resin, urea resin, melamine resin, alkyd resin, epoxy resin, polyamide imide resin, polypropylene resin, polyvinyl cloride resin, polystyrene resin, methyl methacrylate resin, polyphenyl oxide resin, methacrylic resin, vinylidene chloride resin, and other resins.

Particularly, when a polyimide resin is used as the constituent material, an electrical connecting member excellent in heat resistance, weathering resistance can be obtained. Since a polyimide resin has high heat resistance, connection by way of metallization or alloy formation can be effected easily between the second electroconductive member of the electrical connecting member and the connecting portion of the electrical circuit member. Also, it has high effect of shielding harmful wave such as electromagnetic wave, etc. which has deleterious influence on the electrical circuit.

As the holding member, a photosensitive resin may be preferably used. Photosensitive resins are not particularly limited.

One or plural kinds of inorganic materials, metal materials, alloy materials shaped in any desired form such as powder, fiber, plate, rod, sphere, etc. may be also incorporated in the photosensitive resin (organic material). Further, in the inorganic material, there may be also dispersed one or plural kinds of organic materials, metal materials, alloy materials shaped in any desired form such as powder, fiber, plate, rod, sphere, etc. to be incorporated therein. Also, in the metal material, there may be also dispersed one or plural kinds of inorganic materials, organic materials shaped in any desired form such as powder, fiber, plate, rod, sphere, etc. to be incorporated therein. When the holding member comprises a metal material, for example, an electrically insulating material such as resin, etc. may be arranged between the electroconductive member and the holding member.

Here, as the photosensitive resin, for example, polyimide resin, silicone resin and other resins can be used.

If from among these resins, a resin with good thermal conductivity is used, it is preferable because heat dissipation can be effected through the resin even if the semiconductor element has heat. Further, if a resin having a thermal expansion ratio equal to or approximate to the circuit substrate is selected, and also at least one hole or a plurality of bubbles are permitted to exist in the organic material, it becomes possible to further prevent lowering in reliability of the device based on thermal expansion and thermal shrinkage.

Specific examples of the metal material and the alloy material may include Ag, Cu, Au, Al, Be, Ca, Mg, Mo, Fe, Ni, Si, Co, Mn, W, Cr, Nb, Zr, Ti, Ta, Zn, Sn, Pb-Sn and others.

Examples of inorganic materials may include ceramic, diamond, glass, carbon, boron and other inorganic materials such as $SiO_2$, $B_2O_3$, $Al_2O_3$, $Na_2O$, $K_2O$, $CaO$, $ZnO$, $BaO$, $PbO$, $Sb_2O_3$, $As_2O_3$, $La_2O_3$, $ZrO_2$, $BaO$, $P_2O_5$, $TiO_2$, $MgO$, $SiC$, $BeO$, $BP$, $BN$, $AlN$, $B_4C$, $TaC$, $TiB_2$, $CrB_2$, $TiN$, $Si_3N_4$, $Ta_2O_5$, etc.

In the present invention, when a material with good thermal conductivity is used for the holding member, the heat generated from the electrical circuit part or the probe card can be escaped to the external world more rapidly to give an electrical circuit device with good heat dissipatability. Also, when a material with a thermal expansion coefficient approxiate to the electrical circuit part is used for the holding member, the thermal expansion coefficient becomes approximate to the thermal expansion coefficient of the electrical circuit part, whereby such phenomena which damage reliability of the electrical circuit device such as cracks of the electrical circuit part, or characteristics change of the electrical circuit part can be prevented to give an electrical circuit member with high reliability.

Further, by selecting a material with large shielding effect for the holding member, electromagnetic noise emitted from the electrical circuit part to the external world can be reduced, and also the noise entering from the external world into the electrical circuit part can be reduced.

(Connection)

As the connection between the end of the electrical connecting member and the connecting portion of the electrical circuit part, the following three constitutions may be conceivable.

(1) The constitution in which all the electrical circuit parts are connected at their connecting portions with one end of a plurality of electroconductive members exposed on one surface of the holding member through metallization and/or alloy formaton.

(2) The constitution in which at least one electrical circuit part is connected at its connecting portion with one end of a plurality of electroconductive members exposed at one surface of the holding member through metallization and/or alloy formation, and others are connected by other methods than metallization and/or alloy formation.

(3) The constitution in which all the electrical circuit parts are connected at their connecting portions to one end of a plurality of electroconductive members exposed on one surface of the holding member by methods other than metallization and/or alloy formation.

(Connection through metallization and/or alloy formation)

In the following, connection by way of metallization and/or alloy formation is to be described.

When the electrical conductive member and the connecting portion to be connected comprise the same kind of a pure metal, the layer formed by metallization becomes the same kind of crystal structure as the electroconductive member or the connecting portion. As the method for metallization, for example, after the end of the electroconductive member is contacted with the connecting portion corresponding to that end, heating may be effected at a suitable temperature. In this case, diffusion, etc. of atoms occurs in the vicinity of the contacted portion by heating, whereby the diffused portion will become a metallized state to form a metal layer.

When the electroconductive member to be connected and the connecting portion comprise different kinds of pure metals, the connected layer to be formed comprises an alloy. As the method for alloy formation, for example, after the end of the electrical conductive member is contacted with the connecting portion corresponding to that end, heating may be effected at a suitable temperature. In this case, diffusion, etc. of atoms occurs in the vicinity of the contacted portion to form an alloy layer comprising a solid solution or an intermetallic compound in the vicinity of the contacted portion.

When Au is used for the metal member of the electrical connecting member and Al for the connecting portion of the electrical circuit, the heating temperature of 200° to 350° C. may be preferable.

When one of the electroconductive member and the connecting portion to be connected comprises a pure metal and the other an alloy, or both comprise the same kind or different kinds of alloys, the contacted interface comprises an alloy layer.

Concerning a plurality of mutual electrical electroconductive members in one electrical connecting member, there are the case when the respective electroconductive members comprise the same kind of metal or alloy, the case when the respective members comprise different metals or alloys and other cases. Also, concerning one electroconductive member, there are the case when it consists of the same kind of metal or alloy, the case when it consists of different kinds of metals or alloys and others. In either case, the above metallization or alloy formation is effected. On the other hand, the same is also the case for the connecting portion.

The electroconductive member or the connecting portion may be a metal or an alloy at the contact portion between the both, and other portions may be under the state of, for example, having a metal formulated with an inorganic material such as glass, etc. or the state of having a metal formulated with an organic material such as resin, etc.

Also, at the surface of the portion to be connected, there may be provided a plating layer comprising an alloy or a metal which can be readily formed into an alloy.

As the heating method, there may be employed the method of thermal pressurization, etc. or otherwise any of internal heating methods such as the sonication heating method, the high frequency induction heating method, the high frequency dielectric heating method, the microwave heating method, etc., or other external heating methods, and the also the above heating methods may be used in combination. Regardless of whether any heating method may be employed, the connecting portions are heated directly or indirectly to be connected to each other.

In the present invention, when connection between the connecting portion of the electrical circuit part and the electroconductive member is effected through metallization and/or alloy formation, the connecting portion of the electrical circuit part and the electroconductive member are connected firmly (with strong strength) and surely, whereby an electrical circuit member or a probe card with strong mechanical strength and extremely low defective ratio can be obtained. Also, electrical connection can be surely done also at the connecting portion, and also the contact resistance can be made smaller.

(Connection by way of other than metallization and/or alloy formation)

For effecting connection other than the above metallization and/or alloy formation, for example, the electrical circuit part and the electroconductive member of the electrical connecting member may be connected under pressurization.

As another connecting method, there is the connecting method by use of an adhesive. That is, there is the method in which the electrical circuit part and the electroconductive member are adhered on at least a part excluding their connecting portions.

(Part to be measured)

As the part to be measured which can be measured with the probe card obtained according to the present invention, thre may be included, for example, semiconductor elements, circuit substrates such as resin circuit substrate, ceramic substrate, metal substrate, silicon substrate, etc., lead frames, etc.

As the part to be measured of the present invention, the number of the connecting portions posessed by the part having electroconductive connecting portions to be used in the present invention is not limited, but the effect of the present invention becomes more marked as the number of the connecting portions is more.

Also, although the existing positions of the connecting portions are not limited, the effect of the present invention will become more marked as they exist deeper into inner portions of the electrical circuit part.

Two or more of these parts to be measured may be also combined.

(Measurement of electrical characteristics)

In the present invention, electrical characteristics such as current, voltage, frequency characteristics, etc. are measured by use of the probe card obtained in the present invention.

In the present invention, the part to be measured is measured with the probe card having the electrical connecting member connected to the electrical circuit part, and the part to be measured can be arranged not only at the outer peripheral portion but also internally and further the pitch of the electroconductive members of the electrical connecting member can be made narrower to increase the number of the connecting portions, whereby it becomes possible to measure a part to be measured having multiple pin connecting points.

Also, since an insulating material exists up to the vicinity of the tip end of the electricoconductive member of the electrical connecting member exposed on the side of the part to be measured, the tip end can be arranged at a desired position more easily. Further, with the shape of the tip ends being substantially the same, substantially the same force can be applied on a plurality of connecting portions of the part to be measured, whereby stable measurement is rendered possible without giving harm to the both.

Also, the electrical connecting member can be made thinner to shorten the length of the electroconductive member of the electrical connecting member, whereby advantages in electrical measurement can be obtained such that the electrical resistance value is small, that the floating capacity is reduced, that the noise from the external world can be reduced, etc.

Having described above about the actions of the present invention for the respective constitutent requirements, further in the present invention, by making the pitch of the electroconductive members of the electrical connecting member narrower than the pitch of the connecting portions of the part to be measured, registration of the electrical connecting member may be rough. In that case, not only registration of the electrical connecting member may be rough, but also other parts to be measured with the connecting portions of the part to be measured exhibiting substantially the same position can be measured, whereby general purpose availability of the probe card can be increased.

Further, the form of the connecting portions of the part to be measured may be also available in the forms of the wire bonding system, the TAB system, the CCB system.

Further, there is obtained the effect that reproduction is possible even if the electroconductive member of the electrical connecting member may be abraded.

Also, by selecting a material which reducess noise as the insulator of the electrical connecting member, noise entering from external world into the semiconductor can be reduced simultaneously with reduction of electromagnetic noise generated from the semiconductor element to external world.

Further, by selecting a material with good conductivity as the insulator of the electrical connecting member, even if the semiconductor may have heat, its heat can be dissipated more rapidly, and therefore a probe card with good heat dissipating characteristic can be obtained.

(Vibrator)

Another specific feature of the present invention resides in having a vibrator.

The vibrator may be any one, provided that it can vibrate one end of the electroconductive member exposed on the other surface of the holding member.

The number of vibrators may be one or more.

The position of the vibrator may be either internally, externally or both internally and externally of the electrical circuit part. Also, it may be either internally, externally or both internally and externally of the electrical connecting member. Further, it can be provided on both of the electrical circuit member and the electrical connecting member.

It may also be mounted directly on the electrical connecting member or the electrical circuit part, or mounted by embedding therein, or alternatively mounted through an appropriate material (e.g. plate material) interposed.

As the vibrator, there may be included those which will vibrate through physical, mechanical displacement of the vibrator itself by external commands such as electricity, electromagnetic field, light, etc. to give vibration to external world.

As an example which gives vibration by electricity, there is a piezoelectric element. This is an example which converts electricity to mechanical movement. As an example which gives vibration by temperature, there is a shape memorizing alloy. This is an example which converts temperature to mechanical movement.

In the case of this example, a ceramic piezoelectric element by use of a ferroelectric material may be desirable, and it may be displaced according to any method.

In the second and the fourth gists of the present invention, the part to be measured may be also provided with a vibrator.

The direction of vibration may be either one of the planar direction of the part to be measured, the perpendicular direction to the planar direction or the oblique direction to the planar direction.

When both of the probe card and the part to be measured are vibrated, the probe card and the part to be measured may be vibrated in the same direction, or alternatively in the different directions.

Amplitude of vibration, vibration frequency, vibration locus may be determined by destroying the oxide coating existing on the other end of the electroconductive member, particularly on the surface of the connecting portion of the part to be measured, measuring previously the conditions capable of good electrical measurement by experimentation, etc. and choosing freely the parameters as adapted to such conditions.

The term for vibration may be from contact of the probe card with the part to be measured to prior to commencement of measurement, or vibration may be effected after commencement of measurement of the part to be measured, or vibration may be effected from contact of the probe card with the part to be measured to release after completion of measurement, or any other term may be available, Desirably, the term should be preferably from contact of the probe card with the part to be measured to before commencement of electrical measurement of the part to be measured. Further, vibration may be also effected before contact of the probe card with the part to be measured. Also, in the case of vibrating both the probe card and the part to be measured, both may be vibrated at the same timing, or at different timings.

(Encapsulating material)

In the present invention, when the electrical circuit part connected through the electrical connecting portion is not particularly desired to be detached, the electrical circuit part may be encapsulated by embedding in an encapsulating material.

Encapsulation may be effected for only one electrical circuit part or for a plurality of electrical circuit parts.

(Material for encapsulating material)

In the present invention, as the material for encapsulating material, thermoplastic resins can be used. Examples of thermoplastic resins may include polyimide resin, polyphenylenesulfide resin, polyethersulfone resin, polyetherimide resin, polysulfone resin, fluorine resin, polycarbonate resin, polydiphenylether resin, polybenzylimidazole resin, polyamideimide resin, polypropylene resin, polyvinyl chloride resin, polystyrene resin, methyl methacrylate resin and others.

Also, the encapsulating material may be the above resin, or the above thermoplastic resin in which a kind or plural kinds of metals, alloys, inorganic materials shaped in any form such as powder, fiber, plate, rod, sphere, etc. are dispersed. The manner of dispersion may be practiced by adding powder, fiber, plate, rod, sphere, etc. into the resin, followed by stirring of the resin. Of course, without recourse to such method, powder, fiber, plate, rod, sphere, etc. may be also dispersed into the resin according to any other method.

As the above metal or alloy, for example, metals or alloys such as Ag, Cu, Au, Al, Be, Ca, Mg, Mo, Fe, Ni, Si, Co, Mn, W, etc. may be employed.

As the inorganic material, for example, there may be included ceramic, diamond, glass, carbon, boron and other inorganic materials such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, B4C, TaC, $TiB_2$, $CrB_2$, TiN, $Si_3N_4$, $Ta_2O_5$, etc.

The size, the shape, the position to be dispersed in the insulator, the amount of powder, fiber, plate, rod, sphere, etc. to be dispersed may be any desired ones. Also, the powder, fiber, plate, rod, shpere, etc. may be exposed externally of the insulator or may not exposed. Further, the powder, fiber, plate, rod, sphere, etc. may be also contacted with each other or not contacted.

In the present invention, when powder, fiber, plate, rod, sphere, etc. with good thermal conductivity is dispersed in the encapsulating material, the heat generated from the electrical circuit part or the probe card can be escaped more rapidly to external world, whereby an electrical circuit device with good heat dissipatability can be obtained. When one or both of powder, fiber, plate, rod, sphere, etc. having thermal expansion coefficient approximate to the electrical circuit part is dispersed in the encapsulating material, the thermal expansion coefficient will be approximate to the thermal expansion coefficient of the electrical circuit part, whereby such phenomena to damage reliability of the electrical circuit device such as cracks of the encapsulating material, the electrical circuit part, or the characteristics change of the electrical circuit part which may occur when heat is applied can be prevented to give an electrical circuit member of high reliability.

(Encapsulating method)

As the method for encapsulating an encapsulating material, an electrical circuit member (member comprising an electrical connecting member and an electrical circuit part connected thereto) is placed within the cavity of a mold, and encapsulation may be effected by inserting the encapsulating material by injection molding. The electrical circuit member can be encapsulated according to any method such as injection molding, extrusion molding, cast molding, hollow molding and others.

Further, the above encapsulating material and a plate (plate is made of a material different from encapsulating material) may be also used in combination. As such encapsulation modes, there may be included the case wherein a plate is bonded to at least a part of the surface of the encapsulating material, the case wherein at least a part of the plate bonded to at least a part of at least one of other electrical circuit part connected to the electrical circuit part and the electrical connecting member with the encapsulating member on the surface on the side opposite to the electrical member is embedded, and the case wherein at least a part of the plate arranged in the vicinity of either one or a plurality of side surfaces of the electrical circuit part connected to the electrical circuit part and the electrical connecting member with the encapsulating member is embedded.

(Plate)

The material may be any material which is different from the material of the encapsulating material.

The plate thickness may be preferably 0.05 to 0.5 mm in the case of, for example, a stainless plate.

In the case of bonding, the bonding method is not particularly limited. For example, plastering may be effected by use of an adhesive, etc., but any other method may be available.

In the present invention, by providing a plate which exists on the surface of the encapsulating material or as embedded in the encapsulating material, stress concentration can be relaxed even when internal stress may be generated within the electrical circuit member or force may be externally applied. Accordingly, cracks, etc. which may occur by stress concentration can be prevented. Also, the plate has the action of elongating the route from external world to the electrical circuit part, and hence water, etc. will be penetrated into the electrical circuit part with difficulty. Therefore, the reliability of the electrical circuit material can be enhanced.

When the material of the plate is a metal such as stainless steel, etc., ceramic, carbon, diamond, etc. with good thermal conductivity, the heat generated from the electrical circuit part can be dissipated rapidly to external world, whereby an electrical circuit excellent in heat dissipating characteristic can be obtained. Further, when the material of the plate is a metal, the noise from external world can be shielded to be influenced from the noise with difficulty, and further the electromagnetic noise generated from the electrical circuit part can be shielded to give an electrical circuit member having good characteristics with little generation of noise.

(Cap)

In the present invention, the electrical circuit part may be also cap encapsulated.

Here, cap encapsulation means encapsulating the electrical circuit part to enclose the electrical circuit part so that a hollow portion may exist internally thereof.

The cap may be provided only for one electrical circuit part or for a plurality of electrical circuit parts.

When carrying out cap encapsulation, it is preferable to effect encapsulation so that the electrical circuit parts may be held securedly with the electrical connecting members. For example, cap encapsulation may be effected so that the inner surface of the cap may be made a shape corresponding to the surface shape of the outside of the electrical circuit part to be contacted at its surface with the surface of the outside of the electrical circuit part.

The cap may be bonded to the electrical circuit part or another cap (in the case when both of the electrical circuit part existing on one surface of the holding member and the electrical circuit member existing on the other surface are cap encapsulated) according to the plastering method with an adhesive, the mechanical method, the method by welding or any other desired method.

(Material of cap encapsulation)

The material of cap encapsulation may be an organic material, an inorganic material, a metal material, or a composite material of these.

When the cap is made of a material with good noise shielding characteristic, particularly a metal of iron type, etc., an electrical circuit member with more excellent shielding effect can be obtained. Also, when a member for control is interposed between the cap and the electrical circuit part, it becomes possible to assemble the parts with good efficiency, even when there may occur variance in height of the electrical circuit parts.

The encapsulation mode may be such that either one or a plurality of electrical circuit parts may be encapsulated with the same cap. Also, encapsulation may be effected so that the cap may press the electrical circuit or alternatively hold it.

Further, encapsulation may be also effected with a member interposed between the electrical circuit part and the cap. In this case, the effect can be more marked if a plurality of electrical circuit parts are encapsulated with the same cap.

The cap may be bonded to the electrical circuit parts and others according to any method.

(Member for control)

In the present invention, a member for control may be also interposed between the cap and the electrical circuit member.

The material of the member for control may be either one of metal materials, inorganic materials and organic materials, but a material having elasticity is preferred.

The shape may be any desired one, provided that the dimension in the height direction of the electrical circuit part can be controlled.

[EXAMPLES]

(Example 1)

The first example of the present invention is to be described by referring to FIGS. 8A to 8C and FIGS. 9A to 9C.

FIG. 8 is a perspective view of a probe card to which the present invention is applied, in which the electrical connecting member 125 and the circuit substrate 104 which is an electrical circuit member are drawn as separated from each other. Under the completed state, the electrical connecting member 125 and the circuit substrate 104 are made integral as shown in the sectional view in FIG. 8B, and the whole assembly is the probe card 200.

In the probe card 200 according to this example, the electrical connecting member 125 has a holding member 111 comprising an electrical insulating material of an organic material and a metal member 107 which is an electroconductive member embedded in the holding member 111, and one end of the metal member 107 is exposed at one surface of the holding member 111, and also the other end of the metal member 107 is exposed on the other surface of the holding member.

Further, the circuit substrate 104 has a connecting portion 102, and at the connecting portion 102, one end of the metal member 107 exposed on one surface of the holding 111 is connected by brazing.

In the following, this example is described in more detail.

First, the electrical connecting member 125 is described by referring to a preparation example of the electrical connecting member 125.

Figure 9A:
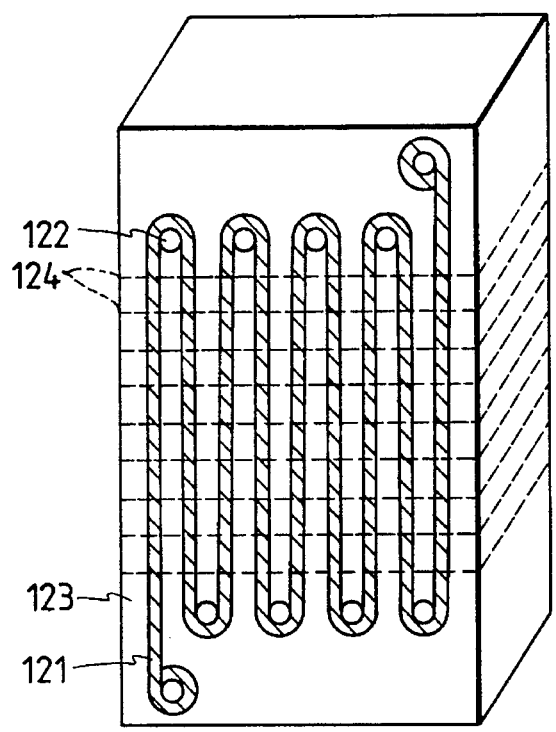
FIGS. 9A through 9C show a first example of the present invention, FIG. 9A showing a perspective sectional view, FIG. 9B a perspective view and FIG. 9C a sectional view.
Figure 9B:
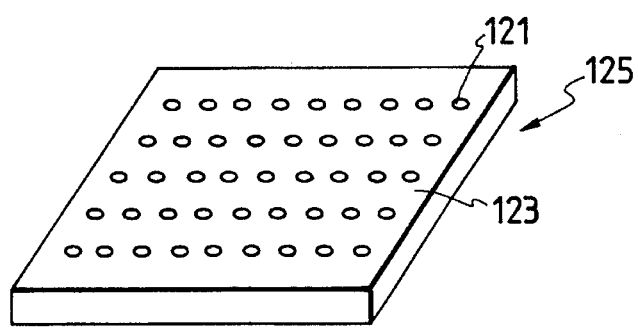
Figure 9C:
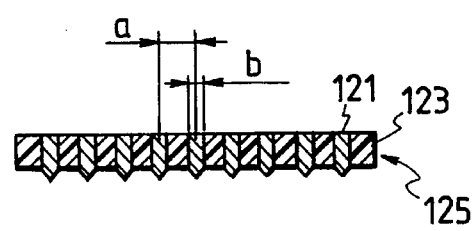

FIGS. 9A to 9C show a preparation example.

First, as shown in FIG. 9A, a metal wire 121 comprising a metal such as W or an alloy with a diameter b of 20 μmφ applied with solder plating is wound around a rod 122 with a pitch a of 40 μm, and after winding, the above metal wire 121 is embedded in a resin 123 such as of polyimide. After embedding, the above resin 123 is cured. The cured resin 123 becomes an insulator. Then, it is sliced to prepare an electrical connecting member 125. The electrical connecting member 125 thus prepared is shown in FIG. 9B.

In the thus prepared electrical connecting member 125, the metal wire 121 constitutes the metal member 107, and the resin 123 constitutes the holding member (insulator) 111.

In the electrical connecting member 125, the metal wires 121 which become the metal member are mutually insulated electrically from each other with the resin 123. Also, one end of the metal wire 121 is exposed on the circuit substrate 104 side, while the other end exposed on the side of the part to be measured. The one end of the metal wire 121 exposed on the circuit substrate 104 side becomes the connecting portion with the circuit substrate 104. On the other hand, the portion exposed on the side of the part to be measured becomes the connecting portion for connecting electrically with the part to be measured.

In this example, the end of the metal wire exposed on the side of the part to be measured is made an apex shape (FIG. 9C). For making htus an apex shape, the face of the resin 123 on the side of the part to be measured is removed to about 10 μm by use of an etching material for the resin to have the metal wire protruded, and the protruded wire may be etched with the use of an etching material for the metal.

The cut face of the electrical connecting member 125 may be solder plated again so as to be readily brazed.

Figure 10A:
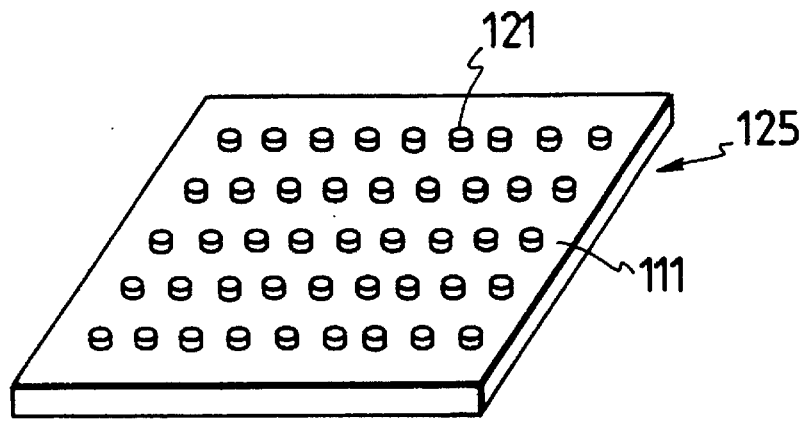
FIG. 10A and 10B show a modified example of the first example of the present invention, FIG. 10A showing a perspective view and FIG. 10B a sectional view.
Figure 10B:
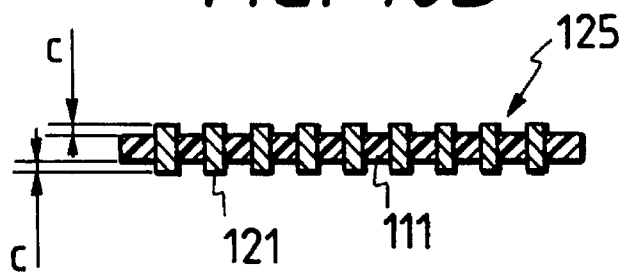
Figure 11:
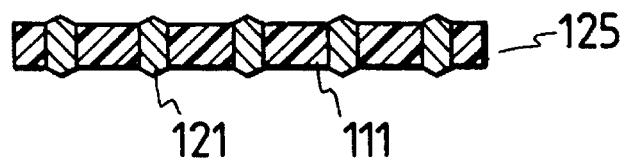
FIG. 11 is a sectional view showing a modified example of the first example of the present invention.

In this example, one end of the metal wire is protruded in apex form on the side of the part to be measured, but protrusion may be effected at both faces (FIG. 10), or the both protruded portions may be also shaped in apex (FIG. 11).

In the example as described above, the amount c protruded is made 10 μm, but any amount may be employed.

As the method for having the metal wire 121 protruded, etching is not limitative, but any other chemical or mechanical method may be employed.

Next, as shown in FIG. 8A, the circuit substrate 104 and the electrical connecting member 125 are prepared as the electrical circuit parts. The circuit substrate 104 to be used in this example has a large number of connecting portions 102 internally thereof.

The connecting portion 102 of the circuit substrate 104 has the metal exposed at the position corresponding to the connecting portion 108 of the electrical connecting member 125.

Registration is effected so that the connecting portion 102 of the circuit substrate 104 may correspond to the connecting portion 108 of the electrical connecting member 125, and after registration, the connecting portion 102 of the circuit substrate 104 (in this example, comprising Cu having a soldering material plated thereof) is connected to the connecting portion 108 of the electrical connecting member 125 (in this example, comprising W having a soldering material plated thereon) by way of brazing. In FIG. 8B, 230 is a brazing material.

Next, the method for measuring the electrical characteristics of the part to be measured with the probe card 200 prepared as described above is to be described by referring to FIG. 8C.

In this example, a semiconductor element 101 is prepared as the part to be measured. This semiconductor element 101 has connecting portions arranged at a pitch of 40 μm.

Registration is effected so that the connecting portion 105 of the electrical semiconductor element 101 may correspond to the connecting portion 109 of the electrical connecting member 125, and after registration, the connecting portion 105 of the semiconductor element (in this example, comprising Al) is connected electrically to the connecting portion 109 of the electrical connecting member 125 (FIG. 8C), and the electrical characteristics are measured. Connection in this case is temporary, and detachment is possible after completion of the measurement.

When measurement is conducted repeatedly while repeating detachment of the semiconductor element 101 to the probe card, abrasion of the electroconductive portion material is found to be little.

(Example 2)

Figure 12:
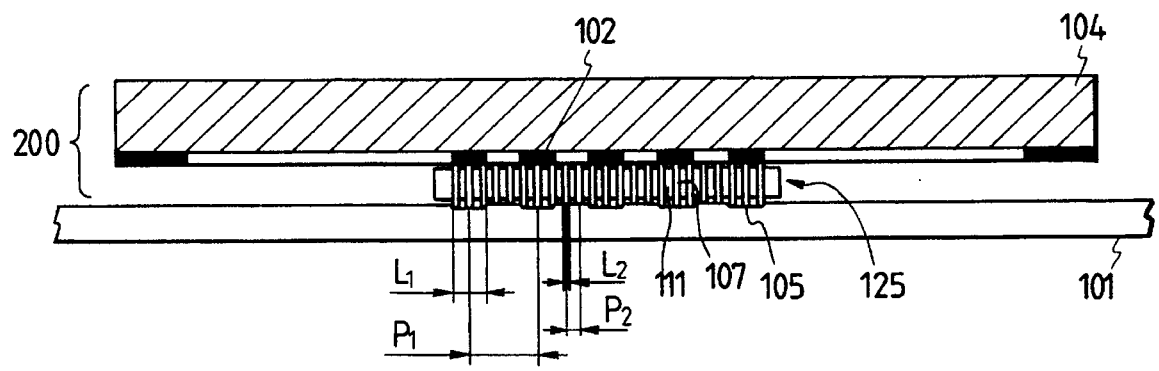
FIG. 12 is a sectional view showing a second example of the present invention.

FIG. 12 shows the second example.

In this example, the electrical connecting member 125 is different from the electrical connecting member shown in the first example. More specifically, in the electrical connecting member of this example, the pitch mutually between the metal members is narrower than that shown in the first example. That is, in this example, the pitch mutually between the metal members 107 is set at intervals narrower than the intervals between the connecting portions 105 of the semiconductor element 101.

In short, in the first example, correct registration between the semiconductor element 101 and the electrical connecting member 125 is required, but in this example, connection may be also possible without requiring correct registration by selecting the connection dimensions (L1, P1) of the semiconductor element and the connection dimensions of the electrical connecting member (L2, P2) at adequate values.

Also, in this example, during preparation of the probe card 200, correct registration between the connecting portion 102 of the circuit substrate 104 and the connecting portion 108 of the electrical connecting member 125 becomes unnecessary. Further, in this example, there is shown an example in which Au is used for the connecting portion 102 of the circuit substrate 104 and gold or a gold alloy is used for the metal member and the connecting portion 108 of the electrical connecting member 125 to effect connection by metallizatio and/or alloy formation.

Other points are the same as in the first example.

(Example 3)

FIG. 13 shows the electrical connection member to be used in the third example. The electrical connection member has a layered structure.

Figure 13A:
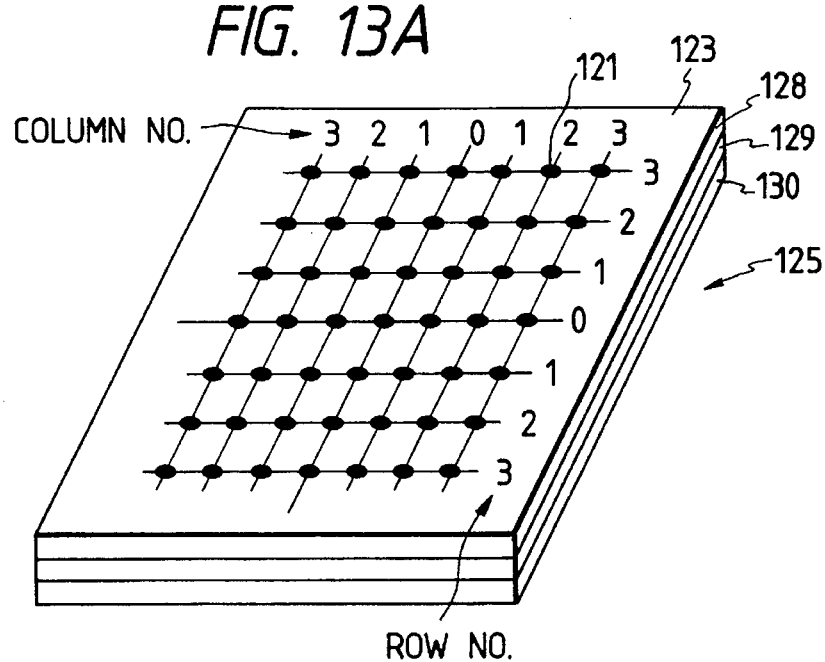
FIGS. 13A and 13B show a third example of the present invention, FIG. 13A showing a perspective view and FIG. 13B a sectional view.
Figure 13B:
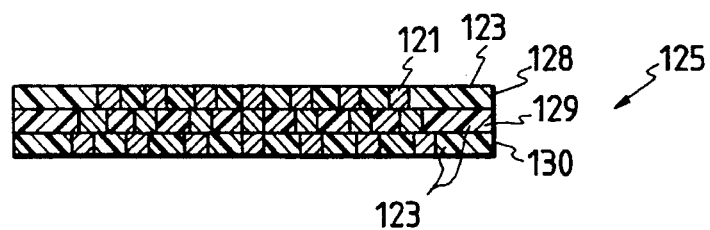

FIG. 13A is a perspective view of the electrical connection member, and FIG. 13B a sectional view of the above electrical connection member.

A preparation example of such electrical connecting member is described below.

First, according to the preparation method shown in the first example, three sheets of electrical connecting members 128, 129 and 130 are prepared.

The position of the metal wire 121 of the first sheet 128 is at the mth row and the nth column to be dislocated by mac and nbc from the center. The position of the metal wire 121 of the third sheet 130 is at the mth row and the nth column to be dislocated by mad and nbd form the center. The values of a, b, c and d take the values such that the upper and lower metal wires 121 are conducted to each other but the right and left wires will not be electrically conducted to each other. Registration of the three sheets of the electrical connecting members is effected, and they are laminated by use of brazing, etc. to prepare an electrical connecting member 125.

In this example, the position of the metal wire of the electrical connecting member is chosen so as to have such a regular position of mth row and nth column, but it may be also random, provided that the upper and lower wires are conducted to each other, while right and left wires will not be conducted to each other.

Figure 3:
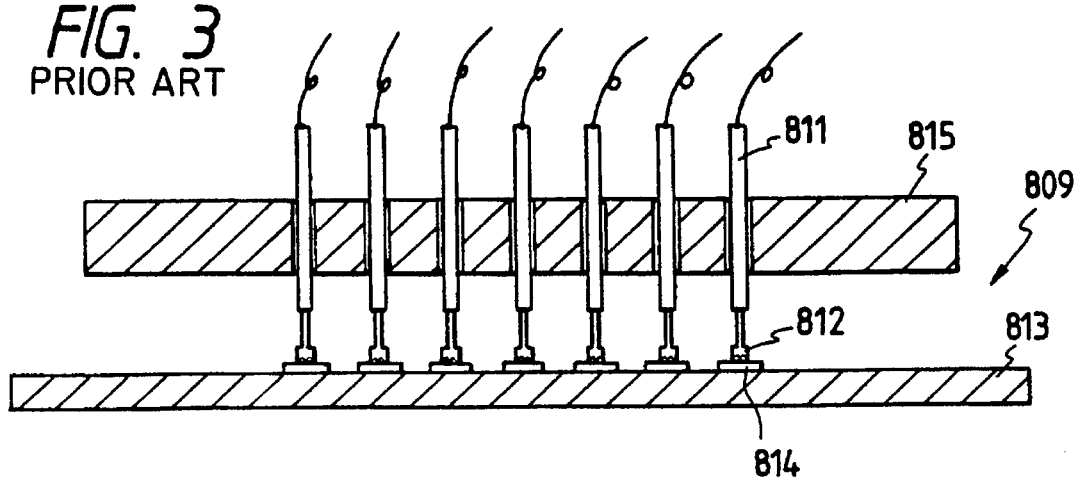
Figure 4:
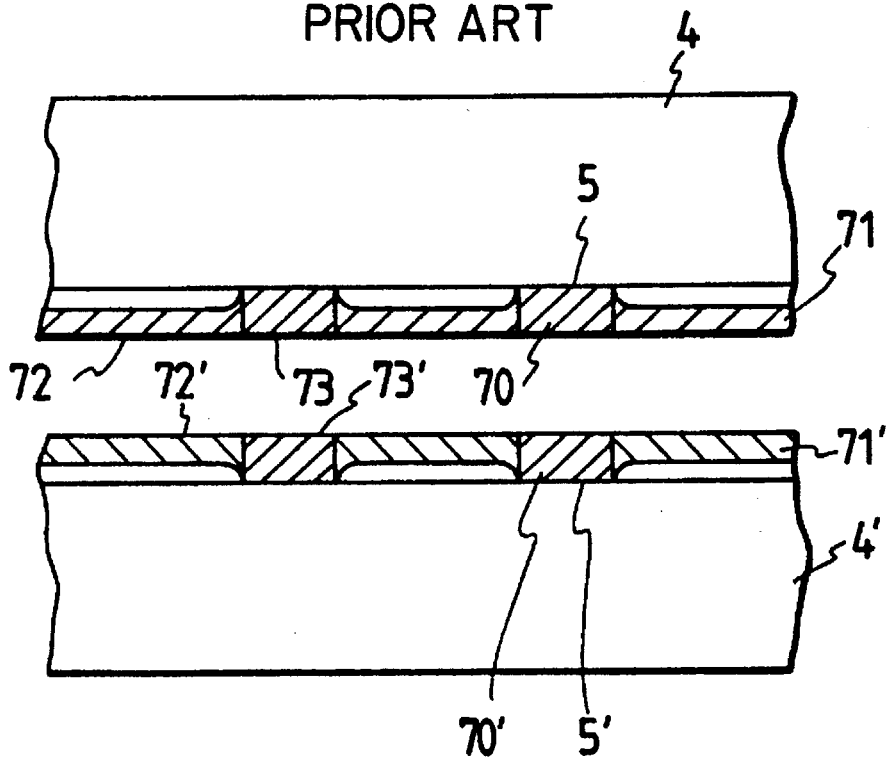
Figure 5:
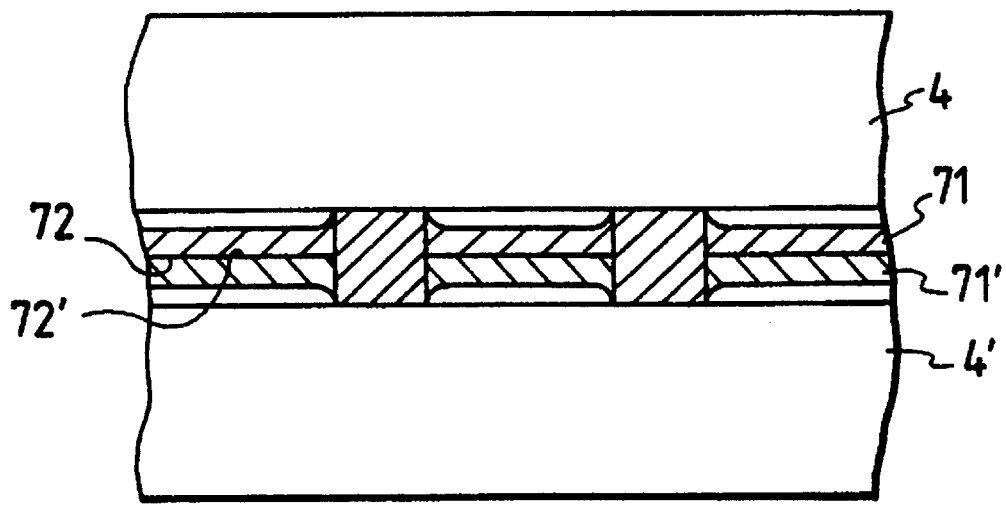
Figure 6:
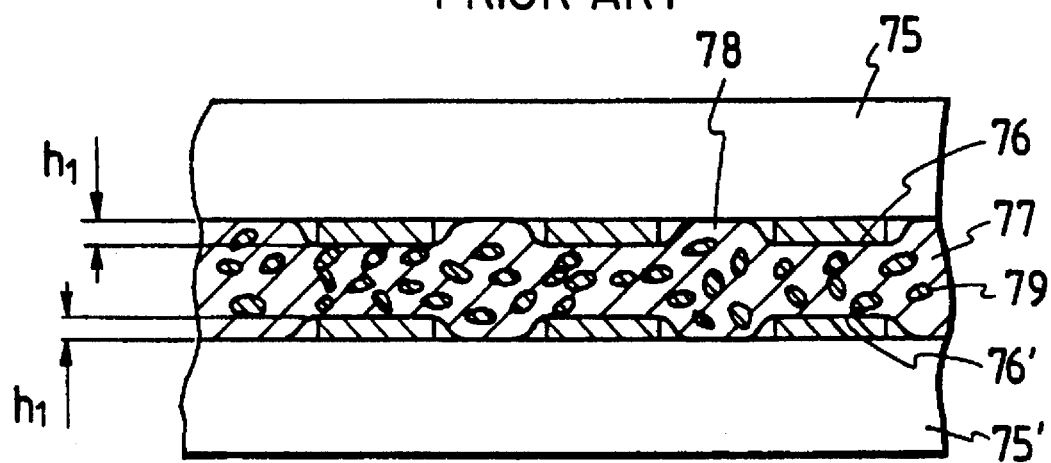
Figure 7:
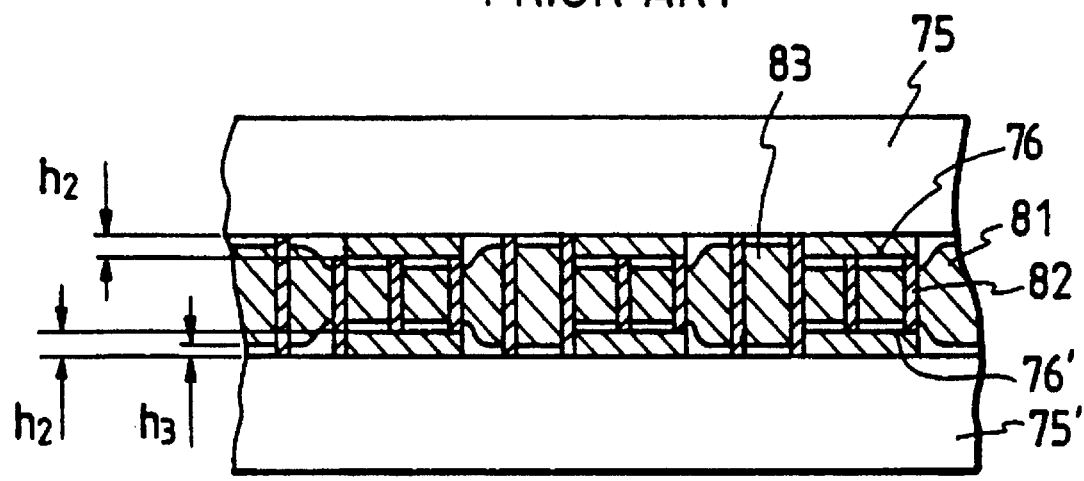

In this example, the case of laminating three sheets is described, but the number of the sheets may be any of two or more sheets. Also, lamination is described to be effected by use of brazing, but the method such as metallization and/or alloy formation, pressurization, adhesion, etc. may be also employed. Further, projections as shown in FIG. 3 may be also provided by applying working such as changing the cutting position of the electrical connecting member of this example, for example, the metal wire 121, or an apex form as shown in FIG. 4 may be formed.

(Example 4)

FIG. 14 shows the electrical connecting member to be used in the fourth example.

Figure 14A:
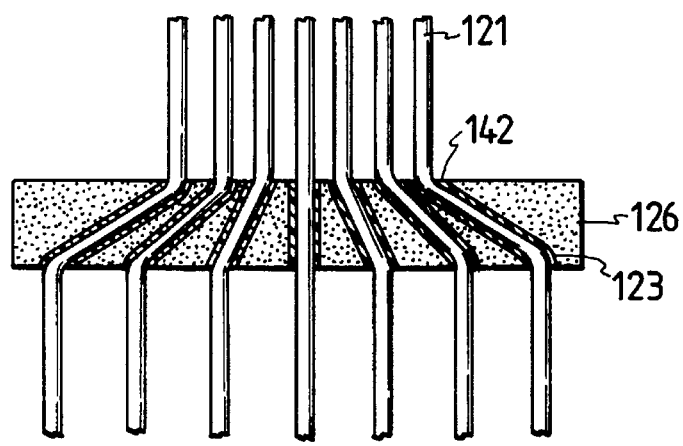
FIGS. 14A to 14C show a fourth example of the present invention, FIG. 14A showing a sectional view, FIG. 14B a perspective view and FIG. 14C a sectional view.
Figure 14B:
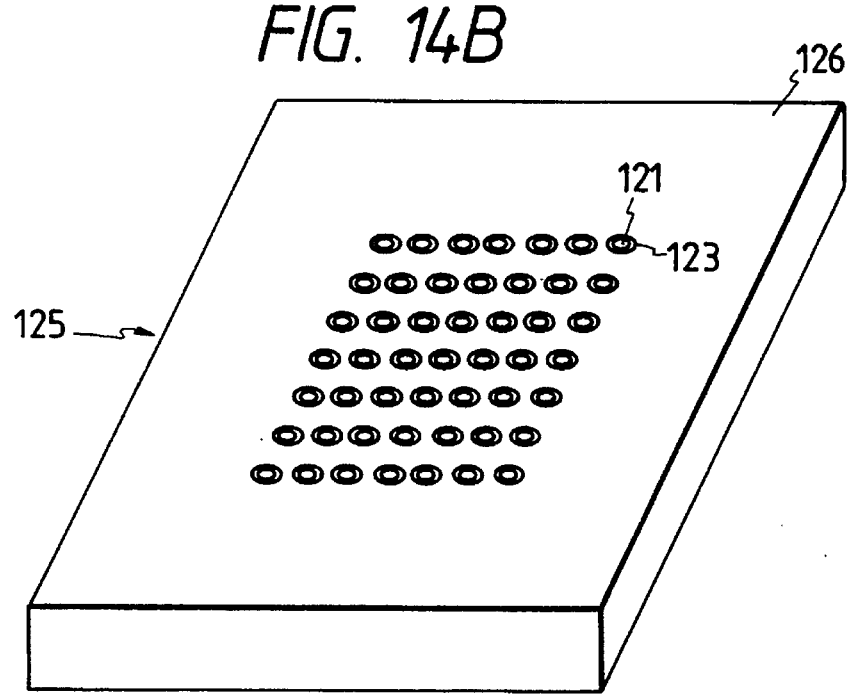
Figure 14C:

FIG. 14A is a sectional view of the electrical connecting member in the course of preparation, and FIG. 14B is a perspective view of the above electrical connecting member and FIG. 14C a sectional view of the above.

Previously, a holding member 126 comprising alumina ceramic is bored with a hole 142 with a diameter larger than 20 μmφ. Next, through the hole 142 is passed a metal wire 121 comprising a metal such as Au or a metal alloy of 20 μmφ in diameter, and a resin 123 is placed in between the holding member 126 and the metal wire 121, followed by curing of the resin 123. The cured resin 123 becomes an intervening matter. Then, the metal wire 121 is sliced at the position of the dotted line 124 to prepare an electrical connecting member 125. The electrical connecting member thus prepared is shown in FIGS. 14B, 14C.

Also, the electrical connecting member of this example may be provided with a projection as shown in FIG. 3 by applying working to change the cutting position of the metal wire 121, or an apex form may be formed as shown in FIG. 4.

Other points are the same as in the first example.

Also in this example, measurement of electrical characteristics can be done very correctly.

Further, reliability of various characteristics is also excellent.

In the first example to the fourth example as shown above, the connecting portions of the electrical circuit and the electroconductive members of the electrical connecting member are arranged regularly in rectangular shape, but the manner in which they are arranged is not limited to these examples, and also the numbers of the connecting portions and the electroconductive members may be any desired numbers.

According to the present exemplary embodiments, a number of effects as mentioned below are obtained.

(1) Since probing is possible regardless of where the part to be measured, particularly the connecting portion of the semiconductor element may be placed (particularly internally), it has become possible to perform probing of a semiconductor element having more connecting points than the wire bonding system, TAB system of the prior art, whereby a probe card suited for multiple pin number can be provided. Further, due to the presence of an insulating substance between adjacent metals of the electrical connecting member, there is no electrical conduction between the adjacent electroconductive members even when the adjacent pitch may be made narrower, whereby it has become possible to effect probing of a semiconductor element with further increased multiple points than in the CCB system.

(2) Because the plural number of electroconductive members of the electrical connecting member exposed in the vicinity of the material to be measured have substantially the same shape, the force applied on the connecting portion of the material to be measured becomes substantially the same, whereby a probe card capable of measuring stably without giving a damage to the material to be measured can be obtained. Further, since the tip end of the electroconductive member can be arranged easily at a desired position, it has become possible to prepare a probe card at low cost.

(3) By making the thickness of the electrical connecting member thinner, electrical resistance becomes smaller, and further floating capacity and noise from external world can be reduced.

(4) Even when the tip end of the electroconductive member of the electrical connecting member may be abraded, reproduction is possible and therefore a probe card enriched in durability can be obtained.

(5) Because the electrical connecting members of the probe card can be exchanged easily, and also the diameter or the adjacent pitch of the semiconductor element can be varied by varying the diameter or the adjacent pitch of the electroconductive member, it has become possible to effect probing of semiconducter elements which may be substantially the same or different to increase general purpose availability.

(6) By selecting a material which will reduce noise as the insulator of the electrical connecting member, the electromagnetic noise generated from the semiconductor element and the noise from the external world can be reduced, whereby it has become possible to obtain a probe card having excellent characteristics.

(7) By selecting a material with good thermal conductivity for the insulator of the electrical connecting member and the circuit substrate, it has become possible to escape rapidly the heat generated from the semiconductor during measurement.

(8) During preparation steps, it is not necessary to mount the respective electrical members by holding individually by use of implements, etc., and therefore it has become possible to simplify the steps and shorten the preparation time.

Further, in the second invention, in addition to the above effects (1) to (8), the following effects are obtained.

(9) Connection between the connecting portion of the electrical circuit part and the electroconductive member of the electrical connecting member can be surely effected, and therefore a firm probe card with strong mechanical strength can be obtained, and also management and handling after preparation become easier.

(10) Also, electrical badness and contact resistance at the connecting portion in the above (9) can be remarkably decreased.

Also, in the third invention, by use of the probe card having the above effects (1) to (8), the following effects are obtained.

(11) Due to reduction in electrical resistance and floating capacity and noise from the external world, it has become possible to measure electrical characteristics of semiconductor element, etc. correctly and at high precision.

(12) Registration during measurement has become easier, and also substantially the same semiconductor can be measured with the same probe card, and further a plurality of semiconductor elements, etc. can be easily measured, whereby measuring working can be effected more efficiently.

Further, in the fourth invention, by use of the probe card having the above effects of (1) to (10), the following effect can be obtained.

(13) Due to decrease of electrical badness and contact resistance, measurement of electrical characteristics of a semiconductor element can be done correctly and at high precision, whereby measurement with high reliability is rendered possible.

(Example 5)

The fifth example of the present invention is described below by referring to FIGS. 15A to 15C and FIGS. 8A to 8C, but the basic constitution is the same as the first example, and its explanation is omitted.

The probe card of this example has a specific feature in having a vibrator 253 which vibrates the other end of the metal member 107.

The preparation example of the electrical connecting member 125 which contitutes the probe card according to this example is the same as shown in FIGS. 9A to 9C described in the first example, and its explanation is omitted.

The electrical connecting member 125 prepared as shown in FIGS. 9A to 9C is connected to the circuit substrate 104, and subsequently fixed and supported by plastering the supporting plate 251 on the back surface of the circuit substrate 104. Then, fixing and supporting are effected by plastering at least a part of one end 253 of the bimorph piezoelectric element 252 onto the supporting plate 251 to constitute the probe card 200.

The other end of the bimorph piezoelectric element of the probe card 200 is fixed onto the external supporting plate.

The bimorph piezoelectric element 252 in this example has a structure with piezoelectric ceramic plates 255 plastered on both surfaces of an elastic shim plate 254. The piezoelectric ceramic plate 255 on the back of the elastic shim plate 254 cannot be seen.

The exposed portions of a plurality of the electroconductive members 107 of the electrical connecting member 125 of the probe card prepared according to such method are brought into contact with the connecting portions 105 of the semiconductor element 101.

Then, the bimorph piezoelectric element 252 is vibrated on the drawing in the direction substantially perpendicular to the paper surface. Vibration is transmitted through the supporting plate 251, the circuit substrate 104, the electrical connecting member 125, whereby a plurality of the electroconductive members 107 on the semiconductor element side are vibrated to destroy the surface oxide of Al at the connecting portions 105 of the semiconductor 101. By this, the contact resistance between the electroconductive member 107 of the electrical connecting member 125 and the connecting portion 105 of the semiconductor element becomes smaller. Then, vibration is stopped, and the semiconductor element 101 is electrically measured.

In the case of this example, the supporting plate 251 is provided, but one end 253 of the bimorph piezoelectric element 252 may be fixed and supported by plastering it directly onto at least a part of the circuit substrate 104. Also, in the case of this example, the bimorph piezoelectric element 252 is used, but any other vibratable material may be employed.

Next, the method for measuring the electrical characteristics of the part to be measured with the probe card 200 prepared as described above is to be described by referring to FIG. 15C.

In this example, a semiconductor element 101 is prepared as the part to be measured. The semiconductor element 101 has the connecting portions arranged with a pitch of 40 μm.

Registration is effected so that the connecting portion 105 of the semiconductor element 101 may correspond to the connecting portion 109 of the electrical connecting member 125, and after registration, the connecting portion 105 of the semiconductor element 101 (in this example, comprising Al) is connected to the connecting portion 109 of the electrical connecting member 125 (in this example, comprising W) (FIG. 15C) to carry out measurement of electrical characteristics. In this case, connection is temporary, and detachment may be possible after completion of measurement.

When measurement is conducted repeatedly while repeating detachment of the semiconductor element 101 to the probe card, abrasion of the electroconductive portion is found to be little.

In this example, measurement of the electrical characteristics can be done extremely correctly.

(Example 6)

FIG. 16 shows the sixth example.

This example has substantially the same constitution as the second example, but is different therefrom in that a vibrator is provided.

Also, in this example, the position where the vibrator is provided and the vibration direction are different from those shown in the fifth example. More specifically, in this example, the vibrators are provided at both of the probe card 200 and the vicinity of the semiconductor element 101.

The piezoelectric element 261 mounted at the probe card 200 is fixed and supported by mounting it onto the circuit substrate 104. The vibration direction is vertical relative to the paper surface. For this purpose, the electroconductive member 107 on the semiconductor element 101 side is vibrated vertically relative to the paper surface.

At least a part of the bimorph piezoelectric element 262 mounted in the vicinity of the semiconductor element 101 is mounted on the support 263 to be fixed and supported thereon. On the support 263 is fixed and supported the semiconductor element by such method as suction, etc. The bimorph piezoelectric element 162 is vibrated in the direction substantially perpendicular to the paper surface to vibrate the support 263, and also vibrate the connecting protion 105 of the semiconductor element.

In this example, during measurement of the part to be measured, although administration between the semiconductor element 101 which is the part to be measured and the probe card 200 is required, correct registration with the electrical connecting member 125 is not required in this example.

Also in this example, measurement of the electrical characteristics can be done very correctly.

Other points are the same as in the fifth example.

As the electrical connecting member to be used in the above fifth and sixth examples, those as shown in FIG. 13 and FIG. 14 can be used as a matter of course.

According to the fifth and sixth examples, the following effects are obtained.

(1) Since probing is possible regardless of where the part to be measured, particularly the connecting portion of the semiconductor element may be placed (particularly internally), it has become possible to perform probing of a semiconductor element having more connecting points than the wire bonding system, TAB system of the prior art, whereby a probe card suited for multiple pin number can be provided. Further, due to the presence of an insulating substance between adjacent metals of the electrical connecting member, there is no electrical conduction between the adjacent electroconductive members even when the adjacent pitch may be made narrower, whereby it has become possible to effect probing of a semiconductor element with further increased multiple points than in the CCB system.

(2) Because the plural number of electroconductive members of the electrical connecting member exposed in the vicinity of the material to be measured have substantially the same shape, the force applied on the connecting portion of the material to be measured becomes substantially the same, whereby a probe card capable of measuring stably without giving a damage to the material to be measured can be obtained. Further, since the tip end of the electroconductive member can be arranged easily at a desired position, it has become possible to prepare a probe card at low cost.

(3) By making the thickness of the electrical connecting member thinner, electrical resistance becomes smaller, and further floating capacity and noise from external world can be reduced.

(4) Even when the tip end of the electroconductive member of the electrical connecting member may be abraded, reproduction is possible and therefore a probe card enriched in durability can be obtained.

(5) Because the electrical connecting members of the probe card can be exchanged easily, and also the diameter or the adjacent pitch of the semiconductor element can be varied by varying the diameter or the adjacent pitch of the electroconductive member, it has become possible to effect probing of semiconducter elements which may be substantially the same or different to increase general purpose availability.

(6) By selecting a material which will reduce noise as the insulator of the electrical connecting member, the electromagnetic noise generated from the semiconductor element and the noise from the external world can be reduced, whereby it has become possible to obtain a probe card having excellent characteristics.

(7) By selecting a material with good thermal conductivity for the insulator of the electrical connecting member and the circuit substrate, it has become possible to escape rapidly the heat generated from the semiconductor during measurement.

(8) During preparation steps, it is not necessary to mount the respective electrical members by holding individually by use of implements, etc., and therefore it has become possible to simplify the steps and shorten the preparation time.

(9) By vibrating relatively a plurality of electrical connecting members in contact with the connecting portion of the part to be measured, the surface oxide film formed at the plurality of electrical connecting portions and/or the connecting portion of the part to be measured is destroyed or the dust attached is scattered, whereby it has become possible to make the contact resistance smaller. Further, by vibrating the plurality of the electrical connecting members on the side of the part to be measured and/or the part to be measured at the time other than during contact, the dust attached can be scattered and it has become possible to remove the dust by way of suction, etc.

Also, in the second invention, by use of the probe card having the above effects (1) to (9), the following effects are obtained.

(10) Due to reduction in electrical resistance and floating capacity and noise from the external world, it has become possible to measure electrical characteristics of semiconductor element, etc. correctly and at high precision.

(11) Registration during measurement has become easier, and also substantially the same semiconductor can be measured with the same probe card, and further a plurality of semiconductor elements, etc. can be easily measured, whereby measuring working can be effected more efficiently.

(12) Prior to and/or during measurement of the part to be measured, the surface oxide film is destroyed by giving vibration to the other end of the electroconductive member and or the connecting portion of the part to be measured to scatter and remove the attached dust, thereby making the contact resistance smaller, whereby it has become possible to measure better the electrical characteristics of the semiconductor element, etc. at high reliability.

Further, in the third invention, by use of the probe card having the above effects of (1) to (9), the following effects can be obtained.

(13) Connection between the connecting portion of the electrical circuit part and and the electroconductive member of the electrical connecting member can be surely effected, whereby a firm probe card with strong mechanical strength can be obtained and also management and handling after preparation become easier.

(14) Electrical badness and contact resistance at the connecting portion in the above (13) can be remarkably decreased.

Further, in the fourth invention, by use of the probe card having the above effect os (1) to (9) and (13) to (14), the following effect can be obtained.

(15) Due to decrease in electrical badness and contact resistance, measurement of the electrical characteristics of the semiconductor element can be done at more correct and higher precision, whereby measurement of high reliability is rendered possible.

(EXAMPLE 7)

The seventh example of the present invention is to be described by referring to FIGS. 19A to 19C and FIGS. 9A to 9C.

The probe card 200 according to this example has an electrical connecting member 125. The electrical connecting member 125 has a holding member 111 comprising an electrical insulating material of an organic material and a metal member 107 which is an electroconductive member embedded in the holding member 111, with one end of the metal member 107 being exposed at one surface of the holding member 111, while the other end of the metal member 107 exposed on the other surface of the holding member, and also has a wiring pattern 300.

The preparation example of the electrical connecting member 125 constituting the probe card according to this example is the same as shown in FIGS. 9A to 9C as described in the first example, and its detailed description is omitted.

Figure 18:
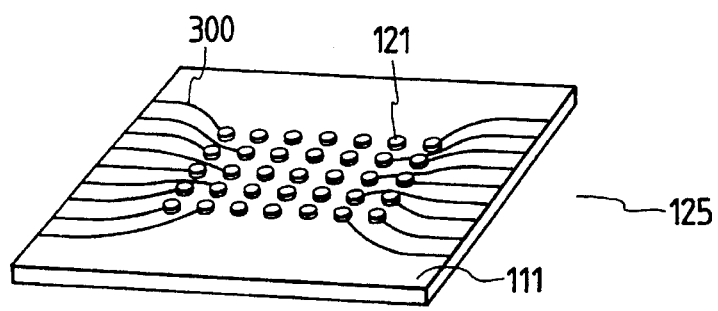
FIG. 18 is a perspective view of the electrical connecting member used in the eighth example of the present invention.

For making the wiring pattern 300 on the electrical connecting member 125 prepared as shown in FIGS. 9A to 9C, copper is attached by vapor deposition or the sputtering method, unnecessary portions are patterned by etching and further gold plating is attached. The electrical connecting member thus prepared is shown in FIG. 18. For formation of the wiring pattern, it has been described that gold plating is attached after patterning by vapor deposition of copper, but any other method than this method may be used.

The electrical connecting member 125 has wiring patterns 300 on both surfaces of the holding member 111.

Figure 17A:
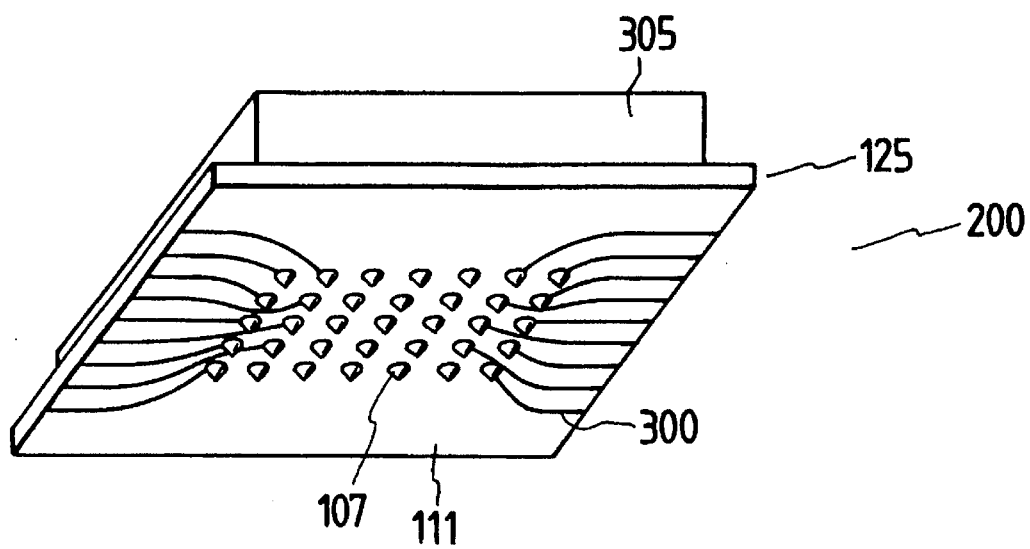
FIGS. 17A to 17C show a seventh example of the present invention, FIG. 17A showing a perspective view, FIGS. 17B and 17C sectional views.
Figure 17B:
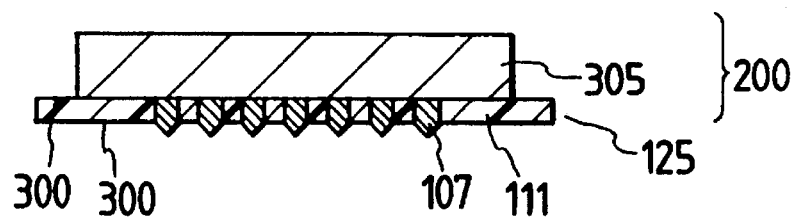

Further, on the surfaces on the side where the electrical connecting portion of the metal member 107 is made in the shape of an apex and on the opposite side, plates 305 for reinforcement are plastered to provide a probe card 200 (FIGS. 17A, 17B). Here, the portion shaped in an apex becomes the connecting portion for connection to the part to be measured.

In the case of this example, the plate 305 is plastered, but the probe card 200 may be also made only with the electrical connecting member without plastering of the plate 305.

Figure 17C:
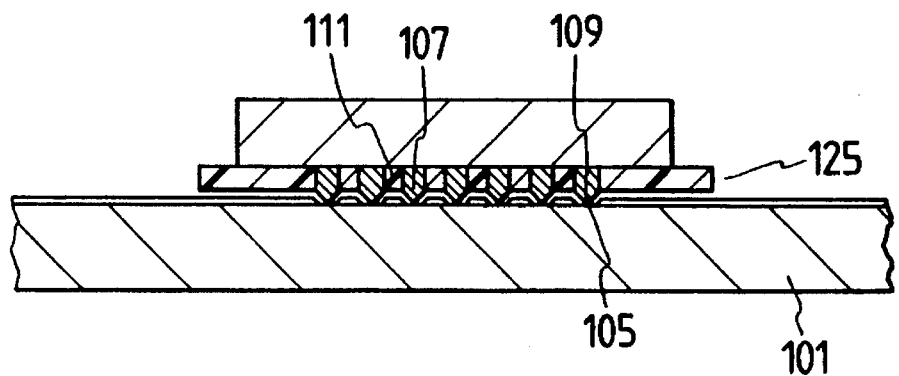

Next, the method for measuring the electrical characteristics of the part to be measured with the probe card 200 prepared as described above is to be described by referring to FIG. 17C.

In this example, a semiconductor element 101 is prepared as the part to be measured. The semiconductor element 101 has connecting portions arranged at a pitch of 40 μm.

Registration is effected so that the connecting portion 105 of the semiconductor element 101 may correspond to the connecting portion 109 of the electrical connecting member 125, and after registration, the connecting portion 105 of the semiconductor element (in this example, comprising Al) is connected electrically to the connecting portion 109 of the electrical connecting member 125 (FIG. 17C), and the electrical characteristics are measured. Connection in this case is temporary, and detachable after completion of the measurement.

When measurement is conducted repeatedly while repeating detachment of the semiconductor element 101 to the probe card, abrasion of the electroconductive portion material is found to be little. Also, measurement of electrical characteristics can be done very correctly.

(EXAMPLE 8)

Figure 19:
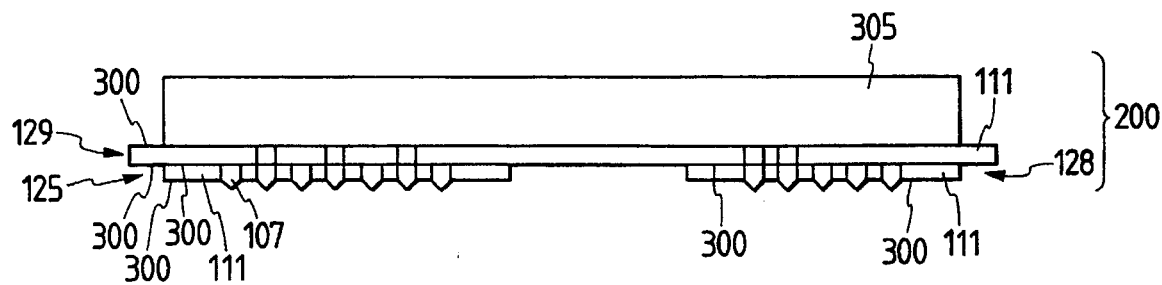
FIG. 19 is a sectional view showing an eighth example of the present invention.

FIG. 19 shows the eighth example.

The eighth example is a probe card plastered with a plate for reinforcement, which comprises three sheets of electrical connecting members having wiring patterns on both surfaces laminated on one another, each being metallized and/or subjected to alloy formation (brazed in this example) for connection. Also, the present probe card is a probe card capable of measuring two different semiconductor elements at the same time.

The method for preparing the electrical connecting members 125, 128 and 129 is the same as in the seventh example, but the electrical connecting member 129 is not made with the metal being not shaped in an apex, but one under the state shown in FIG. 18 is used. The points different from the seventh example are size of the electrical connecting member, arrangement and number of the metal wires 121, and the wiring pattern 300. Further, as the metal wires 121 of the electrical connecting members 125, 128, those comprising W applied with solder plating are used. As the metal wire 121 of the electrical connecting member 129, one comprising Cu applied with solder plating is used. The three sheets of electrical connecting members 125, 128, 129, after registration, are connected mutually at the connected portions by soldering.

The wiring pattern 300 has insulating film which exists except for the connecting portion, so that no conduction occurs when laminated. Further, the portions other than the connecting portion laminated are adhered with an adhesive.

In this example, plates 305 for reinforcement are plastered similarly as in the seventh example, to provide a probe card 200.

This example enables simultaneous measurement of two different semiconductor elements. More specifically, measurement of electrical characteristics is conducted by connecting electrically to the connecting portion of the semiconductor element 101 having respectively different apex portions of the electrical connecting members 125 and 128. Other points are the same as in the seventh example.

In this example, measurement is performed repeatedly while repeating detachment of the semiconductor element 101 to the probe card, but abrasion of the metal member is found to be little. Also, electrical characteristics can be measured very correctly.

(EXAMPLE 9)

FIG. 20 shows the probe card to be used in the ninth example.

Figure 20A:
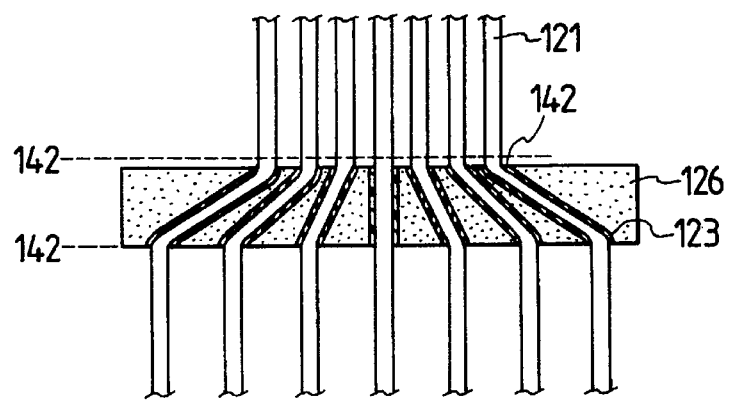
FIGS. 20A and 20B show a thirteenth example of the present invention, FIG. 20A showing a sectional view in the course of preparation, and FIG. 20B a sectional view.
Figure 20B:
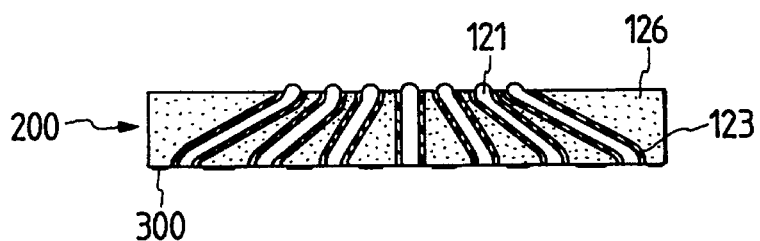

FIG. 20A is a sectional view in the course of preparation of the electrical connecting member, and FIG. 20B a sectional view of the above.

Previously, a holding member 126 comprising alumina ceramic is bored with a hole 142 with a diameter larger than 20 μmφ. Next, through the hole 142 is passed a metal wire 121 comprising a metal such as Au or a metal alloy of 20 μmφ in diameter, and a resin 123 is placed in between the holding member 126 and the metal wire 121, followed by curing of the resin 123. The cured resin 123 becomes an intervening matter. Then, the metal wire 121 is sliced at the position of the dotted line 124 to prepare an electrical connecting member 125.

Also, the electrical connecting member of this example may be provided with a projection as shown in FIG. 18 by applying working to change the cutting position of the metal wire 121, etc., or a projection shaped in an apex form may be formed.

Then, the wiring pattern 300 is provided to give a probe card 200.

Other points are the same as in the seventh example.

Also in this example, measurement of electrical characteristics can be done very correctly. Further, reliability of various characteristics is also excellent.

(EXAMPLE 10)

Figure 21:
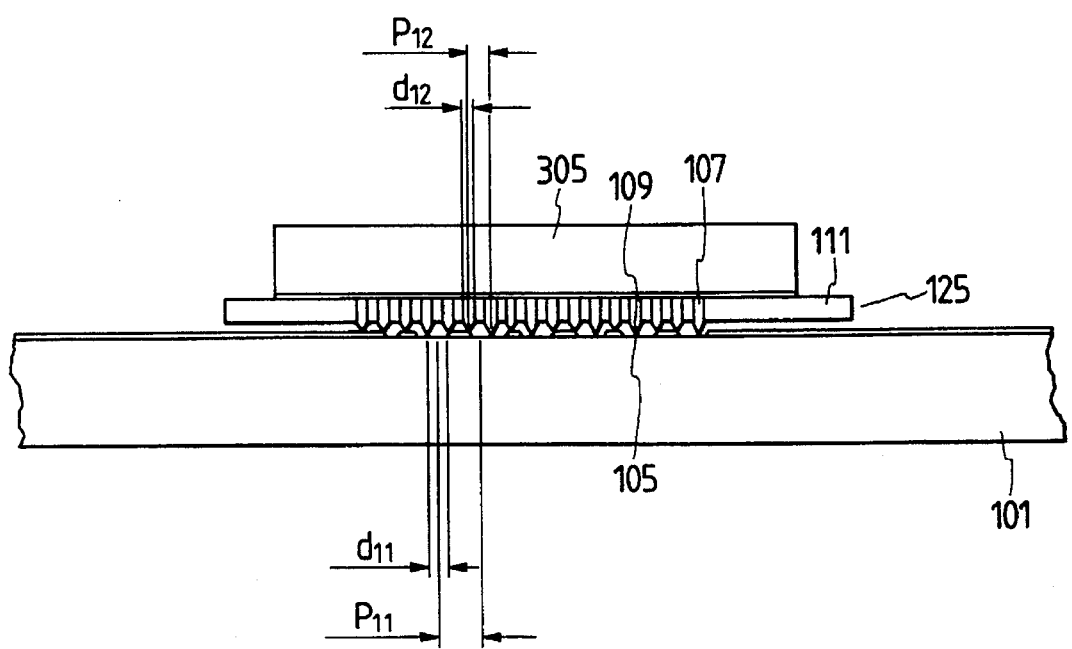
FIG. 21 is a sectional view showing a tenth example of the present invention.

FIG. 21 shows the tenth example.

In this example, the electrical connecting member 125 is different from the electrical connecting member shown in the seventh example. More specifically, the electrical connecting member 125 is narrower in pitch mutually between the metal members 107 than that shown in the seventh example. Also, in this example, the pitch mutually between the metal members 107 is set at an interval narrower than the interval between the connecting portions 105 of the semiconductor element 101 which is the part to be measured.

In short, in the seventh example, correct registration between the semiconductor element 101 and the electrical connecting member 125 is required during measurement with the probe card, but in this example, by selecting the connecting dimensions of the semiconductor element ($P_{11}$, $d_{11}$) and the connecting dimensions of the electrical connecting member ($P_{12}$, $d_{12}$) at suitable values, connection may be also possible with substantially correct registration.

Other points are the same as in the seventh example.

Also in this example, measurement of electrical characteristics can be done very correctly.

By constituting the probe card as shown in the seventh example to the tenth example, various effects as mentioned below can be obtained.

(1) Since probing is possible regardless of where the part to be measured, particularly the connecting portion of the semiconductor element may be placed (particularly internally), it has become possible to perform probing of a semiconductor element having more connecting points than the wire bonding system, TAB system of the prior art, whereby a probe card suited for multiple pin number can be provided. Also, for the above reason, multi-chip simultaneous probing of semiconductor elements is rendered possible. Further, due to the presence of an insulating substance between adjacent metals of the electrical connecting member, there is no electrical conduction between the adjacent electroconductive members even when the adjacent pitch may be made narrower, whereby it has become possible to effect probing of a semiconductor element with further increased multiple points than in the CCB system.

(2) Since the electrical connecting members can be produced with high density multiple pins, easily and at low cost, it has been rendered possible to provide a probe card suited for high density multiple pins inexpensively and easily.

(3) Because the plural number of electroconductive members of the electrical connecting member exposed in the vicinity of the material to be measured have substantially the same shape, the force applied on the connecting portion of the material to be measured becomes substantially the same, whereby a probe card capable of measuring stably without giving a damage to the material to be measured can be obtained. Further, since the tip end of the electroconductive member can be arranged easily at a desired position, it has become possible to prepare a probe card at low cost.

(4) By making the thickness of the electrical connecting member thinner, electrical resistance becomes smaller, and further floating capacity and noise from external world can be reduced. This is advantageous in measuring the electrical characteristics of the part to be measured such as semiconductor element, etc.

(5) Even when the tip end of the electroconductive member of the electrical connecting member may be abraded, reproduction is possible and therefore a probe card enriched in durability can be obtained.

(6) The electrical connecting members of the probe card can be exchanged easily.

(7) The electrical connecting member can be connected more surely to the part to be measured, and also measurement can be done better.

(8) During preparation steps, it is not necessary to mount the respective electrical members by holding individually by use of implements, etc., and therefore it has become possible to simplify the steps and shorten the preparation time. (9) Connection between the electrical connecting member and the part to be measured can be more surely effected.

(10) Registration during measurement has become easier, and also substantially the same semiconductor can be measured with the same probe card, and further a plurality of semiconductor elements, etc. can be easily measured, whereby measuring working can be effected more efficiently.

(11) By constituting a laminated electrical connecting member, it has become possible to measure electrical characteristics of a plural number of semiconductor elements at the same time. By this, measurement working can be simplified and become more efficient.

(12) Connection mutually between electrical connecting members can be effected by metallization and/or alloy formation, whereby it has become possible to reduce remarkably electrical badness and contact resistance, and also to obtain a firm probe card with strong mechanical strength. Further, by this, management and handling after preparation become easier, and further simplification and higher efficiency of the measuring working are rendered possible.

For the embodiments of the present invention, the following effects are obtained.

(1) By selecting a material which can reduce noise for the insulator of the electrical connecting member, electromagnetic noise and noise from the external world can be reduced, whereby a probe card having excellent characteristics can be obtained.

(2) By selecting a material with good thermal conductivity for the insulator of the electrical connecting member, it has become possible to permit the heat generated from the semiconductor during measurement to escape rapidly.

(3) By setting the pitch mutually between the metal members of the electrical connecting member at an interval narrower than the interval between the connecting portions of the part to be measured such as the semiconductor element, connection can be done with substantially correct registration, whereby simplification and higher efficiency of the measurement working are rendered possible.

(EXAMPLE 11)

The eleventh example of the present invention is described by referring to FIGS. 22A to 22C and FIGS. 9A to 9C.

The probe card according to the present invention has an electrical connecting member 125 and a vibrator 252 for vibrating a metal member 107 exposed on the side of the part to be measured of the holding member. The electrical connecting member 125 has a holding member 111 comprising an electrically insulating material of an organic material and a metal member 107 embedded in the holding member 111, with one end of the metal member 107 being exposed at one surface of the holding member 111, while the other end of the metal member 107 exposed at the other surface of the holding member, and also has a wiring pattern 300.

The preparation example of the electrical connecting member 125 constituting the probe card according to this example is the same as shown in FIGS. 9A to 9C as described in the first example, and its detailed description is omitted.

For making the wiring pattern 300 on the electrical connecting member 125 prepared as shown in FIGS. 9A to 9C on the electrical connecting member 125, copper is attached by vapor deposition or the sputtering method, unnecessary portions are patterned by etching and further gold plating is attached. The electrical connecting member thus prepared is shown in FIG. 18. For formation of the wiring pattern, it has been described that gold plating is attached after patterning by vapor deposition of copper, but any other method than this method may be used.

The electrical connecting member 125 has wiring patterns 300 on both surfaces of the holding member 111.

Figure 22A:
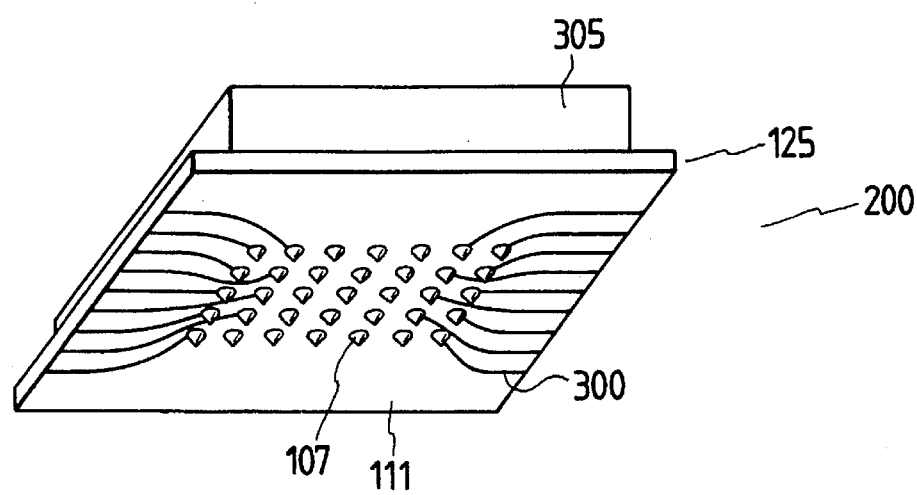
FIGS. 22A to 22C show an eleventh example of the present invention, FIG. 22A showing a perspective view, FIGS. 22B, 22C sectional views.
Figure 22B:
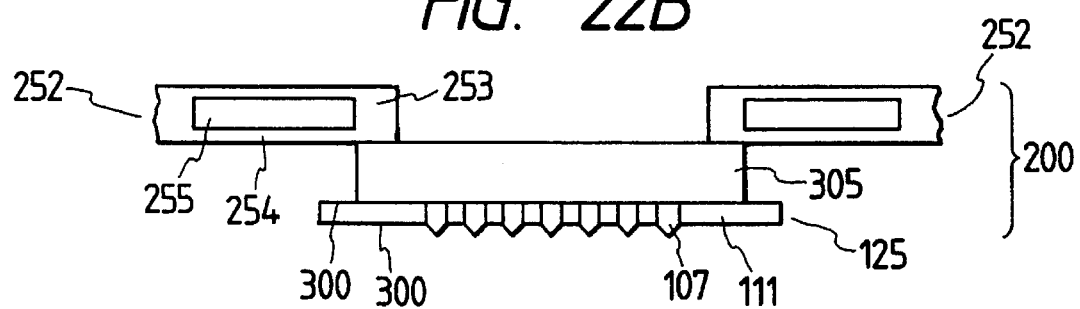
Figure 22C:
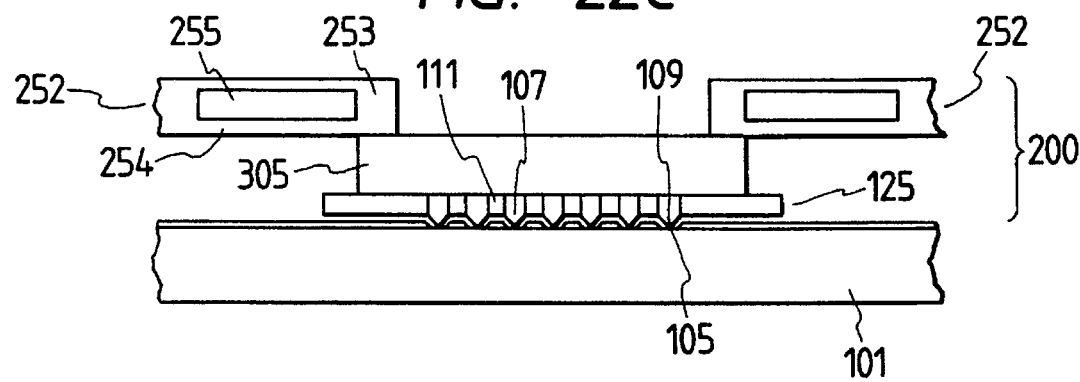

Further, on the surfaces on the side where the electrical connecting portion of the metal member 107 is made in the shape of an apex and on the opposite side, plates 305 for reinforcement are plastered to provide a probe card 200 (FIGS. 22A, 22B). Here, the portion shaped in an apex becomes the connecting portion for connection to the part to be measured.

In the case of this example, the plate 305 is plastered, but the probe card 200 may be also made only with the electrical connecting member without plastering of the plate 305.

Then, the other end of the bimorph piezoelectric element 252 is fixed externally of the plate 305 to provide a probe card 200 (FIG. 22B).

The bimorph piezoelectric element 252 in this example has a structure comprising piezoelectric ceramic plates 255 plastered on the both surfaces of the elastic shim plate 254. The piezoelectric ceramic plate 255 on the back of the elastic shim plate 254 cannot be seen.

The exposed portions of a plurality of the metal members 107 of the electrical connecting member 125 of the probe card 200 prepared according to such method are brought into contact with the connecting portions 105 of the semiconductor element 101.

Then, the bimorph piezoeletric element 252 is vibrated on the drawing in the direction substantially perpendicular to the paper surface. Vibration is transmitted to the plate 305, the electrical connecting member 125, whereby a plurality of the metal members 107 on the semiconductor element side are vibrated to destroy the surface oxide of Al at the connecting portions 105 of the semiconductor 101. By this, the contact resistance between the metal members 107 of the electrical connecting member 125 and the connecting portions 105 of the semiconductor element 101 becomes smaller. Then, vibration is stopped and the semiconductor element 101 is electrically measured.

Also, in the case of this example, the bimorph piezoelectric element 252 is used, but any material capable of vibration may be used.

Next, the method for measuring the electrical characteristics of the part to be measured with the probe card 200 prepared as described above is to be described by referring to FIG. 17C.

In this example, a semiconductor element 101 is prepared as the part to be measured. The semiconductor element 101 has connecting portions arranged at a pitch of 40 μm.

Registration is effected so that the connecting portion 105 of the semiconductor element 101 may correspond to the connecting portion 109 of the electrical connecting member 125, and after registration, the connecting portion 105 of the semiconductor element (in this example, comprising Al) is connected electrically to the connecting portion 109 of the electrical connecting member 125 (FIG. 22C), and the electrical characteristics are measured. Connection in this case is temporary, and detachable after completion of the measurement.

In this example, when measurement is conducted repeatedly while repeating detachment of the semiconductor element 101 to the probe card, abrasion of the electroconductive portion material is found to be little. Also, measurement of electrical characteristics can be done very correctly.

(EXAMPLE 12)

FIG. 23 shows the twelfth example.

The twelfth example is a probe card plastered with a plate for reinforcement, which comprises three sheets of electrical connecting members having wiring patterns on both surfaces laminated on one another, each being metallized and/or subjected to alloy formation (brazed in this example) for connection. Also, the present probe card is a probe card capable of measuring two different semiconductor elements at the same time.

The method for preparing the electrical connecting members 125, 128 and 129 is the same as in the eleventh example, but the electrical connecting member 129 is not made with the metal being not shaped in an apex, but one under the state shown in FIG. 18 is used. The points different from the eleventh example are size of the electrical connecting member, arrangement and number of the metal wires 121, and the wiring pattern 300. Further, as the metal wires 121 of electrical connecting members 125, 128, those comprising W applied with solder plating are used. As the metal wire 121 of the electrical connecting member 129, one comprising Cu applied with solder plating is used. The three sheets of electrical connecting members 125, 128, 129, after registration, are connected mutually at the connected portions by soldering.

The wiring pattern 300 has insulating film which exists except for the connecting portion, so that no conduction occurs when laminated. Further, the portions other than the connecting portion laminated are adhered with an adhesive.

In this example, plates 305 for reinforcement are plastered similarly as in the eleventh example, to provide a probe card 200.

Further, in this example, the position at which the vibrator is mounted and the vibration direction are different from those Shown in the eleventh example. That is, in this example, the vibrator is mounted at both of the probe card 200 and the vicinity of the semiconductor element 101.

The piezoelectric element 261 mounted at the probe card 200 is mounted on the plate 305, and further fixed and supported externally. The vibration direction is vertical relative to the paper surface. Accordingly, the metal members 107 on the semiconductor element 101 side are also vibrated in the vertical direction relative to the paper surface.

At least a part of the bimorph piezoelectric elements 262 mounted in the vicinity of the semiconductor element 101 is mounted on the support to be fixed and supported thereon. On the support 263, the semiconductor element 101 is fixed and supported by way of suction, etc. The vibrating direction of the bimorph piezoelectric element 162 is vertical relative to the paper surface to vibrate the support 263 and also vibrate the connecting portion 105 of the semiconductor element 101.

This example enables simultaneous measurement of two different semiconductor elements. More specifically, measurement of electrical characteristics is conducted by connecting electrically to the connecting portion of the semiconductor element 101 having respectively different apex portions of the electrical connecting members 125 and 128. Also, the piezoelectric element 261 may be adhered directly to the electrical connecting member 129 or laminated together with the electrical connecting member. Other points are the same as in the eleventh example.

In this example, measurement is performed repeatedly while repeating detachment of the semiconductor element 101 to the probe card, but abrasion of the metal member is found to be little. Also, electrical characteristics can be measured very correctly.

(EXAMPLE 13)

FIG. 20 shows the probe card to be used in the thirteenth example.

FIG. 20A is a sectional view in the course of preparation of the electrical connecting member, and 20B a sectional view of the above.

Previously, a holding member 125 comprising alumina ceramic is bored with a hole 142 with a diameter larger than 20 μmφ. Next, through the hole 142 is passed a metal wire 121 comprising a metal such as Au or a metal alloy of 20 μmφ in diameter, and a resin 123 is placed in between the holding member 126 and the metal wire 121, followed by curing of the resin 123. The cured resin 123 becomes an intervening matter. Then, the metal wire 121 is sliced at the position of the dotted line 124 to prepare an electrical connecting member 125.

Also, the electrical connecting member of this example may be provided with a projection as shown in FIG. 18 by applying working to change the cutting position of the metal wire 121, etc., or a projection shaped in an apex form may be formed.

Then, the wiring pattern 300 is provided to give a probe card 200.

Other points are the same as in the eleventh example.

Also in this example, measurement of electrical characteristics can be done very correctly. Further, reliability of various characteristics is also excellent.

(EXAMPLE 14)

FIG. 24 shows the fourteenth example.

In this example, the electrical connecting member 125 is different from the electrical connecting member shown in the eleventh example. More specifically, the electrical connecting member 125 is narrower in pitch mutually between the metal members 107 than that shown in the eleventh example. Also, in this example, the pitch mutually between the metal members 107 is set at an interval narrower than the interval between the connecting portions 105 of the semiconductor element 101 which is the part to be measured.

In short, in the eleventh example, correct registration between the semiconductor element 101 and the electrical connecting member 125 is required during measurement with the probe card, but in this example, by selecting the connecting dimensions of the semiconductor element ($P_{11}$, $d_{11}$) and the connecting dimensions of the electrical connecting member ($P_{12}$, $d_{12}$) at suitable values, connection may be also possible with substantially correct registration.

Other points are the same as in the eleventh example.

Also in this example, measurement of electrical characteristics can be done very correctly.

By constituting the probe card as shown in the eleventh example to the fourteenth example, various effects as mentioned below can be obtained.

Since probing is possible regardless of where the part to be measured, particularly the connecting portion of the semiconductor element may be placed (particularly internally), it has become possible to perform probing of a semiconductor element having more connecting points than the wire bonding system, TAB system of the prior art, whereby a probe card suited for multiple pin number can be provided. Also, for the above reason, multi-chip simultaneous probing of semiconductor elements is rendered possible. Further, due to the presence of an insulating substance between adjacent metals of the electrical connecting member, there is no electrical conduction between the adjacent electroconductive members even when the adjacent pitch may be made narrower, whereby it has become possible to effect probing of a semiconductor element with further increased multiple points than in the CCB system.

Since the electrical connecting members can be produced with high density multiple pins, easily and at low cost, it has been rendered possible to provide a probe card suited for high density multiple pins inexpensively and easily.

Because the plural number of electroconductive members of the electrical connecting member exposed in the vicinity of the material to be measured have substantially the same shape, the force applied on the connecting portion of the material to be measured becomes substantially the same, whereby a probe card capable of measuring stably without giving a damage to the material to be measured can be obtained. Further, since the tip end of the electroconductive member can be arranged easily at a desired position, it has become possible to prepare a probe card at low cost.

By making the thickness of the electrical connecting member thinner, electrical resistance becomes smaller, and further floating capacity and noise from external world can be reduced. This is advantageous in measuring the electrical characteristics of the part to be measured such as semiconductor element, etc.

Even when the tip end of the electroconductive member of the electrical connecting member may be abraded, reproduction is possible and therefore a probe card enriched in durability can be obtained.

The electrical connecting members of the probe card can be exchanged easily.

The electrical connecting member can be connected more surely to the part to be measured, and also measurement can be done better.

During preparation steps, it is not necessary to mount the respective electrical members by holding individually by use of implements, etc., and therefore it has become possible to simplify the steps and shorten the preparation time.

By vibrating the plurality of metal members contacted with the connecting portions of the part to be measured relatively, the surface oxide film formed on the plurality of metal members and/or the part to be measured can be destroyed, and also the dust attached can be scattered, whereby it has become possible to make the contact resistance smaller. Further, by vibrating a plurality of electrical connecting members on the side of the part to be measured and/or the part to be measured at the time other than during contact, the dust attached can be scattered and the dust can be removed by way of suction, etc. By this, it has become possible to measure the electrical characteristics of a part to be measured such as semiconductor element, etc. better with higher reliability.

Connection between the electrical connecting member and the part to be measured can be more surely effected. Also, the effect of breaking the surface oxide film is enhanced to make further better measurement feasible.

Registration during measurement has become easier, and also substantially the same semiconductor can be measured with the same probe card, and further a plurality of semiconductor elements, etc. can be easily measured, whereby measuring working can be effected more efficiently.

By constituting a laminated electrical connecting member, it has become possible to measure electrical characteristics of a plural number of semiconductor elements at the same time. By this, measurement working can be simplified and become more efficient.

Connection mutually between electrical connecting members can be effected by metallization and/or alloy formation, whereby it has become possible to reduce remarkably electrical badness and contact resistance, and also to obtain a firm probe card with strong mechanical strength. Further, by this, management and handling after preparation become easier, and further simplification and higher efficiency of the measuring working are rendered possible.

For the embodiments of the present invention, the following effects are obtained.

(1) By selecting a material which can reduce noise for the insulator of the electrical connecting member, electromagnetic noise and noise from the external world can be reduced, whereby a probe card having excellent characteristics can be obtained.

(2) By selecting a material with good thermal conductivity for the insulator of the electrical connecting member, it has become possible to permit the heat generated from the semiconductor during measurement to escape rapidly.

(3) By setting the pitch mutually between the metal members of the electrical connecting member at an interval narrower than the interval between the connecting portion of the part to be measured such as the semiconductor element, connection can be done with substantially correct registration, whereby simplification and higher efficiency of the measurement working are rendered possible.

(EXAMPLE 15)

The fifteenth example of the present invention is described by referring to FIG. 25 and FIG. 9.

A preparation example is shown in FIG. 9. First, the electrical connecting member 125 is described by referring to a preparation example of the electrical connecting member 125.

FIGS. 9A to 9C show a preparation example.

First, as shown in FIG. 9A, a metal wire 121 comprising a metal such as Au or an alloy with a diameter of 20 µmφ is wound around a rod 122 with a pitch of 40 µm, and after winding, the above metal wire 121 is embedded in a resin 123 such as of polyimide. After embedding, the above resin 123 is cured. The cured resin 123 becomes an insulator. Then, it is sliced to prepare an electrical connecting member 125. The electrical connecting member 125 thus prepared is shown in FIGS. 9B and 9C.

Then, for making a wiring pattern 300 on the electrical connecting member 125, copper is attached by vapor deposition or the sputtering method, and patterning is effected by etching of the copper at unnecessary portions, followed further by attachment of gold plating.

The electrical connecting member 125 thus prepared is shown in FIG. 9D. It has been described that copper for patterning is attached, etched and gold plating is attached, but patterning may be effected by use of other methods than this method.

The electrical connecting member 125 has wiring patterns 300 on both surfaces of the holding member 111.

In the thus prepared electrical connecting member 125, the metal wire 121 constitutes the metal member 107, and the resin 123 constitutes the holding member (insulator) 111.

In the electrical connecting member 125, the metal wires 121 which become the metal member are mutually insulated electrically from each other with the resin 123. Also, one end of the metal wire 121 is exposed on the circuit substrate 104 side. The one end exposed becomes the connecting portion 108 of the semiconductor element 101.

Figure 25A:
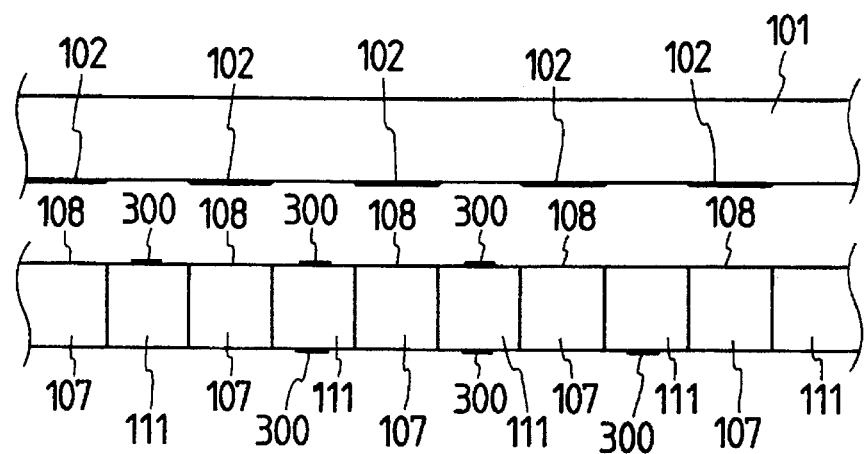
FIGS. 25A, 25B, 25C, 25D, 25E, 25F and 25G are sectional views showing Example 15, FIG. 25A showing the state before connection, FIG. 25B after connection, and FIGS. 25C, FIG. 25D, FIG. 25E, FIG. 25F, FIG. 25G the states after encapsulation.

Next, as shown in FIG. 25A, a semiconductor element 101 and an electrical connecting member 125 are prepared. The semiconductor element 101 to be used in the present invention has internally a large number of connecting portions 102.

The connecting portion 102 has a metal exposed at the position corresponding to the connecting portion 108 of the electrical connecting member 125.

Figure 25B:
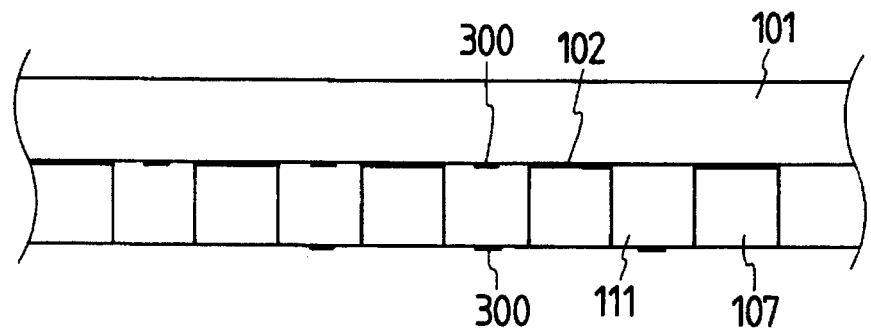

Registration is effected so that the connecting portion 102 of the semiconductor element 101 may correspond to the connecting portion 108 of the electrical connecting member 125, and after registration, Al of the connecting portion 102 of the semiconductor element 101 and Au of the connecting portion 108 of the electrical connecting member 125 are connected by metallization and/or alloy formation (FIG. 25B).

Figure 25C:
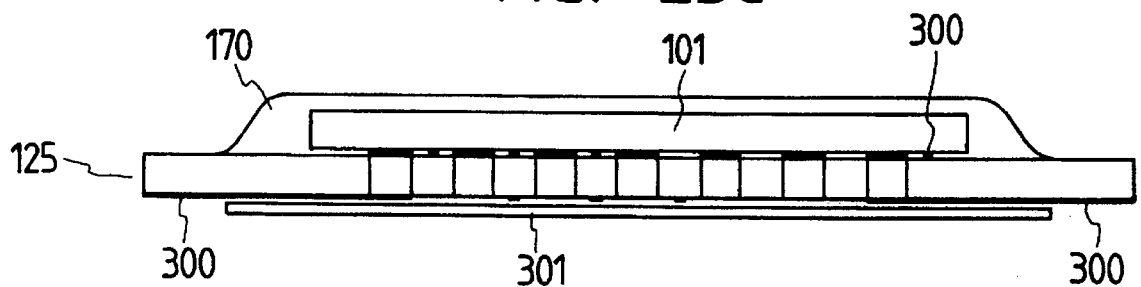

Next, the electrical circuit part of the member as prepared above (electrical circuit member) is encapsulated (FIG. 25C). In this example, the semiconductor element 101 is encapsulated. As the encapsulating material 170, a thermoplastic resin formulated with powder comprising $SiO_2$ is used, and as the encapsulation method, the dropwise addition method is used.

Further, an insulating sheet 301 is plastered on the surface of the electrical connecting member 125 opposite to that where the semiconductor element 101 is connected for the purpose of effecting electrical insulation.

FIGS. 25D to 25G show another encapsulation method.

Figure 25D:
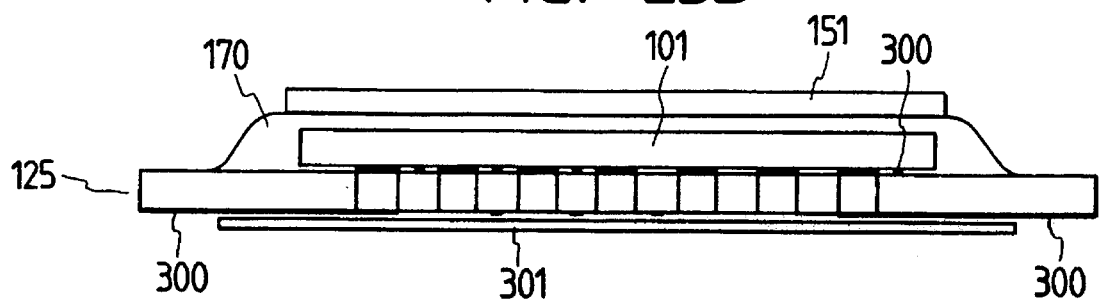
Figure 25E:
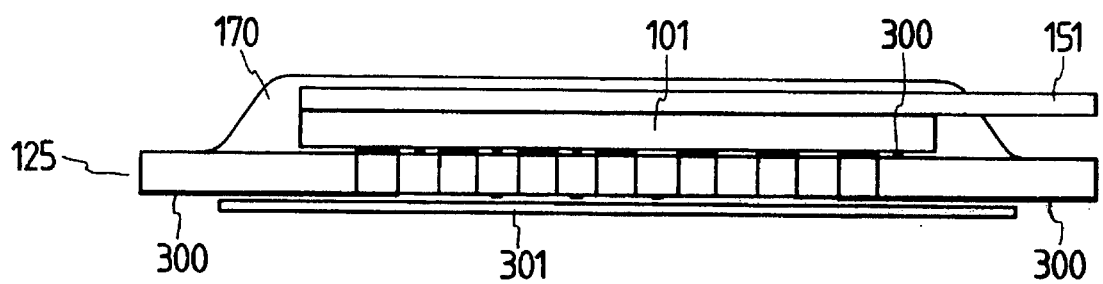
Figure 25F:
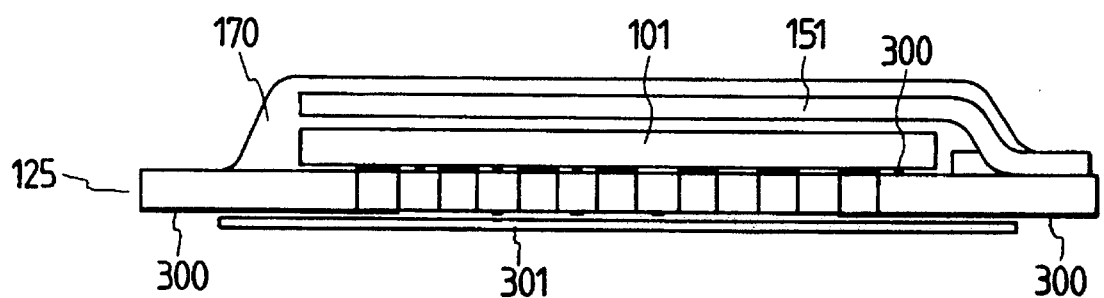
Figure 25G:
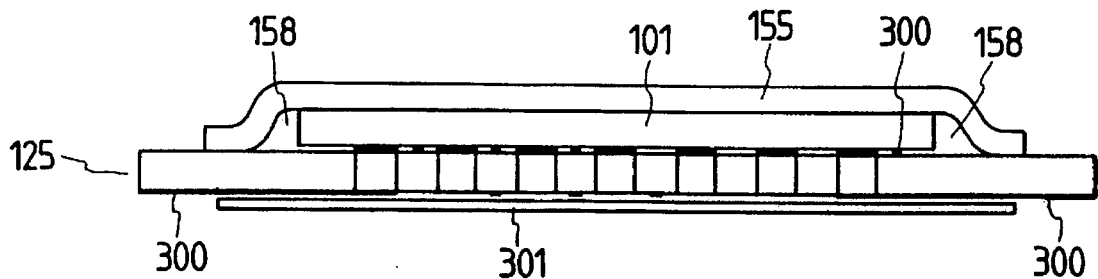

FIG. 25D shows an example in which a plate 151 is bonded onto the encapsulating material 170 in FIG. 25C, and FIG. 25E an example in which the plate 151 is bonded to the semiconductor 101 on the opposite side to the electrical connecting member before encapsulation with the encapsulating material 170, FIG. 25F an example in which the plate 151 is arranged in the vicinity of the semiconductor element 101 and encapsulated with the encapsulating material 170, and FIG. 25G an example in which cap encapsulation is effected with a cap 155, which has a hollow portion 158.

For the electrical circuit member prepared as described above, connectability of the connecting portions thereof is examined. As the result, connection is found to be effected with high reliability.

Further, reliability of various characteristics is also excellent.

(EXAMPLE 16)

Figure 26A:
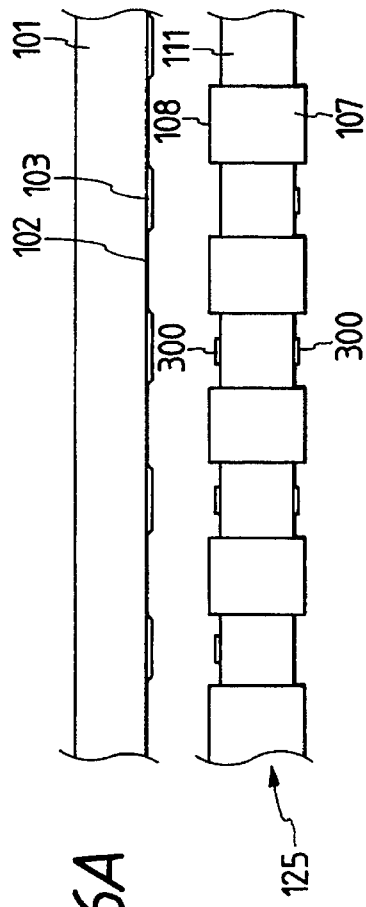
FIGS. 26A and 26B show Example 16, FIG. 26A being a sectional view showing the state before connection, FIG. 26B a sectional view showing the state after connection.
Figure 26B:
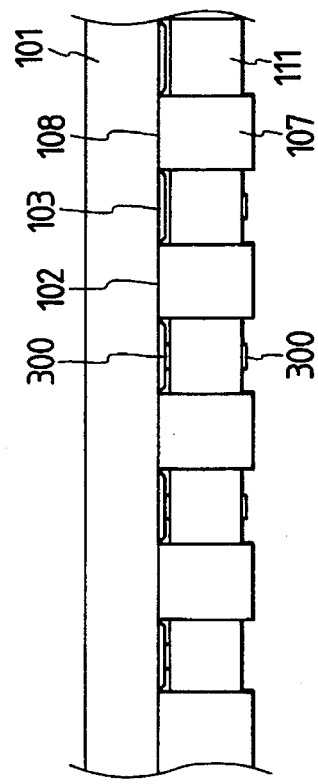

FIG. 26 shows Example 16.

This example is an example in which a semiconductor element 101 covered with an insulating film 103 at the portions other than the connecting portion 102 is used as the electrical circuit part.

As the electrical connecting member 125, one shown in FIG. 18 having a wiring pattern formed on the surface is used.

Such electrical connecting member 125 can be prepared according to the same method as described in the first example shown in FIG. 9.

In the present example, the amount of the metal wire 121 is made 10 µm, but any amount may be used.

As the method for having the metal wire 121 protruded, etching is not limitative, but any other chemical method or mechanical method may be employed.

Then, wiring patterns are provided on both surfaces of the holding member 111 to prepare an electrical connecting member 125.

The protruded portion may be also modified by having the electrical connecting member 125 sandwiched between a mold having a concavity at the position of the metal wire 121 and collapsing the projection 126 of the metal wire 121, thereby forming a bump 150. In this case, the metal wire 121 will be dropped off from the insulator 111 with difficulty.

Also, in this example, the metal wire 121 constitutes the metal member 107 and, further, the resin 123 constitutes the insulator 111.

For preparation of the bump, projection may be melted to form a bump, or any other method may be employed.

Also in this example, the connecting portion is found to be connected with high reliability.

Further, reliability of various characteristics is also excellent.

(EXAMPLE 17)

Figure 27:
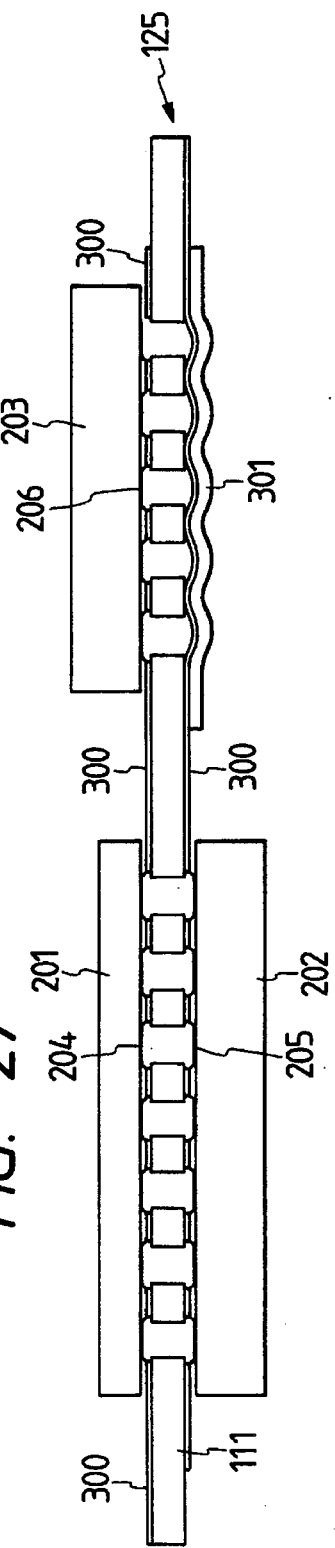
FIG. 27 is a sectional view showing Example 17.

FIG. 27 shows Example 17.

Example 17 comprises three semiconductors connected to the electrical connecting member 125.

The electrical connecting member 125 has the metal wire 121 protruded from the holding member shown in Example 16. The points different from Example 16 are arrangement and number of the metal wires 121, the wiring pattern and further formulation of powder comprising $SiO_2$ in the holding member.

In this example, the semiconductor elements 201, 202, 203 are connected to the electrical connecting member 125. The connecting portions 204, 205 of the semiconductor elements 201, 202 are connected to the connecting portions of the electrical connecting member 125 through metallization and/or alloy formation according to the thermal pressure adhesion method, and the connecting portion 206 of the semiconductor element 203 is connected to the connecting portion of the electrical connecting member 125 under pressurization.

Further, on the surface of the electrical connecting member 125 opposite to the semiconductor element 203, an insulating sheet 301 is secured by adhesion for electrical insulation.

Other points are the same as in Example 16.

Also in this example, the connecting portions are found to be connected with high reliability.

Further, reliability of various characteristics is excellent.

(EXAMPLE 18)

FIG. 28 shows the electrical connecting member 125 used in Example 18.

Figure 28A:
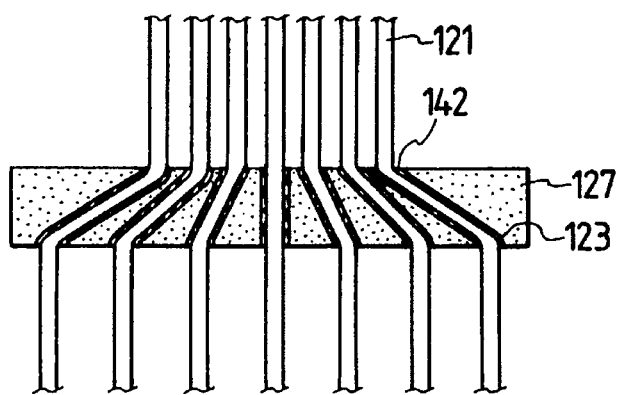
FIGS. 28A to 28D show a preparation example of the electrical connecting member according to Example 18, FIGS. 28A, 28C showing sectional views, FIGS. 28B, 28D perspective views.
Figure 28B:
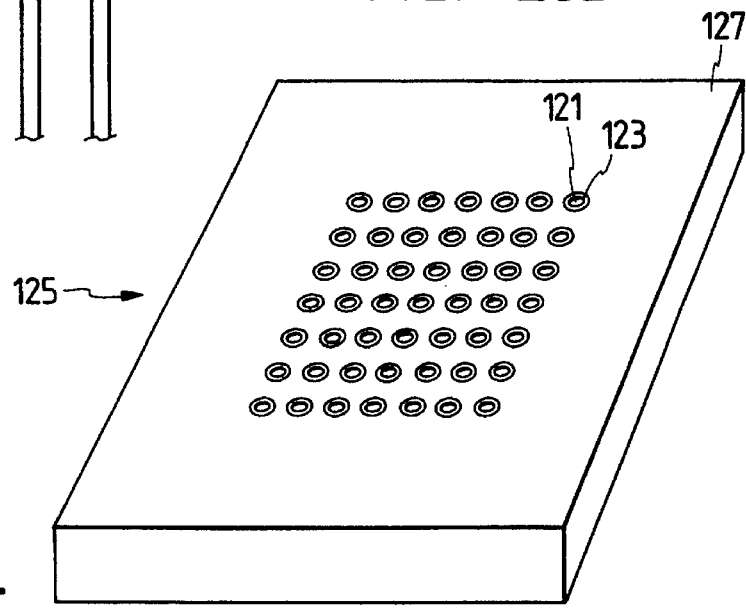
Figure 28C:
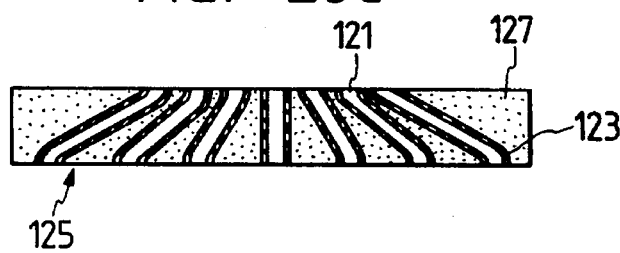

FIG. 28A is a sectional view in the course of preparation of the electrical connecting member, FIG. 28B a perspective view of the above electrical connecting member and FIG. 28C a sectional view of the above.

Previously, a holding member 127 comprising alumina ceramic is bored with a hole 142 having a diameter greater than 20 µmɸ. Then, a metal wire 121 comprising a metal such as Au, etc. or an alloy of 20 µmɸ is passed through the hole 142, and a resin 123 is placed in between the holding member 126 and the metal wire 121, followed by curing of the resin 123. The cured resin 123 becomes the intervening matter. Thereafter, the metal wire 121 is sliced at the position of the dotted line 124 to prepare an electrical connecting member 125. The electrical connecting member 125 thus prepared is shown in FIG. 28B, 28C.

Figure 28D:
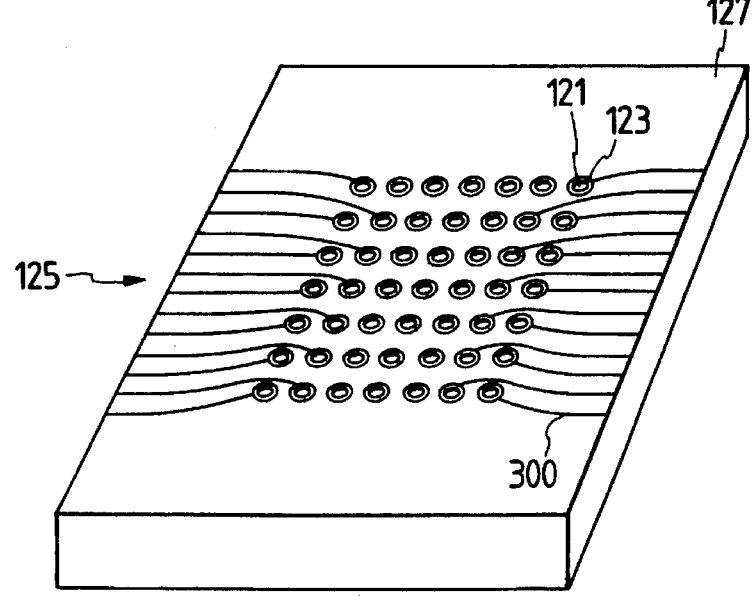

Further, the drawing having the wiring patterns 300 provided on both surfaces of the holding member is shown in FIG. 28D.

Also, the electrical connecting member of this example may be worked to provide a projection or a bump.

Other points are the same as in Example 15.

Also in this example, the connecting portions are found to be connected with high reliability.

Further, reliability of various characteristics is excellent.

(EXAMPLE 19)

Figure 29A:
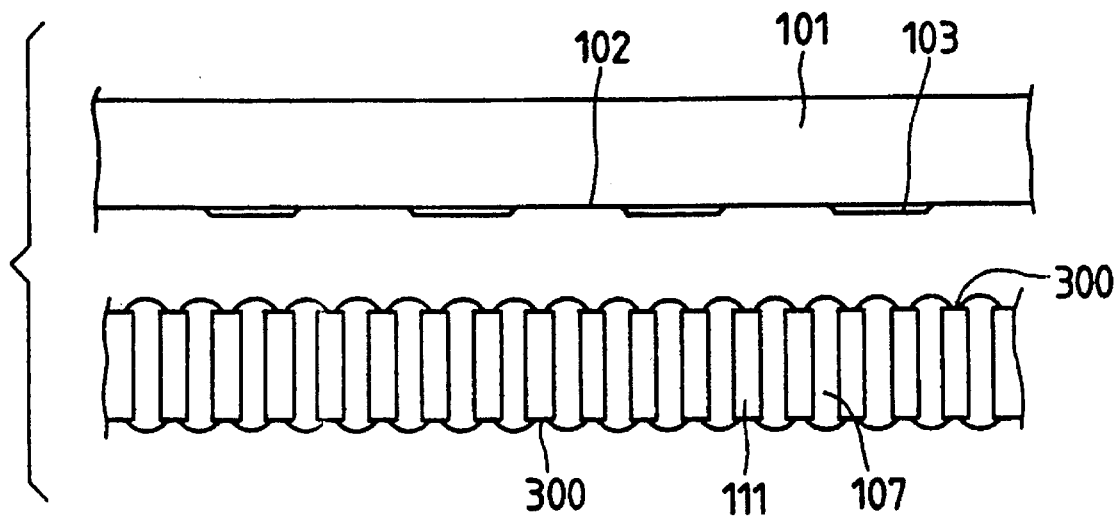
FIGS. 29A and 29B show Example 19, FIG. 29A being a sectional view showing the state before connection, and FIG. 29B a sectional view showing the state after connection.
Figure 29B:
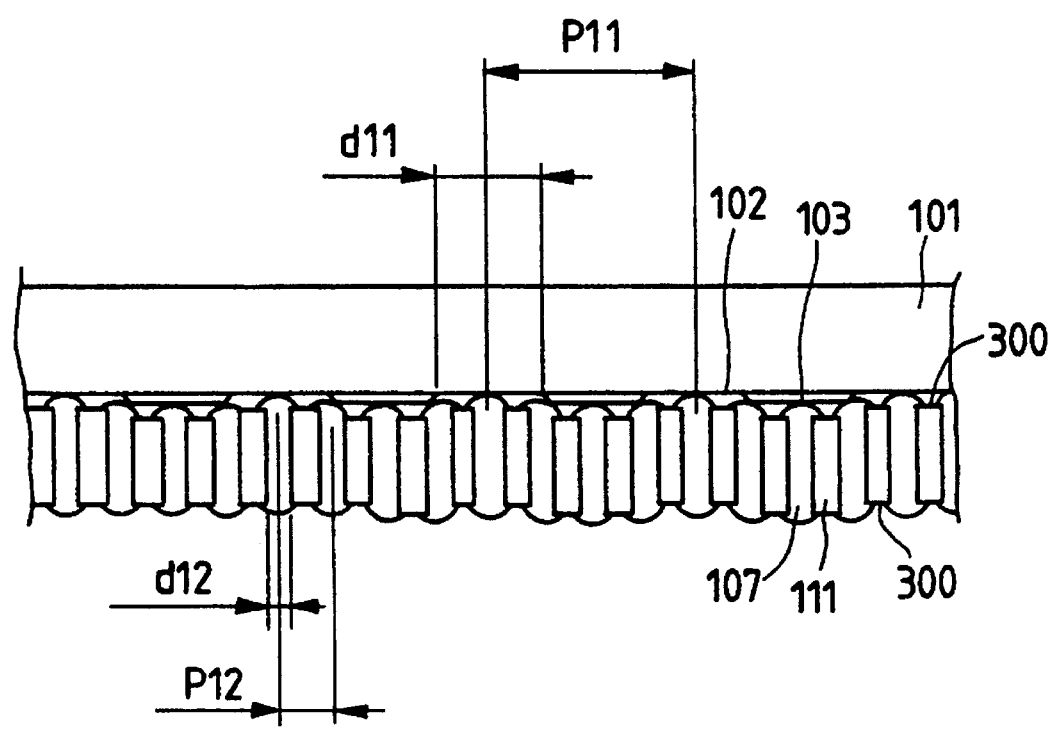

FIG. 29 shows Example 19.

In this example, the electrical connecting member 125 is different from that shown in Example 16. More specifically, in the electrical connecting member 125 of this example, the pitch mutually between metal members is narrower than that shown in Example 16. That is, in this example, the pitch is set at narrower intervals mutually between the metal members 107 than the intervals between the connecting portions of the semiconductor element 101.

In short, in Example 16, since the connecting position of the semiconductor element 101 and the electrical connecting member 125 is arranged, correct registration of the electrical connecting member 125 is required, but in this example, registration between the semiconductor element 101 and the electrical connecting member 125 need not be correct. For this reason, by selecting adequate values for the connecting dimensions of the semiconductor element 101 ($d_{11}$, $P_{11}$) and for the connecting dimensions of the electrical connecting member ($d_{12}$, $P_{12}$), connection may be also possible with substantially correct registration.

Other points are the same as in Example 16.

Also in this example, the connecting portions are found to be connected with high reliability.

Further, reliability of various characteristics is excellent.

As the result of constitution of the electrical circuit member as shown above in Examples 15 to 19, a number of effects shown below can be obtained.

(1) Concerning connection of semiconductor element with electrical circuit part such as circuit substrate, lead frame, etc., connection with high reliability can be obtained. Accordingly, it becomes possible to use it in place of the wire bonding system, the TAB system, the CCB system used in the prior art.

(2) According to the present invention, since the connecting portions of the electrical circuit part can be arranged at any desired position (particularly internally), more multi-point connections become possible than the wire bonding system, the TAB system, as suited for connection of multiple pins. Further, due to the presence of an insulating substance provided previously between adjacent metals of the electrical connecting member, no electrical conduction between the adjacent metals will occur even if the adjacent pitch may be made narrower, whereby more multi-point connection than the CCB system is rendered possible.

(3) Since the amount of the metal member used in the electrical connecting member is minute as compared with the prior art, the cost will be lower even if an expensive metal such as gold may be used for the metal member.

(4) An electrical circuit device such as high density semiconductor device, etc. can be obtained.

(5) Since the present invention has a wiring pattern on the holding member of the electrical connecting member, it is possible to prepare a circuit substrate of high density and yet low cost, whereby it becomes possible to connect an electrical circuit part, particularly a semiconductor element directly and yet easily to an electrical connecting member, reduce the number of steps and prepare an inexpensive semiconductor device.

The electrical connecting member has a plurality of metal members embedded in a holding member comprising an electrical insulating material, with the metal members being exposed on the both surfaces, and also has a wiring pattern on one or both surfaces, and therefore can prepare a high density and further inexpensive circuit substrate.

Since an electrical circuit part, above all a semiconductor element can be directly and yet easily connected to the electrical connecting member, the number of steps can be reduced to prepare a less expensive semiconductor device.

(1) When the electrical circuit part is connected to the electrical connecting member through metallization and/or alloy formation, the electrical circuit part can be connected firmly (with strong strength) and surely, whereby there can be obtained an electrical circuit member with a connection resistance of smaller value with its variance also being smaller, and further with strong mechanical strength and very low defective ratio.

(2) If the electrical circuit part is-connected to the electrical connecting member through metallization and/or alloy formation, during and after preparation of the electrical circuit member, it is not required to hold the electrical circuit member by use of an implement, etc., whereby management during and after preparation of the electrical circuit member is easier.

In the present invention, when encapsulated by use of an encapsulating material, the electrical connecting member is constituted of metal members embedded in the holding member, and therefore will be little affected by the encapsulation pressure, encapsulation rate, etc. when an encapsulation material is injected, and any encapsulation method may be available. In short, it has become possible to practice encapsulation according to the method by use of a thermoplastic resin unpracticeable in the prior art in which injection under very high pressure has been required.

In the present invention, when a plate is bonded to at least a part of at least one surface of the encapsulating material, if at least a part of of one or both of the plate or the electrical circuit part bonded to the surface opposite to the electrical connecting member of the celectical circuit part connected to the electrical connecting member is embedded, or at least a part of the plate arranged in the vicinity of one or a plurality of side surfaces is embedded with an encapsulating material, the stress concentration can be relaxed even when internal stress may be generated within the device or external force may be applied thereon, whereby cracks, etc. which may occur from stress concentration can be prevented. Also, the plate has the action of elongating the route from the external world to the electrical circuit part, whereby water, etc. from the outside will penetrate into the electrical circuit part with difficulty. Therefore, reliability of the device can be enhanced.

When the material of the plate is a metal such as stainless steel, etc., a material of good thermal conductivity such as ceramic, carbon, diamond, etc., the heat generated from the electrical circuit part can be dissipated rapidly to the external world, whereby an electrical circuit member with excellent heat dissipation characteristic can be obtained. Further, when the material of the plate is a metal, the noise from the external world can be shielded and therefore the influence from noise will be received with difficulty. Also, the electromagnetic noise generated from the electrical circuit part can be shielded, whereby an electrical circuit member with good characteristics can be obtained.

When cap encapsulation is effected in the present invention, the electrical circuit member is hollow and therefore generation of heat stress will be little even when heat may be applied, whereby an electrical circuit with high reliability can be obtained. Also, when the cap is contacted with the electrical circuit part and a material with good conductivity is used for the cap, the heat generated from the electrical circuit part is conducted to outside rapidly through the cap, and therefore an electrical circuit member with more excellent heat dissipating characteristic can be obtained. Further, when the cap consists of a material of good noise shielding characteristic, particularly a metal such as iron type, etc., an electrical circuit member with more excellent shielding effect can be obtained. When a member for control is interposed between the cap and the electrical circuit member, it becomes possible to assemble the parts with good efficiency even when there occurs variance in height of the electrical circuit parts.

In the present invention, when a material with thermal conductivity is used for the insulator of the electrical connecting member, when powder, fiber, plate, rod, sphere, etc. with good thermal conductivity is dispersed in the encapsulating material, heat generated from the electrical circuit part can escape more rapidly to the external world, whereby there can be obtained an electrical circuit member with good heat dissipatability. Also, when a material having a thermal expansion coefficient approximate to that of the electrical circuit part is used for the insulator of the electroconductive member, when one or both of powder, fiber, plate, rod, sphere, etc. is dispersed in the encapsulating material, the thermal expansion coefficient becomes approximate to the thermal expansion coefficient of the electrical circuit part, whereby the phenomenon of damaging reliability of electrical circuit member such as cracks of encapsulating material, electrical circuit part, or characteristic changes of the electrical circuit part which may occur when heat is applied can be avoided to give an electrical circuit member with high reliability.

If all of the electrical circuit parts are connected to the connecting layer formed by metallization and/or alloy formation through the electrical connecting member, contact resistance mutually between the electrical circuit parts becomes smaller as compared with the case when only one electrical circuit part is connected.

On the other hand, if at least one electrical circuit part is connected by way of other connections than connection by metallization and/or alloy formation, deterioration of the electrical circuit part which occurs during metallization and/or alloy formation can be prevented. Also, in some cases, the electrical circuit part is desired to be freely detachable depending on the use, and in such cases, the demand can be corresponded to if connection of the electrical circuit part is effected by way of connection other than metallization and/or alloy formation.

Further, by selecting a material with great shielding effect for the insulator, the electromagnetic generated from the electrical circuit part to the external world can be reduced, and also the noise entering from the external world into the electrical circuit part can be also reduced.

(EXAMPLE 20)

Example 20 of the present invention is described by referring to FIG. 30 and FIG. 9. 10 The electrical connecting member 125 used in this example is prepared according to the method shown in FIG. 9, and has a wiring pattern formed on its surface. Also, in this example, a semiconductor element 101 is encapsulated as the electrical circuit part.

Figure 30A:
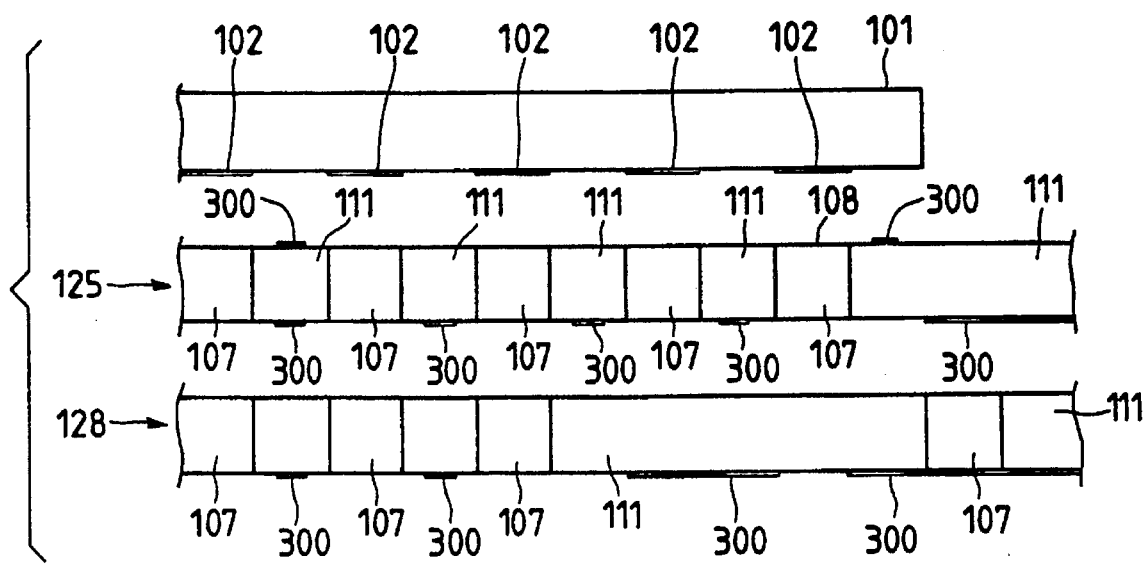
FIGS. 30A, 30B, 30C, 30D, 30E, 30F and 30G are sectional views showing Example 20, FIG. 30A showing the state before connection, FIG. 30B the state after connection, and FIGS. 30C, FIG. 30D, FIG. 30E, FIG. 30F, FIG. 30G the states after encapsulation.
Figure 30B:
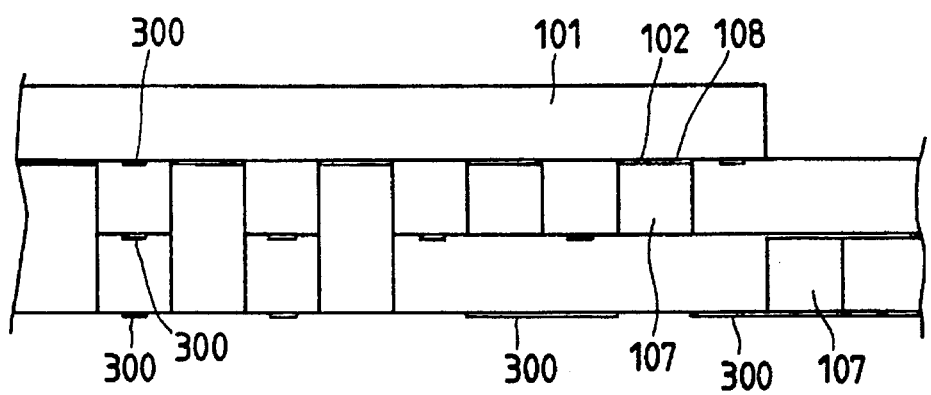
Figure 30C:
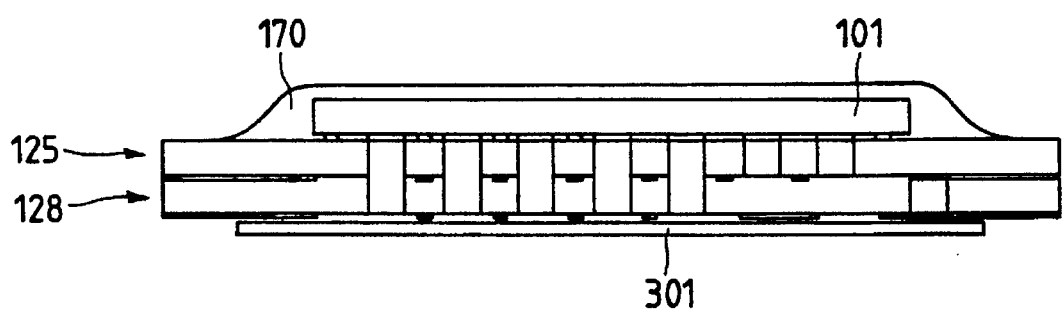
Figure 30D:
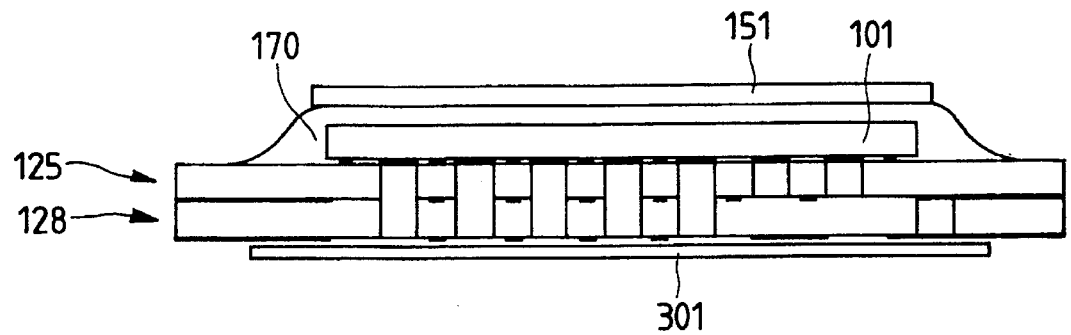

In this example, in addition to the electrical connecting member 125 shown in FIG. 30D, another electrical connecting member 128 is used. The process for preparing the electrical connecting member 128 is the same as that for preparing the electrical connecting member 125, except for the differences in arrangement and patterning of the metal member 107. Patterning is effected on one surface of the holding member 111 of the electrical connecting member 128, and the member has a wiring pattern on one surface.

Next, two sheets of electrical connecting members 125, 128 are prepared. Then, registration is effected so that the both connecting portions may correspond to each other, and the connecting portions are connected by effecting metallization and/or alloy formation by thermal pressurization.

It has been described that the thermal pressurization method is used for metallization and/or alloy formation, but the thermal pressurization method is not limitative, but other external heating method, the internal heating method may be also available.

In the electrical connecting members 125, 128, the metal wires 121 which become the metal members are mutually insulated electrically with the resin 123 excexpt for the wiring pattern. Also, one end of the metal wire 121 is exposed on the semiconductor element 101 sied. The exposed portion becomes the connecting portion 108 of the semiconductor element 101.

Next, as shown in FIG. 30A, the semiconductor element 101, the electrical connecting members 125, 128 are prepared. The semiconductor element 101 used in this example has a large number of connecting portions internally thereof.

The connecting portion 102 of the semiconductor element 101 has the metal exposed at the position corresponding to the connecting portion 108 of the electrical connecting member 125.

Registration is effected so that the connecting portion 102 of the semiconductor element 101 may correspond to the connecting portion of the electrical connecting member 125, and after registration, Al of the connecting portion 102 of the semiconductor element 101 and Au of the connecting portion 108 of the electrical connecting member 125 are subjected to metallization and/or alloy formation to effect connection (FIG. 30B).

Next, the electrical circuit part of the member prepared as described above (electrical circuit member) is encapsulated (FIG. 30C). In this example, the semiconductor element 101 is encapsulated. As the encapsulating material 170, a thermoplastic resin formulated with powder comprising $SiO_2$ is used, and the dropwise addition method is used as the encapsulation method.

Further, on the surface of the electrical connecting member 125 opposite to that where the semiconductor element 101 is connected, an insulating sheet 301 is plastered.

Figure 30E:
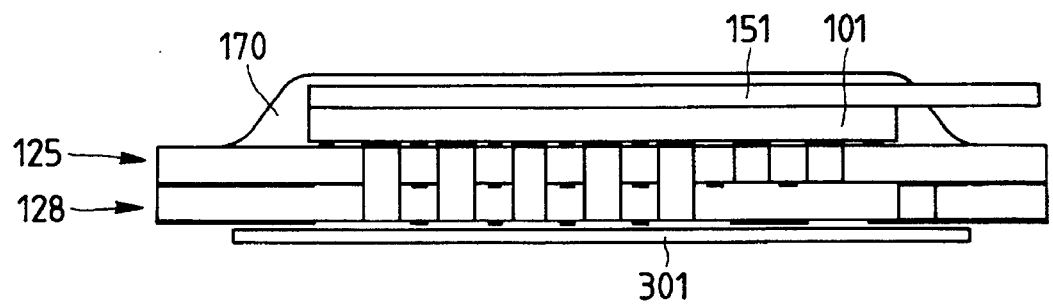
Figure 30F:
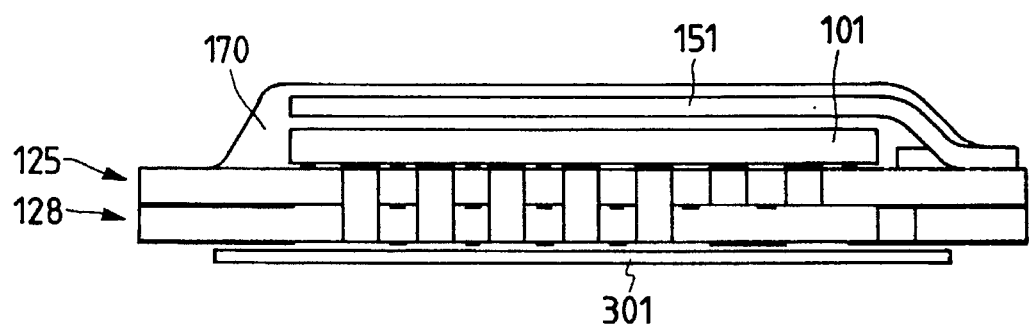
Figure 30G:
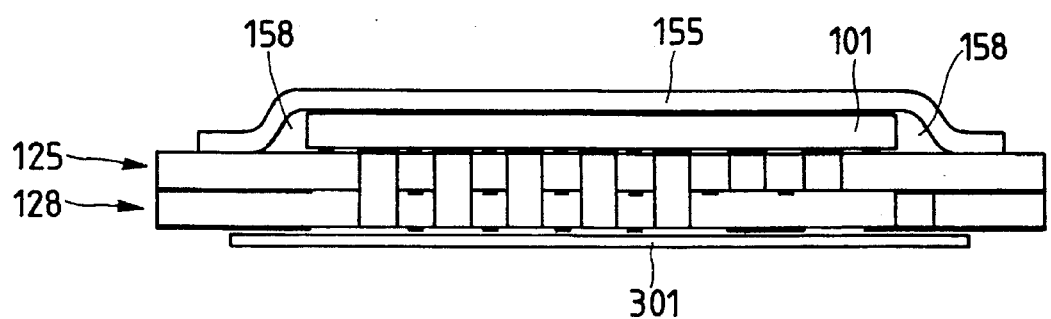

FIG. 30D to FIG. 30G show another encapsulation method. FIG. 30D illustrates a drawing wherein a plate 151 is bonded onto the encapsulating material 170, FIG. 30E shows an example wherein the plate 151 is bonded onto the semiconductor element 101 on the opposite side to the electrical connecting member before encapsulation with the encapsulating material 170, FIG. 30F an example in which the plate 151 is arranged in the vicinity of the semiconductor element 101 and encapsulation is effected with the encapsulating material 170, and FIG. 30G an example of cap encapsulation with a cap 155, having a hollow portion 158.

When connectability is examined for the electrical circuit device prepared as described above, it is found to be connected with high reliability. Further, reliability of various characteristics is also excellent.

(EXAMPLE 21)

Figure 31A:
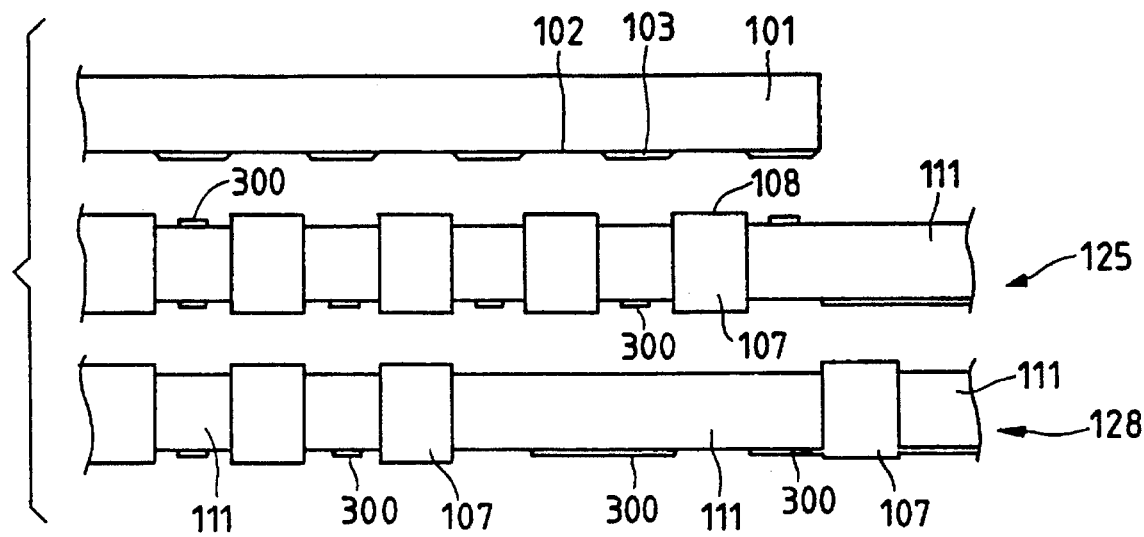
FIGS. 31A and 31B show Example 21, FIG. 31A being a sectional view showing the state before connection, FIG. 31B a sectional view showing the state after connection.
Figure 31B:
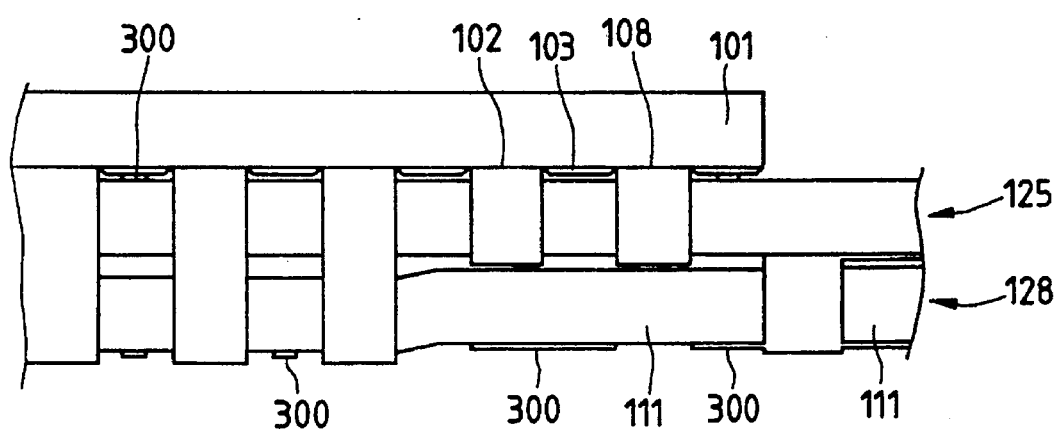

FIG. 31 shows Example 21.

This example is an example in which a semiconductor element 101 covered with an insulating film 103 at the portions other than the connecting portion 102 is used as the electrical circuit part.

As the electrical connecting member 125, one shown in FIG. 18 having a wiring pattern formed on the surface is used.

Such electrical connecting member 125 can be prepared according to the same method as described in the first example shown in FIG. 9.

In the present example, the amount of the metal wire 121 is made 10 μm, but any amount may be used.

As the method for having the metal wire 121 protruded, etching is not limitative, but any other chemical method or mechanical method may be employed.

Then, wiring patterns are provided on both surfaces of the holding member 111 to prepare an electrical connecting member 125.

Further, the electrical connecting member 128 is also prepared according to the same preparation process. Different points are arrangement, number of the metal wires 121 and the wiring pattern 300. The wiring pattern 300 is provided on one surface of the holding member 111. 10 The protruded portion may be also modified by having the electrical connecting member 125 sandwiched between a mold having a concavity at the position of the metal wire 121 and collapsing the projection 126 of the metal wire 121, thereby forming a bump 150. In this case, the metal wire 121 will be dropped off from the insulator 111 with difficulty.

Also, in this example, the metal wire 121 constitutes the metal member 107 and, further, the resin 123 constitutes the insulator 111.

For preparation of the bump, projection may be melted to form a bump, or any other method may be employed.

Also in this example, the connecting portion is found to be connected with high reliability.

Further, reliability of various characteristics is also excellent.

(EXAMPLE 22)

Figure 32:
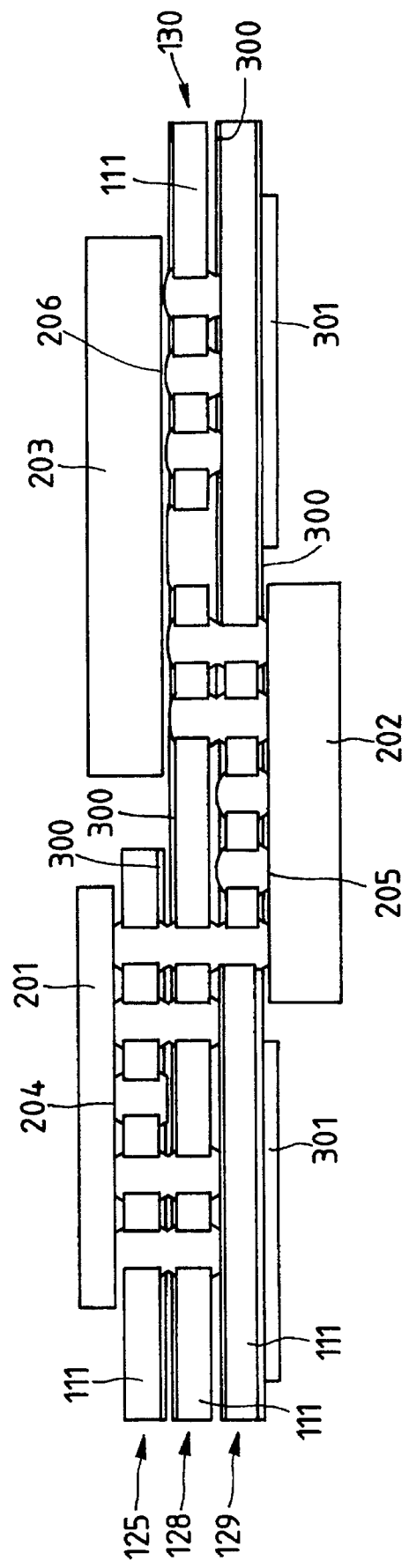
FIG. 32 is a sectional view showing Example 22.

FIG. 32 shows Example 22.

Example 22 comprises three semiconductors connected by use of 4 sheets of electrical connecting members.

The electrical connecting members 125, 128, 129, 130 have the metal wire 121 protruded from the holding member shown in Example 22. The points different from Example 22 are arrangement and number of the metal wires 121, the wiring pattern and further formulation of power comprising $SiO_2$ in the holding member.

Also, the electrical connecting members 125, 128, 129, 130 are different from the above example. That is, they are different in arrangement, number of the metal wires and the wiring patten 300. The wiring pattern 300 is possessed on one surface of the holding member 111 except for the electrical connecting member 129. The electrical connecting member 129 has wiring patterns 300 on both surfaces thereof. The wiring pattern has an insulating film except for the connecting portion so that no conduction may occur when laminated.

In this example, the semiconductor elements 201, 202, 203 are connected to the electrical connecting member 125. The connecting portions 204, 205 of the semiconductor elements 201, 202 are connected to the connecting portions of the electrical connecting member 125 through metallization and/or alloy formation according to the thermal pressure adhesion method, and the connecting portion 205 of the semiconductor element 202 is connected to the connecting portion of the electrical connecting member 125 under pressurization.

The semiconductor element 203 is connected overlappingly to the two electrical connecting portions 128, 130.

Further, on the surface of a part of the electrical connecting member 129 on the side of the semiconductor element 202, an insulating sheet 301 is adhered with an adhesive for effecting electrical insulation.

Other points are the same as in Example 21.

Also in this example, the connecting portions are found to be connected with high reliability.

Further, reliability of various characteristics is excellent.

(EXAMPLE 23)

FIG. 27 shows the electrical connecting member 125 used in Example 23.

FIG. 27A is a sectional view in the course of preparation of the electrical connecting member, FIG. 27B a perspective view of the above electrical connecting member and FIG. 27C a sectional view of the above.

Previously, a holding member 127 comprising alumina ceramic is bored with a hole 142 having a diameter greater than 20 μmϕ. Then, a metal wire 121 comprising a metal such as Au, etc. or an alloy of 20 μmϕ is passed through the hole 142, and a resin 123 is placed in between the holding member 126 and the metal wire 121, followed by curing of the resin 123. The cured resin 123 becomes the intervening matter. Thereafter, the metal wire 121 is sliced at the position of the dotted line 124 to prepare an electrical connecting member 125. The electrical connecting member 125 thus prepared is shown in FIG. 27B, 27C.

Further, the drawing having the wiring patterns 300 provided on both surfaces of the holding member is shown in FIG. 27D. The connecting portions of another electrical connecting member prepared similarly are connected to provide an electrical connecting member.

Further, the drawing having the wiring patterns 300 provided on both surfaces of the holding member are shown in FIG. 27D. The connecting portions of another electrical connecting member prepared similarly are connected to provide an electrical connecting member.

Also, the electrical connecting member of this example may be worked to provide a projection or a bump.

Also in this example, the connecting portions are found to be connected with high reliability.

Further, reliability of various characteristics is excellent.

(EXAMPLE 24)

Figure 33A:
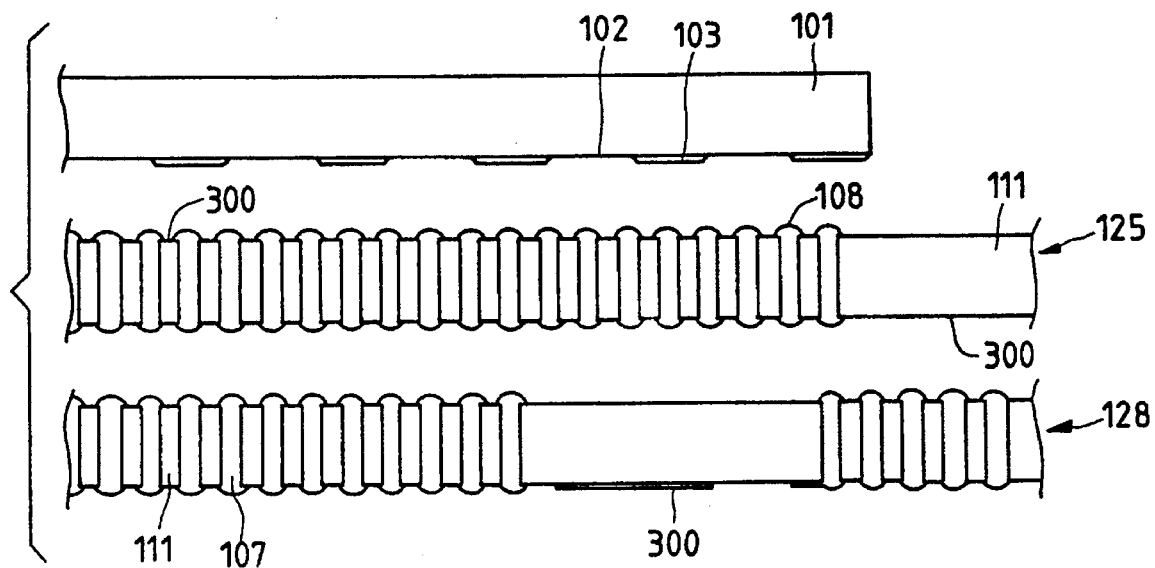
FIGS. 33A and 33B also show Example 23, FIG. 33A being a sectional view showing the state before connection, FIG. 33B a sectional view showing the state after connection.
Figure 33B:
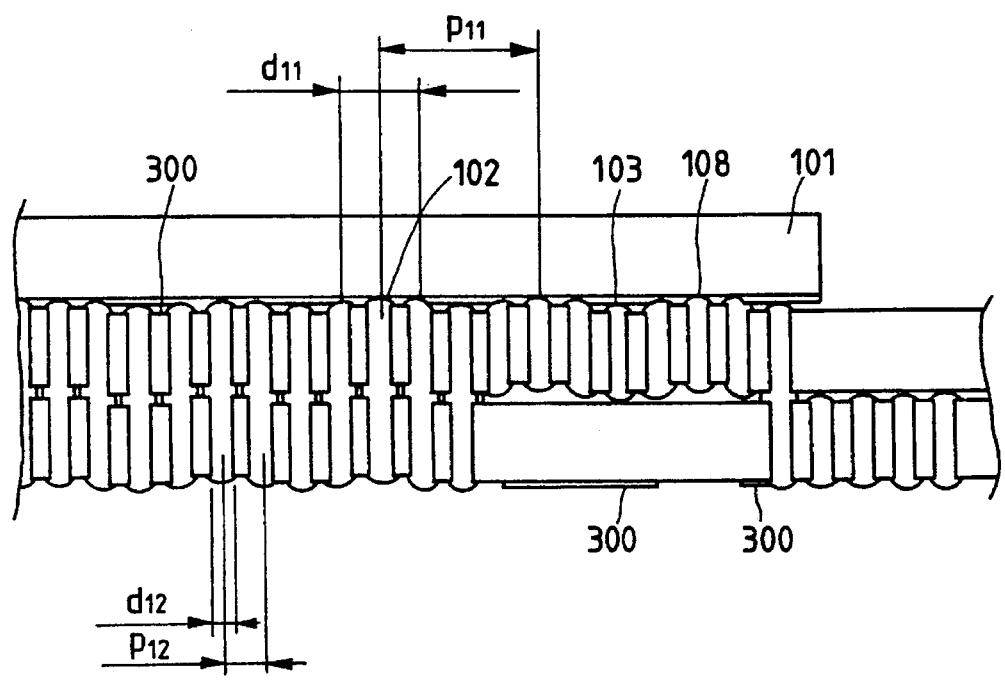

FIG. 33 shows Example 24.

In this example, the electrical connecting member 125 is different from that shown in Example 21. More specifically, in the electrical connecting member 125 of this example, the pitch mutually between metal members is narrower than that shown in Example 21. That is, in this example, the pitch is set at narrower intervals mutually between the metal members 107 than the intervals between the connecting portions of the semiconductor element 101.

In short, in Example 21, since the connecting position of the semiconductor element 101 and the electrical connecting member 125 is arranged, correct registration of the electrical connecting member 125 is required, but in this example, registration between the semiconductor element 101 and the electrical connecting member 125 need not be correct. For this reason, by selecting adequate values for the connecting dimensions of the semiconductor element 101 ($d_{11}$, $P_{11}$) and for the connecting dimensions of the electrical connecting member ($d_{12}$, $P_{12}$), connection may be also possible with substantially correct registration.

Other points are the same as in Example 21.

Also in this example, the connecting portions are found to be connected with high reliability.

Further, reliability of various characteristics is excellent.

As the result of constitution of the electrical circuit member as shown above in Examples 20 to 24, a number of effects shown below can be obtained.

According to the present invention, the electrical connecting member to be used for the electrical circuit member as described below can be prepared.

(1) Concerning connection of semiconductor element with electrical circuit part such as circuit substrate, lead frame, etc., connection with high reliability can be obtained. Accordingly, it becomes possible to use it in place of the wire bonding system, the TAB system, the CCB system used in the prior art.

(2) According to the present invention, when one or more electrical circuit part is connected by use of the electrical connecting member as described above, it becomes possible to arrange the connecting portions of the electrical circuit part not only at the outer peripheral portion but alto internally, whereby the number of the connecting portions can be increased and more multi-point connections become possible than the wire bonding system, the TAB system, as suited for connection of multiple pins. Further, due to the presence of an insulating substance provided previously between adjacent metals of the electrical connecting member, no electrical conduction between the adjacent metals will occur even if the adjacent pitch may be made narrower, whereby more multi-point connection than the CCB system is rendered possible.

(3) Also, the electrical connecting member can be made thinner, and also the electrical circuit member can be made thinner in this aspect.

(4) Further, since the amount of the metal member used in the electrical connecting member is minute as compared with the prior art, the cost will be lower even if an expensive metal such as gold may be used for the metal member.

(5) Since the electrical connecting member has a constitution comprising a plurality of electrical connecting members laminated on one another, a circuit substrate of high density and multiple layers can be prepared, and yet at low cost.

(6) Also, various effects can be obtained by constituting the holding members of a plurality of electrical connecting members with different kinds of materials. For example, various functional substrates can be obtained such that by inserting a material with high specific dielectric constant, a condenser can be obtained, while by inserting a material having a ferromagnetic material dispersed therein, a coil with good characteristics can be obtained, etc.

Moreover, since the electrical circuit part, above all a semiconductor element can be connected directly and yet easily to the electrical connective member, the number of steps can be reduced to give an inexpensive semiconductor device.

(1) When the electrical circuit part is connected to the electrical connecting member through metallization and/or alloy formation, the electrical circuit part can be firmly (with strong strength) and surely connected, whereby there can be obtained an electrical circuit member with a connection resistance of smaller value with its variance also being smaller, and further with strong mechanical strength and very low defective ratio.

(2) If the electrical circuit part is connected to the electrical connecting member through metallization and/or alloy formation, during and after preparation of the electrical circuit member, it is not required to hold the electrical circuit member by use of an implement, etc., whereby management during and after preparation of the electrical circuit member is easier.

(1) According to the present invention, an electrical connecting member which can be readily prepared can be obtained to prepare an electrical connecting member to be used for the electrical circuit member of claim 5 as described below at low cost.

(2) The electrical connecting member having the wiring pattern of the electrical connecting member can be prepared with ease because of having wiring pattern on one or both of the holding member, and therefore an inexpensive electrical connective member can be obtained, which leads to an inexpensive electrical circuit member.

In the present invention, when encapsulated by use of an encapsulating material, the electrical connecting member is constituted of metal members embedded in the holding member, and therefore will be little affected by the encapsulation pressure, encapsulation rate, etc. when an encapsulation material is injected, and any encapsulation method may be available. In short, it has become possible to practice encapsulation according to the method by use of a thermoplastic resin unpracticeable in the prior art in which injection under very high pressure has been required.

In the present invention, when a plate is bonded to at least a part of at least one surface of the encapsulating material, if at least a part of of one or both of the plate or the electrical circuit part bonded to the surface opposite to the electrical connecting member of the celectical circuit part connected to the electrical connecting member is embedded, or at least a part of the plate arranged in the vicinity of one or a plurality of side surfaces is embedded with an encapsulating material, the stress concentration can be relaxed even when internal stress may be generated within the device or external force may be applied thereon, whereby cracks, etc. which may occur from stress concentration can be prevented. Also, the plate has the action of elongating the route from the external world to the electrical circuit part, whereby water, etc. from the outside will penetrate into the electrical circuit part with difficulty. Therefore, reliability of the device can be enhanced.

When the material of the plate is a metal such as stainless steel, etc., a material of good thermal conductivity such as ceramic, carbon, diamond, etc, the heat generated from the electrical circuit part can be dissipated rapidly to the external world, whereby an electrical circuit member with excellent heat dissipation characteristic can be obtained. Further, when the material of the plate is a metal, the noise from the external world can be shielded and therefore the influence from noise will be received with difficulty. Also, the electromagnetic noise generated from the electrical circuit part can be shielded, whereby an electrical circuit member with good characteristics can be obtained.

When cap encapsulation is effected in the present invention, the electrical circuit member is hollow and therefore generation of heat stress will be little even when heat may be applied, whereby an electrical circuit with high reliability can be obtained. Also, when the cap is contacted with the electrical circuit part and a material with good conductivity is used for the cap, the heat generated from the electrical circuit part is conducted to outside rapidly through the cap, and therefore an electrical circuit member with more excellent heat dissipating characteristic can be obtained. Further, when the cap consists of a material of good noise shielding characteristic, particularly a metal such as iron type, etc., an electrical circuit member with more excellent shielding effect can be obtained. When, a member for control is interposed between the cap and the electrical circuit member, it becomes possible to assemble the parts with good efficiency even when there occurs variance in height of the electrical circuit parts.

In the present invention, when a material with thermal conductivity is used for the insulator of the electrical connecting member, when powder, fiber, plate, rod, sphere, etc. with good thermal conductivity is dispersed in the encapsulating material, heat generated from the electrical circuit part can escape more rapidly to the external world, whereby there can be obtained an electrical circuit member with good heat dissipatability. Also, when a material having a thermal expansion coefficient approximate to that of the electrical circuit part is used for the insulator of the electroconductive member, when one or both of powder, fiber, plate, rod, sphere, etc. is dispersed in the encapsulating material, the thermal expansion coefficient becomes approximate to the thermal expansion coefficient of the electrical circuit part, whereby the phenomenon of damaging reliability of electrical circuit member such as cracks of encapsulating material, electrical circuit part, or characteristic changes of the electrical circuit part which may occur when heat is applied can be avoided to give an electrical circuit member with high reliability.

If all of the electrical circuit parts are connected to the connecting layer formed by metallization and/or alloy formation through the electrical connecting member, contact resistance mutually between the electrical circuit parts becomes smaller as compared with the case when only one electrical circuit part is connected.

On the other hand, if at least one electrical circuit part is connected by way of other connections than connection by metallization and/or alloy formation, deterioration of the electrical circuit part which occurs during metallization and/or alloy formation can be prevented. Also, in some cases, the electrical circuit part is desired to be freely detachable depending on the use, and in such cases, the demand can be corresponded to if connection of the electrical circuit part is effected by way of connection other than metallization and/or alloy formation.

Further, by selecting a material with great shielding effect for the insulator, the electromagnetic generated from the electrical circuit part to the external world can be reduced, and also the noise entering from the external world into the electrical circuit part can be also reduced.

What we claim is:

1. An electrical circuit member comprising:

an electrical connecting member, said electrical connecting member having a holding member comprising an electrically insulating material, a plurality of electroconductive members embedded at predetermined intervals within said holding member, each of said plurality of electroconductive members being insulated with said electrically insulating material, a first end of each said electroconductive member being exposed on a first surface of said holding member and a second end of each electroconductive member being exposed on a second surface of each electroconductive member;

an electrical circuit substrate, said electrical circuit substrate having connecting portions to be electrically connected to said first ends exposed on said first surface of said holding member, and said electrical circuit substrate being mechanically connected to said first surface of said holding member; and means for vibrating said second ends of said electroconductive members, wherein said electrical connecting member directly contacts the electrical circuit substrate and the electrical circuit substrate directly contacts the vibrating means.

2. An electrical circuit member according to claim 1, wherein said electrical connecting member and said electrical circuit substrate are arranged to form a probe card.

3. An electrical circuit member according to claim 1, wherein the first end of said electroconductive member and the connecting portion of said electrical circuit substrate are connected through metallization and/or alloy formation.

4. An electrical circuit member according to claim 1, wherein said electrical circuit substrate is a semiconductor element, a circuit element or a lead frame.

5. An electrical circuit member according to claim 1, wherein the first end and/or the second end of said electroconductive member constituting said electrical connecting member connected to the connecting portion of said electrical circuit substrate are protruded from the first and/or second surface of said holding member.

6. A probe card comprising:

an electrical connecting member, said electrical connecting member having a holding member comprising an electrically insulating material, a plurality of electroconductive members embedded at predetermined intervals within said holding member, each of said plurality of electroconductive members being insulated with said electrically insulating material, a first end of each electroconductive member being exposed on a first surface of said holding member and a second end of each electroconductive member protruded on a second surface of said holding member;

an electrical circuit substrate, said electrical circuit substrate having connecting portions to be electrically connected to the first ends of said electroconductive members and said electrical circuit substrate being mechanically connected to said first surface of said holding member; and means for vibrating said second ends of said electroconductive members, wherein said electrical connecting member directly contacts the electrical circuit substrate and the electrical circuit substrate directly contacts the vibrating means.

7. A probe card according to claim 6, wherein the first end of said electroconductive member and the connecting portions of said electrical circuit substrate are connected through metallization and/or alloy formation.

8. A probe card according to claim 6, wherein said electrical circuit substrate is a semiconductor element, a circuit element or a lead frame.

9. A measuring method for measuring electrical characteristics of a semiconductor element, comprising the steps of:

providing an electrical circuit member comprising:

an electrical connecting member, said electrical connecting member having a holding member comprising an electrically insulating material, a plurality of electroconductive members embedded at predetermined intervals within said holding member, each of said plurality of electroconductive members being insulated with said electrically insulating material, a first end of each electroconductive member being exposed on a first surface of said holding member and a second end of each electroconductive member being exposed on a second surface of said holding member; and an electrical circuit substrate, said electrical circuit substrate having connecting portions to be electrically connected to said first ends exposed on said first surface of said holding member, and said electrical circuit substrate being mechanically connected to said first surface of said holding member;

electrically connecting said semiconductor element to said second ends exposed on said second surface of said holding member; and vibrating said electroconductive members.

10. A measuring method for measuring electrical characteristics of a semiconductor element, comprising the steps of:

providing a probe card comprising: an electrical connecting member, said electrical connecting member having a holding member comprising an electrically insulating material, a plurality of electroconductive members embedded at predetermined intervals within said holding member, each of said plurality of electroconductive members being insulated with said electrically insulating material, a first end of each electroconductive member being exposed on a first surface of said holding member and a second end of each electroconductive member protruded on a second surface of said holding member; and an electrical circuit substrate, said electrical circuit substrate having connecting portions to be electrically connected to the first ends of said electroconductive members and said electrical circuit substrate being mechanically connected to said first surface of said holding member;

electrically connecting said semiconductor element to the second ends of said electroconductive members; and vibrating said electroconductive members.

* * * * *

UNITED STATES PATENT AND TRADEMARK OFFICE
CERTIFICATE OF CORRECTION

PATENT NO. : 5,606,263
DATED : February 25, 1997
INVENTOR(S) : TETSUO YOSHIZAWA, ET AL.

It is certified that error appears in the above-indentified patent and that said Letters Patent is hereby corrected as shown below:

COLUMN 2

Line 59, "needled 803" should read --needles 803--.

COLUMN 3

Line 12, "contact" should read --contacts--.

COLUMN 7

Line 42, "membre" should read --member--.

COLUMN 8

Line 2, "view and" should read --view,--.
Line 3, "view" should read --view,--.
Line 7, "FIG. 10A" should read --FIGS. 10A--.

COLUMN 9

Line 62, "one" (first occurrence) should be deleted.

COLUMN 10

Line 66, "material" should read --a material--.

UNITED STATES PATENT AND TRADEMARK OFFICE
CERTIFICATE OF CORRECTION

PATENT NO. : 5,606,263
DATED : February 25, 1997
INVENTOR(S) : TETSUO YOSHIZAWA, ET AL.

It is certified that error appears in the above-indentified patent and that said Letters Patent is hereby corrected as shown below:

COLUMN 11

Line 17, "any metal" should read --other metals--.
Line 18, "or alloy other than alloy" should read --or alloys--.
Line 23, "selectrical" should read --electrical--.
Line 39, "82m$\phi$" should read --$\mu$m$\phi$--.
Line 44, "in bump." should read --as a bump.--.
Line 45, "in bump" should read --as a bump--.

COLUMN 12

Line 1, "employed." should read --is employed.--

COLUMN 13

Line 1, "be escaped" should read --escape--.
Line 4, "approxiate" should read --appropriate--.
Line 9, "characteristics change" should read --change of characteristics--.

COLUMN 14

Line 48, "with strong strength" should read --with great strength--.

COLUMN 15

Line 44, "the" should be deleted.

COLUMN 16

Line 49, "gists" should read --examples--.

UNITED STATES PATENT AND TRADEMARK OFFICE
CERTIFICATE OF CORRECTION

PATENT NO. : 5,606,263
DATED : February 25, 1997
INVENTOR(S) : TETSUO YOSHIZAWA, ET AL.

It is certified that error appears in the above-indentified patent and that said Letters Patent is hereby corrected as shown below:

COLUMN 17

Line 67, "be escaped" should read --escape--.

COLUMN 20

Line 65, "htus an" should read --such-.

COLUMN 22

Line 19, "metallizatio" should read --metalization--.
    Line 39, "form" should read --from--.

COLUMN 24

Line 19, "to escape rapidly" should read --for--.
    Line 21, "ment." should read --ment to escape rapidly.--.
    Line 35, "badness" should read --problems--.
    Line 55, "badness" should read --problems--.

COLUMN 27

Line 1, "a" should be deleted.

COLUMN 28

Line 20, "badness" should read --problems--.

COLUMN 31

Line 60, "badness" should read --problems--.

UNITED STATES PATENT AND TRADEMARK OFFICE
CERTIFICATE OF CORRECTION

PATENT NO. : 5,606,263
DATED : February 25, 1997
INVENTOR(S) : TETSUO YOSHIZAWA, ET AL.

It is certified that error appears in the above-indentified patent and that said Letters Patent is hereby corrected as shown below:

COLUMN 34

Line 17, "Shown" should read --shown--.

COLUMN 36

Line 55, "metallization" should read --metalization-.
    Line 57, "badness" should read --problems--.

COLUMN 41

Line 8, "with strong strength" should read --with great strength--.
    Line 13, "is-connected" should read --is connected--.
    Line 34, "celectical" should read --electrical--.

COLUMN 42

Line 32, "metallization" should read --metalization--.
    Line 39, "metallization" should read --metalization--.
    Line 40, "metallization" should read --metalization--.
    Line 60, "metallization" should read --metalization--.
    Line 56, "FIG. 9.10" should read --FIG. 9.-- and "The electrical" should read --¶ The electrical--.

UNITED STATES PATENT AND TRADEMARK OFFICE
CERTIFICATE OF CORRECTION

PATENT NO. : 5,606,263
DATED : February 25, 1997
INVENTOR(S) : TETSUO YOSHIZAWA, ET AL.

It is certified that error appears in the above-indentified patent and that said Letters Patent is hereby corrected as shown below:

COLUMN 43

Line 7, "metalli-" should read --metali- --.
    Line 10, "metallization" should read --metalization--.
    Line 18, "sied." should read --side.--.
    Line 34, "metallization" should read --metalization--.

COLUMN 44

Line 55, "patten 300." should read --pattern 300.--.

COLUMN 48

Line 52, "metallization" should read --metalization--.
    Line 54, "electromagnetic generated from" should read --electromagnetic fields from--.

Signed and Sealed this

Seventh Day of April, 1998

*Attest:*

BRUCE LEHMAN

*Attesting Officer*     Commissioner of Patents and Trademarks